United States Patent
Lee et al.

(10) Patent No.: US 9,281,362 B2
(45) Date of Patent: Mar. 8, 2016

(54) SEMICONDUCTOR DEVICE AND METHOD OF MANUFACTURING THE SAME

(71) Applicants: Ja-Young Lee, Hwaseong-si (KR); Se-myeong Jang, Anyang-si (KR)

(72) Inventors: Ja-Young Lee, Hwaseong-si (KR); Se-myeong Jang, Anyang-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 14/286,441

(22) Filed: May 23, 2014

(65) Prior Publication Data

US 2015/0091127 A1   Apr. 2, 2015

(30) Foreign Application Priority Data

Sep. 27, 2013   (KR) .................. 10-2013-0115700

(51) Int. Cl.
- *H01L 29/06*   (2006.01)
- *H01L 21/762*   (2006.01)
- *H01L 27/108*   (2006.01)
- *H01L 27/115*   (2006.01)

(52) U.S. Cl.
CPC ...... *H01L 29/0649* (2013.01); *H01L 21/76229* (2013.01); *H01L 27/10894* (2013.01); *H01L 27/10897* (2013.01); *H01L 27/11531* (2013.01)

(58) Field of Classification Search
CPC .................. H01L 27/11512; H01L 27/11548; H01L 27/11575; H01L 27/11595; H01L 29/0649; H01L 27/10894; H01L 27/10897; H01L 21/76229; H01L 27/11531

See application file for complete search history.

(56) References Cited

U.S. PATENT DOCUMENTS

| | | | |
|---|---|---|---|
| 7,977,204 B2 | 7/2011 | Kim et al. | |
| 8,142,986 B2 | 3/2012 | Sim et al. | |
| 8,158,476 B2 | 4/2012 | Tran et al. | |
| 8,247,302 B2 | 8/2012 | Sills et al. | |
| 8,263,487 B2 | 9/2012 | Yoon et al. | |
| 8,310,055 B2 | 11/2012 | Park et al. | |
| 8,389,383 B1 | 3/2013 | Hopkins | |
| 2006/0220171 A1* | 10/2006 | Choi et al. | 257/500 |
| 2006/0270181 A1* | 11/2006 | Sandhu et al. | 438/424 |
| 2006/0286754 A1 | 12/2006 | Hosomi | |
| 2010/0178773 A1 | 7/2010 | Oh et al. | |
| 2012/0171867 A1 | 7/2012 | Kim | |

* cited by examiner

*Primary Examiner* — Yu Chen
*Assistant Examiner* — Nilufa Rahim
(74) *Attorney, Agent, or Firm* — Harness, Dickey & Pierce, P.L.C.

(57) ABSTRACT

According to an example embodiment, a semiconductor device includes a substrate having a cell array region and a peripheral circuit region. The substrate includes first active regions defined by a first trench isolation region in the cell array region, a second active region defined by a second trench isolation region in the peripheral circuit region, and at least one deep trench isolation region. The first active regions may be aligned to extend longitudinally in a first direction in the cell array region. The at least one deep trench isolation region is recessed in the substrate to a level lower than those of other points of a bottom surface of the second trench isolation region in the peripheral circuit region. The at least one deep trench isolation region includes at least one point that is spaced apart in the first direction from a corresponding one of the first active regions.

20 Claims, 46 Drawing Sheets

SEMICONDUCTOR DEVICE AND METHOD OF MANUFACTURING THE SAME

CROSS-REFERENCE TO RELATED APPLICATIONS

This application claims priority under 35 U.S.C. §119 to Korean Patent Application No. 10-2013-0115700, filed on Sep. 27, 2013, in the Korean Intellectual Property Office, the disclosure of which is incorporated herein in its entirety by reference.

BACKGROUND

1. Field

The present disclosure relates to a semiconductor device and/or a method of manufacturing the same, and more particularly, to a semiconductor device including a device isolation region in a cell array region, and a core region or a peripheral circuit region (hereinafter, referred to as a "peripheral circuit region") that is located around the cell region, and/or a method of manufacturing the semiconductor device.

2. Description of Related Art

As the semiconductor industry has developed and demands of users have increased, electronic devices have been manufactured to have a higher degree of integration and better performance. As a result, semiconductor devices in electronic devices have also been manufactured to have a higher degree of integration and better performance. As semiconductor devices have been highly integrated, feature sizes of the semiconductor devices have been reduced, and sizes of device isolation regions that define active regions have been reduced. In order to define active regions having more uniform shapes and sizes, it is desirable to form device isolation regions by using a process capable of providing high critical dimension (CD) uniformity.

SUMMARY

Some example embodiments of inventive concepts relate to semiconductor devices that may form a plurality of active regions with high critical dimension (CD) uniformity in regions where the plurality of active regions are formed at a high density.

Other example embodiments of inventive concepts relate methods of manufacturing semiconductor devices that may define a plurality of active regions to have high CD uniformity in regions where the plurality of active regions are formed at a high density.

According to an example embodiment of inventive concepts, a semiconductor device includes a substrate having a cell array region and a peripheral circuit region. The substrate includes a plurality of first active regions defined by a first trench isolation region in the substrate in the cell array region. The plurality of first active regions are each aligned to extend longitudinally in a first direction in the cell array region. The substrate includes a second active region defined by a second trench isolation region in the substrate in the peripheral circuit region. The substrate includes at least one deep trench isolation region defined by a portion of in the second trench isolation region that is recessed in the substrate in the peripheral circuit region to a level lower than a level of other points of a bottom surface of the second trench isolation region in the substrate in the peripheral circuit region. The at least one deep trench isolation region includes at least one point in the substrate in the peripheral circuit region that is spaced apart in the first direction from a corresponding one of the plurality of first active regions.

In an example embodiment, at least a part of the at least one deep trench isolation region may be disposed in a part of the second trench isolation region between the cell array region and the second active region.

In an example embodiment, the at least one deep trench isolation region may be a plurality of deep trench isolation regions defined by portions of the second trench isolation region that are recessed in the substrate in the peripheral circuit region to have respective levels lower than the level of other points of the second trench isolation region, and the plurality of deep trench isolation regions may be spaced apart from each other along the bottom surface of the second trench isolation region.

In an example embodiment, each of the plurality of first active regions may have a long axis extending longitudinally in the first direction and a short axis that is perpendicular to the long axis, and the at least one deep trench isolation region may be spaced apart in the first direction and aligned with the long axis corresponding to at least one of the plurality of first active regions.

In an example embodiment, the substrate may include a plurality of island patterns defined by the bottom surface of the second trench isolation region in the substrate in the peripheral circuit region. The at least one deep trench isolation region may have a shape that surrounds the plurality of island patterns. The plurality of island patterns may be spaced apart from one another along the bottom surface of the second trench isolation region.

In an example embodiment, the at least one deep trench isolation region may include a linear deep trench isolation region defined by a part of the second trench isolation region that is recessed in the substrate in the peripheral circuit region to a depth lower than the level of the other points of the bottom surface of the second trench isolation region in the substrate in the peripheral circuit region. The linear deep trench isolation region may surround the cell array region. The linear deep trench isolation region may include concave-convex portions that extend toward the cell array region. In an example embodiment, the plurality of first active regions may be repeatedly disposed at first pitches in the first direction in the cell array region, and the at least one deep trench isolation region may include two deep trench isolation regions that are spaced apart from each other by the first pitch in the first direction.

In an example embodiment, the substrate may include a third active region defined by a third trench isolation region in the substrate in the peripheral circuit region. The substrate may include an edge deep trench isolation region at an edge of a bottom surface of the third trench isolation region. The edge deep trench isolation region may be recessed to a level lower than a level of other points of the bottom surface of the third trench isolation region. The edge deep trench isolation region may be disposed at the edge of the bottom surface of the third trench isolation region that is the closest to the cell array region.

According to another example embodiment of inventive concepts, a semiconductor device includes a substrate, a first device isolation film, and a second device isolation film. The substrate has a first region and a second region. The first and second regions have different active region densities. The substrate includes a plurality of first active regions disposed at first pitches in the substrate in the first region. The plurality of first active regions include a top surface having a long axis extending in a first direction and a short axis that is perpendicular to the long axis. The substrate includes a second active region disposed in the substrate in the second region. The first device isolation film defines the plurality of first active regions in the substrate in the first region. The second device isolation film defines the second active region in the substrate in the second region. The second device isolation film includes at least one protrusion that protrudes away toward a bottom surface of the substrate in a thickness direction of the substrate at a point that is spaced apart in the first direction from a corresponding one of the plurality of first active regions.

In an example embodiment, the at least one protrusion may be disposed on a portion of a bottom surface of the second device isolation film between the second active region and the first region of the substrate.

In an example embodiment, the second device isolation film may include a cell adjacent region that is disposed around the first region and surrounds the first region, and the at least one protrusion may include a plurality of protrusions that are spaced apart from one another in the cell adjacent region of the second device isolation film.

In an example embodiment, the at least one protrusion may include a protrusion having a linear shape that is disposed around the first region and surrounds the first region.

In an example embodiment, the semiconductor device may further include a third device isolation film defining a third active region in the substrate in the second region. A bottom surface of a portion of the third device isolation film that is closest to the first region in the substrate may define an edge protrusion that protrudes toward a bottom surface of the substrate in the thickness direction of the substrate to a level below a level of other portions of a bottom surface of the third device isolation film.

According to another example embodiment of inventive concepts, a method of manufacturing a semiconductor device includes forming a mask line on a substrate, forming a first trimming pattern on the mask line, performing a first trimming process, forming a second trimming pattern, and performing a second trimming process. The mask line extends over a first region and over a second region on the substrate. The first and second regions have different active region densities. The first trimming pattern defines a plurality of openings that are spaced apart from one another on the mask line in a first range including the first region and the second region. The performing a first trimming process includes partially removing the mask line using the first trimming pattern as an etching mask. The first trimming process includes forming a plurality of mask patterns that extend over the first region and over the second region. The forming the second trimming pattern includes forming the second trimming pattern on the plurality of mask patterns in the first region. The performing the second trimming process includes removing portions of the plurality of mask patterns that are exposed around the second trimming pattern.

In an example embodiment, the mask line may be formed to have a ring shape.

In an example embodiment, the forming the first trimming pattern may include forming the first trimming pattern defining the plurality of openings, and forming the first trimming pattern so the first trimming pattern may define a hole having a linear shape that surrounds at least a part of the first region.

In an example embodiment, the second trimming pattern may have a linear outline. The second trimming pattern may have a concave-convex outline.

In an example embodiment, the method may further include: forming a wide width mask layer on the substrate in the second region while forming the mask line, forming a peripheral mask pattern on the substrate while forming the second trimming pattern, forming a wide width mask pattern by etching the wide width mask layer using the peripheral mask pattern as an etching mask while performing the second trimming process, and forming a plurality of trench isolation regions in the substrate after the second trimming process by etching portions of the substrate not covered by remaining portions of the plurality of mask patterns and the wide width mask pattern in the second region. The peripheral mask pattern may define an active region of the second region on the wide width mask layer in the second region. The plurality of trench isolation regions may include a first trench isolation region in the substrate in the first region and a second trench isolation region in the substrate in the second region.

In an example embodiment, the forming the plurality of trench isolation regions may include forming the second trench isolation region in the first range in the substrate in the second region, the forming the plurality of trench isolation regions may include forming a deep trench isolation region in the substrate in the second region, and the deep trench isolation region may be recessed to a level lower than those of other points of a bottom surface of the second trench isolation region in the bottom surface of the second trench isolation region at a position vertically corresponding to a position of each of the plurality of openings that are formed in the first trimming pattern.

In an example embodiment, the forming the plurality of trench isolation regions may include forming the second trench isolation region at a position adjacent to and outside the first range in the second region, and the forming the plurality of trench isolation regions may include forming an edge deep trench isolation region that is recessed to have a level lower than those of other points of a bottom surface of the second trench isolation region at a portion of a bottom surface of the second trench isolation region that is the closest to the first range.

According to another example embodiment of inventive concepts, a method of manufacturing a semiconductor device includes: forming a hard mask layer on a substrate having a cell array region and a peripheral circuit region; forming a mask line extending in a first direction on the hard mask layer in the cell array region and the peripheral circuit region; dividing the mask line into a plurality of mask patterns that are aligned in the first direction by locally removing the mask line at a plurality of points of the mask line selected at desired (and/or alternatively predetermined) intervals in the first direction in the cell array region and the peripheral circuit region; forming a hard mask pattern such that portions that vertically correspond to the plurality of points and portions that are covered by a plurality of mask patterns have different thicknesses by simultaneously etching the plurality of mask patterns and the hard mask layer around the plurality of mask patterns in the peripheral circuit region; and forming a trench isolation region having a bottom surface in which a deep trench isolation region having a level lower than those of other portions is formed at a position of the substrate vertically corresponding to each of the plurality of points by etching the hard mask pattern and the substrate in a portion of the peripheral circuit region including the plurality of points.

According to an example embodiment of inventive concepts, a method of manufacturing a semiconductor device includes forming a hard mask layer on a substrate, forming a mask line on the hard mask layer, forming a first trimming pattern on the substrate over the mask line, forming a plurality of mask patterns and a hard mask pattern, removing the first trimming pattern, forming a second trimming pattern and a peripheral mask pattern on the plurality of mask patterns and the hard mask pattern, removing the portion of the plurality of mask patterns exposed by the peripheral mask pattern without removing the portion of the hard mask pattern exposed by the peripheral mask pattern, removing the second trimming pattern and the peripheral mask pattern, and forming a trench isolation region in the substrate by etching the hard mask pattern and partially etching the substrate using a remaining portion of the plurality of mask patterns as an etching mask. The substrate has a cell array region and a peripheral circuit region. The mask line extends in a first direction on the hard mask layer in the cell array region and the peripheral circuit region. The first trimming pattern defines a plurality of openings that expose portions of the hard mask layer and parts of the mask line. The parts of the mask line are at a plurality of points at intervals in the first direction in the cell array region and the peripheral circuit region. The forming the plurality of mask patterns and the hard mask pattern includes removing the parts of the mask line exposed by the first trimming pattern and partially recessing the portions of the hard mask layer exposed by the first trimming pattern. The plurality of mask patterns are aligned in the first direction. The hard mask pattern has a greater thickness in sections covered by the first trimming pattern than in the sections corresponding to partially-recessed portions of the hard mask layer. The second trimming pattern covers the cell array region. The peripheral mask pattern exposes a portion of the plurality of mask patterns and a portion of the hard mask pattern on the peripheral circuit region of the substrate. The forming the trench isolation region in the substrate includes etching the hard mask pattern and partially etching the substrate using a remaining portion of the plurality of mask patterns as an etching mask. A bottom surface of the trench isolation region defines a deep trench isolation region in the substrate. The deep trench isolation region has a level lower than a level of other portions of the trench isolation region. The deep trench isolation region is disposed at a position of the substrate that vertically corresponds to the portion of the hard mask pattern that had been exposed by the peripheral mask pattern before the second trimming pattern and the peripheral mask pattern were removed.

In an example embodiment, the method may further include forming a device isolation film by filling an insulating material in the trench isolation region and the deep trench isolation region. A bottom surface of the device isolation film may define a protrusion is at a position that vertically corresponds to each of the plurality of points.

According to example embodiments of inventive concepts, a semiconductor device includes a substrate having a first region and a second region. The first region has a higher active region density than an active region density of the second region. The substrate includes a pattern of first active regions spaced apart from each other and defined by a first trench isolation region in the substrate in the first region. The pattern of first active regions includes a first group of first active regions that are repeatedly disposed at a first pitch and aligned to extend longitudinally in a first direction. The substrate includes a second active region defined by a second trench isolation region in the substrate in the second region. A first portion of the upper surface of the substrate includes a plurality of structures recessed to a first level in the second trench isolation region of the substrate. The plurality of structures are spaced apart from each other in at least one of the first direction and a second direction. The second direction crosses the first direction. At least one of the plurality of structures is spaced apart in the first direction from a corresponding one of the plurality of first active regions. A second portion of the substrate surrounds the plurality of structures. The second portion of the upper surface of the substrate is recessed to a second level in the substrate in the second trench isolation region. The second level is different than the first level.

In an example embodiment, the plurality of structures may be a plurality of deep trench isolation regions recessed to the first level in the substrate. The plurality of deep trench isolation regions are disposed in an adjacent region of the second region of the substrate. The adjacent region may be adjacent to edges of the first region. The first level may be recessed further in the substrate than the second level.

In an example embodiment, the plurality of structures may be a plurality of island patterns recessed to the first level in the substrate. The plurality of island patterns may be disposed in an adjacent region of the second region of the substrate. The second portion of the upper surface of the substrate may define a deep trench isolation region that is recessed to the second level in the second trench isolation region of the substrate. The second level may be recessed in the substrate further than the first level.

In an example embodiment, the plurality of structures may be a plurality of concave-convex portions of a deep trench isolation region recessed to the first level in the substrate. The plurality of concave-convex portions may be disposed in an adjacent region of the second region of the substrate. The deep trench isolation region may border the first region of the substrate. The concave-convex portions may extend toward the first region of the substrate. The adjacent region may be adjacent to edges of the first region of the substrate. The first level may be recessed further in the substrate than the second level.

In an example embodiment, the plurality of first active regions may each have a long axis and a short axis. The long axis may extend in the first direction. The short axis may be perpendicular to the long axis.

BRIEF DESCRIPTION OF THE DRAWINGS

The foregoing and other features and advantages of inventive concepts will be apparent from the more particular description of non-limiting embodiments of inventive concepts, as illustrated in the accompanying drawings in which like reference characters refer to like parts throughout the different views. The drawings are not necessarily to scale, emphasis instead being placed upon illustrating principles of inventive concepts. In the drawings:

FIGS. 4A and 4B through FIGS. 16A and 16B are cross-sectional views according to a process order, for explaining a method of manufacturing a semiconductor device, according to an example embodiment of inventive concepts;

DETAILED DESCRIPTION OF EXAMPLE EMBODIMENTS

Figure 1:
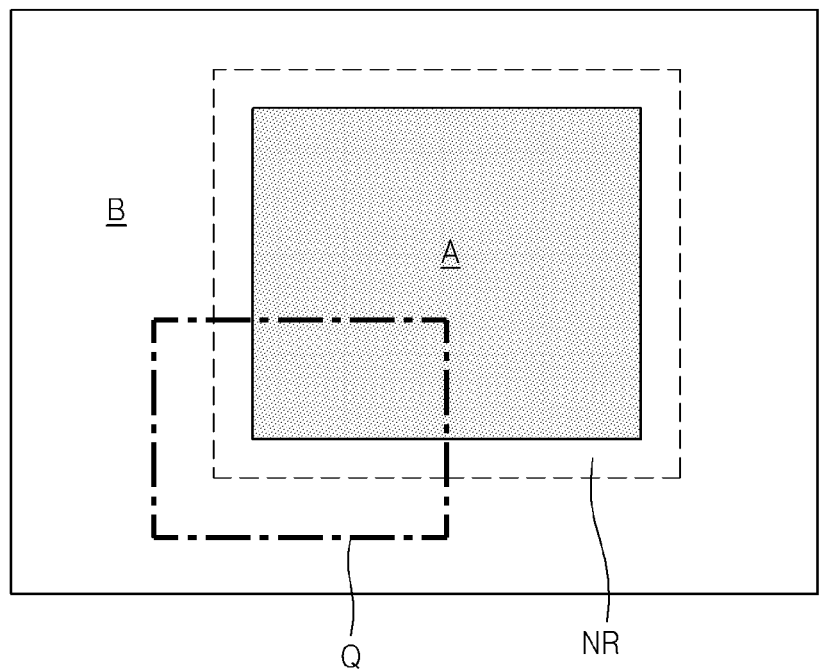
FIG. 1 is a plan view illustrating some elements of a semiconductor device according to an example embodiment of inventive concepts.

Example embodiments will now be described more fully with reference to the accompanying drawings, in which some example embodiments are shown. Example embodiments, may, however, be embodied in many different forms and should not be construed as being limited to the embodiments set forth herein; rather, these example embodiments are provided so that this disclosure will be thorough and complete, and will fully convey the scope of example embodiments of inventive concepts to those of ordinary skill in the art. In the drawings, the thicknesses of layers and regions are exaggerated for clarity. Like reference numerals in the drawings denote like elements, and thus their description may be omitted.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements or layers should be interpreted in a like fashion (e.g., "between" versus "directly between," "adjacent" versus "directly adjacent," "on" versus "directly on"). As used herein, the term "and/or" includes any and all combinations of one or more of the associated listed items. Expressions such as "at least one of;" when preceding a list of elements, modify the entire list of elements and do not modify the individual elements of the list.

It will be understood that, although the terms first, second, third etc. may be used herein to describe various members, regions, layers, portions, and/or elements, these members, regions, layers, portions, and/or elements should not be limited by these terms. These terms are only used to distinguish one member, region, portion, or from another member, region, portion, or element. Thus, a first member, region, portion, or element discussed below could be termed a second member, region, portion, or element without departing from the teachings of example embodiments. For example, a first element could be termed a second element, and, similarly, a second element could be termed a first element, without departing from the scope of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

A specific process order may be changed in example embodiments. For example, two processes which are described as being continuously performed may be simultaneously performed or may be performed in a reverse order.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but may be to include deviations in shapes that result, for example, from manufacturing.

Unless otherwise defined, all terms (including technical and scientific terms) used herein have the same meaning as commonly understood by one of ordinary skill in the art to which example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

Although corresponding plan views and/or perspective views of some cross-sectional view(s) may not be shown, the cross-sectional view(s) of device structures illustrated herein provide support for a plurality of device structures that extend along two different directions as would be illustrated in a plan view, and/or in three different directions as would be illustrated in a perspective view. The two different directions may or may not be orthogonal to each other. The three different directions may include a third direction that may be orthogonal to the two different directions. The plurality of device structures may be integrated in a same electronic device. For example, when a device structure (e.g., a memory cell structure or a transistor structure) is illustrated in a cross-sectional view, an electronic device may include a plurality of the device structures (e.g., memory cell structures or transistor structures), as would be illustrated by a plan view of the electronic device. The plurality of device structures may be arranged in an array and/or in a two-dimensional pattern.

FIG. 1 is a plan view illustrating some elements of a semiconductor device 10 according to an example embodiment of inventive concepts.

Referring to FIG. 1, the semiconductor device 10 includes a first region A and a second region B whose active region densities are different from each other. The first region A is a high-density region whose active region density is relatively high, and the second region B is a low-density region whose active region density is relative low. In an example embodiment, the first region A may be a cell array region of a semiconductor memory device. For example, a volatile memory cell array such as a dynamic random access memory (DRAM) cell array or a nonvolatile memory cell array such as a flash memory cell array may be formed in the first region A. Peripheral circuits that are electrically connected to cell arrays formed in the first region A may be formed in the second region B. The second region B may include a region in which no cell array is formed such as a core region. The term "peripheral circuit region" used herein refers to a region in in which peripheral circuits are formed or a core region.

The second region B includes an adjacent region NR that is disposed adjacent to the first region A and surrounds the first region A. In an example embodiment, no active region may be formed in the adjacent region NR. However, example embodiments are not limited thereto. For example, an active region may be formed in a part of the adjacent region NR.

Although the first region A is surrounded by the second region B in FIG. 1, the example embodiments not limited thereto. The first region A and the second region B may be appropriately disposed in various ways.

Figure 2A:
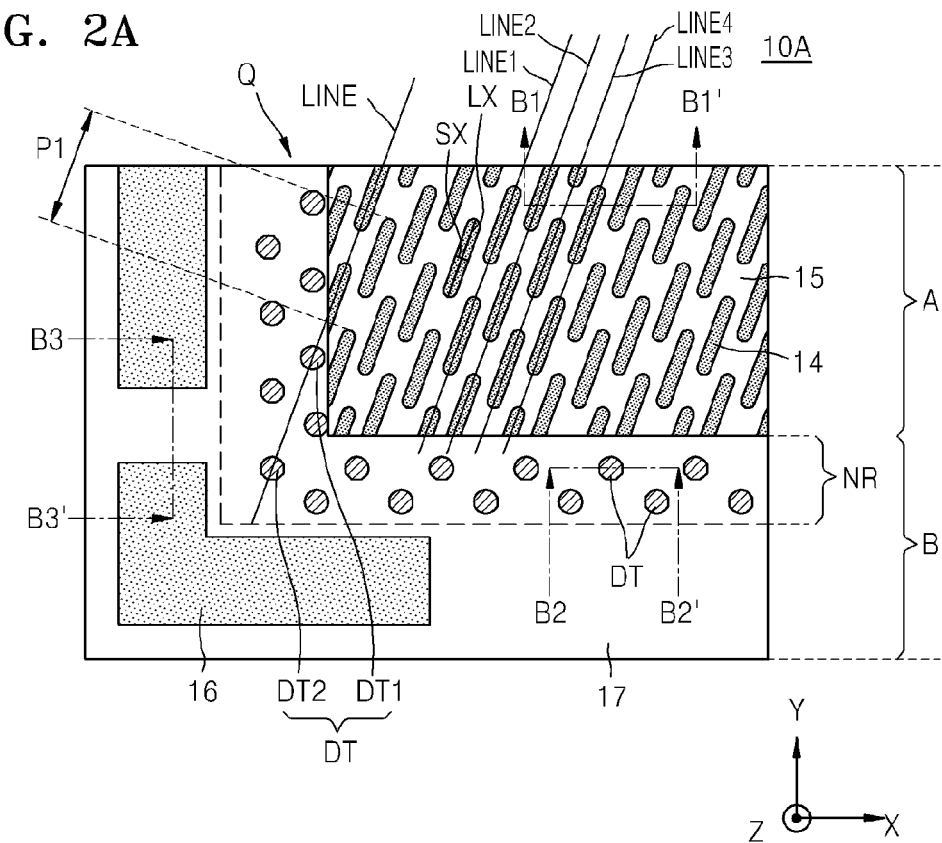
FIG. 2A is a plan view illustrating a portion of the semiconductor device of FIG. 1, according to an example embodiment of inventive concepts.
Figure 2B:
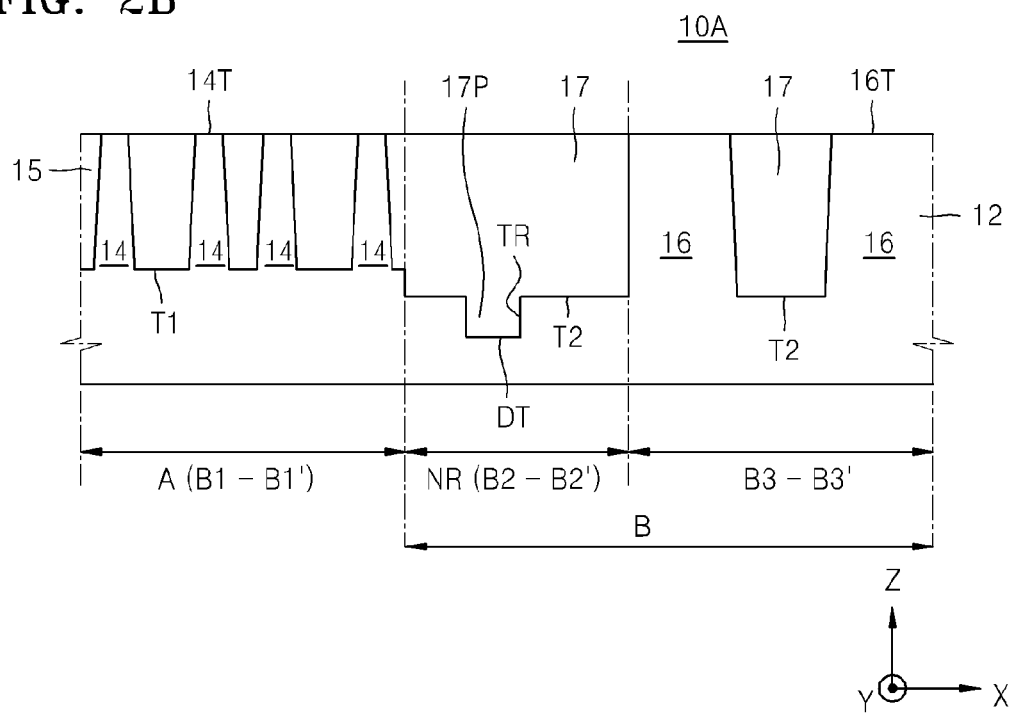
FIG. 2B is a cross-sectional view taken along lines B1-B1', B2-B2', and B3-B3' of FIG. 2A.

FIGS. 2A and 2B are views illustrating a semiconductor device 10A according to an example embodiment of inventive concepts. FIG. 2A is a plan view illustrating a portion of the semiconductor device 10 of FIG. 1 marked by a dashed dot line Q, according to an example embodiment of inventive concepts. FIG. 2B is a cross-sectional view taken along lines B1-B1', B2-B2', and B3-B3' of FIG. 2A.

Referring to FIGS. 2A and 2B, the semiconductor device 10A includes a substrate 12 that includes the first region A and the second region B whose active region densities are different from each other, and the adjacent region NR of the second region B that is adjacent to the first region A. In an example embodiment, the first region A is a cell array region, and the second region B is a peripheral circuit region.

A plurality of active regions 14 are defined by a first trench T1 in the first region A of the substrate 12. The plurality of first active regions 14 include a top surface 14T having a long axis LX that extends along a first straight line LINE or a straight line parallel to the first straight line LINE and a short axis SX that is perpendicular to the long axis LX, and are repeatedly formed at first pitches P1 along the first straight line LINE or the straight line parallel to the first straight line LINE. A first device isolation film 15 is formed in the first trench T1.

A plurality of second active regions 16 are defined by a second trench T2 in the second region B of the substrate 12. A second device isolation film 17 is formed in the second trench T2.

A plurality of deep trenches DT that are recessed to have a level lower than those of other points on a bottom surface of the second trench T2 are formed at at least one point, selected on an extension line of the first straight line LINE, of a surface of the substrate 12 that forms the bottom surface of the second trench T2. The deep trenches DT communicate with the second trench T2 in the bottom surface of the second trench T2.

The second device isolation film 17 includes a protrusion 17P that projects away from a top surface of the substrate 12, that is, from the top surface 14T of the first active regions 14 or a top surface 16T of a second active region 16 in a thickness direction (Z direction in FIGS. 2A and 2B) of the substrate 12, at a point selected along the first straight line LINE. A plurality of the protrusions 17P are formed to correspond to the plurality of deep trenches DT.

The plurality of deep trenches DT are distributed around the first region A. Some of the plurality of deep trenches DT are disposed between the second active region 16 and the first region A in the second trench T2. Likewise, the plurality of protrusions 17P are disposed between the second active region 16 and the first region A on a bottom surface of the second device isolation film 17.

In the adjacent region NR, the plurality of protrusions 17P and the plurality of deep trenches DT may be spaced apart by a desired (and/or alternatively predetermined) interval from one another. In an example embodiment, the plurality of deep trenches DT are disposed on extension lines of the long axes LX of some of the plurality of first active regions 14.

The plurality of deep trenches DT include a plurality of recess portions TR that are spaced apart from one another in the bottom surface of the second trench T2.

When the plurality of first active regions 14 are repeatedly formed at the first pitches P1 along the first straight line LINE in the first region A, the plurality of deep trenches DT formed in the second region B may include two deep trenches DT 1 and DT2 that are spaced apart by the first pitch P1 on an extension line of the first straight line LINE.

The plurality of first active regions 14 may be spaced apart from each other and arranged in a pattern. For example, as shown in FIG. 2A, some of the first active regions 14 may be repeatedly formed at the first pitches P1 along the straight line LINE1, other ones of the first active regions 14 may be repeatedly formed at the first pitches P1 along the straight line LINE2, other ones of the first active regions 14 may be repeatedly formed at the first pitches P1 along the straight line LINE3, and other ones of the first active regions 14 may be repeatedly formed at the first pitches P1 along the straight line LINE4. In other words, the first active regions 14 formed along the first straight LINE may be a first group of first active regions 14. The first active regions 14 formed along the straight line LINE1 may be a second group of first active regions 14. The first active regions 14 formed along the straight line LINE2 may be a third group of first active regions 14. The first active regions 14 formed along the straight line LINE3 may be a fourth group of first active regions 14. The first active regions 14 formed along the straight line LINE4 may be a fifth group of first active regions 14.

The straight lines LINE1 to LINE4 may be spaced apart from each other in the X direction. The positions of the first active regions 14 in the straight lines may be offset from the positions of the first active regions 14 in other adjacent straight lines, but the positions of the first active regions 14 in the straight lines may be similarly arranged to the positions of corresponding first active regions in the straight lines that are further away. For example, as shown in FIG. 2A, the first active regions 14 in LINE1 may be offset in the Y direction from corresponding first active regions 14 in LINE2 and LINE3. Also, the first active regions 14 in LINE1 may not be offset in the Y direction from corresponding first active regions 14 in LINE4. Similarly, the first active regions 14 in LINE2 may not be offset in the Y direction from corresponding first active regions 14 in the first straight line LINE. However, the pattern for the arrangement of the first active regions 14 in FIG. 2A is a non-limiting example. In other example embodiments, the first active regions 14 may be arranged in a different pattern than the pattern illustrated in FIG. 2A.

Figure 3A:
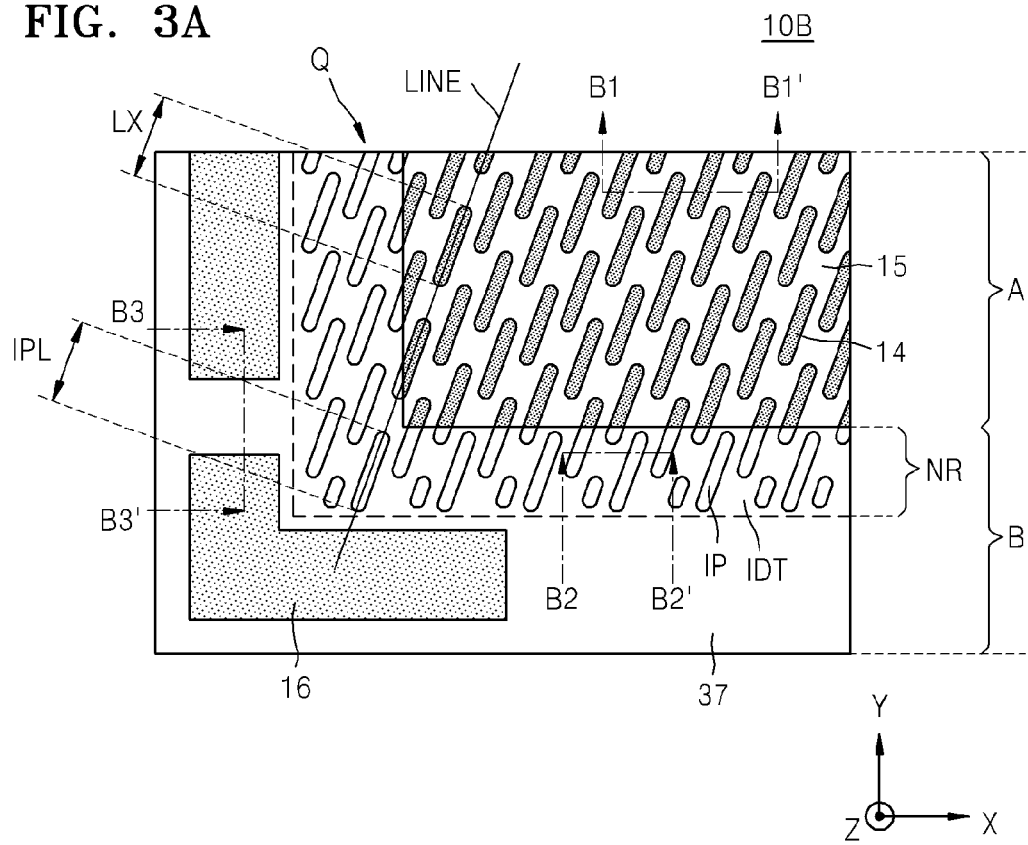
FIG. 3A is a plan view illustrating a portion of the semiconductor device of FIG. 1, according to an example embodiment of inventive concepts.
Figure 3B:
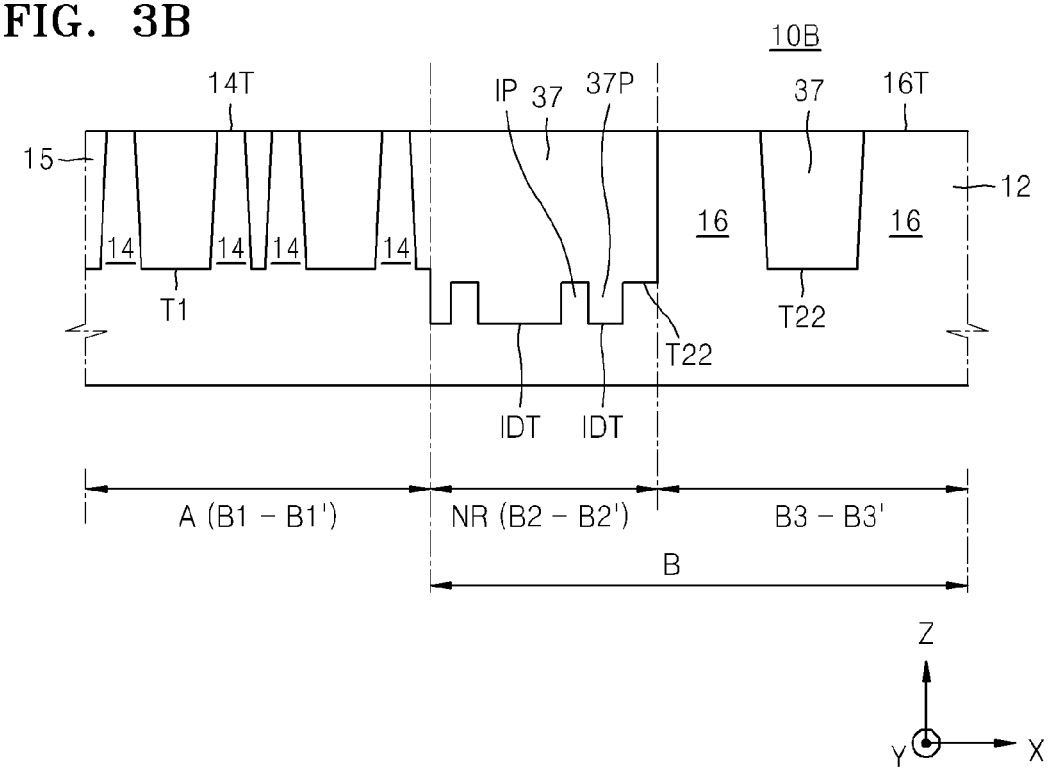
FIG. 3B is a cross-sectional view taken along lines B1-B1', B2-B2', and B3-B3' of FIG. 3A.

FIGS. 3A and 3B are views illustrating a semiconductor device 10B according to an example embodiment of inventive concepts. FIG. 3A is a plan view illustrating a portion of the semiconductor device 10 of FIG. 1 marked by the dashed dot line Q, according to an example embodiment of inventive concepts. FIG. 3B is a cross-sectional view taken along lines B1-B1', B2-B2', and B3-B3' of FIG. 3A. In FIGS. 3A and 3B, the same elements as those in FIGS. 2A and 2B are denoted by the same reference numerals, and a detailed explanation thereof will not be given.

Referring to FIGS. 3A and 3B, a plurality of the second active regions 16 are defined by a second trench T22 in the second region B of the substrate 12. A second device isolation film 37 is formed in the second trench T22.

An integrated deep trench IDT that is recessed to have a level lower than those of other points on a bottom surface of the second trench T22 is formed at at least one point, selected on an extension line of the first straight line LINE, of the surface of the substrate 12 that forms the bottom surface of the second trench T22. The integrated deep trench IDT communicates with the second trench T22 in the bottom surface of the second trench T22.

The integrated deep trench IDT surrounds a plurality of island patterns IPs that protrude toward the top surface of the substrate 12, that is, the top surface 14T of the first active region 14 or the top surface 16T of the second active region 16, in a thickness direction (Z direction in FIGS. 3A and 3B) of the substrate 12 at a point selected along the first straight line LINE.

The second device isolation film 37 formed in the second region B includes a protrusion 37P that protrudes away from the top surface of the substrate 12, that is, the top surface 14T of the first active region 14 or the top surface 16T of the second active region 16b in the thickness direction (Z direction in FIGS. 3A and 3B) of the substrate 12 at a point selected along the first straight line LINE. The protrusion 37P may have a shape to correspond to the integrated deep trench IDT.

A length IPL of each of the plurality of island patterns IPs may be substantially equal or similar to a length of the long axis LX of the first active region 14 that is formed in the first region A.

FIGS. 4A and 4B through FIGS. 16A and 16B are cross-sectional views according to a process order, for explaining a method of manufacturing a semiconductor device 100A (see FIGS. 16A and 16B), according to an example embodiment of inventive concepts.

The semiconductor device 100A has a structure in which the plurality of protrusions 17P and the plurality of deep trenches DT are formed in the adjacent region NR, like the semiconductor device 10A of FIGS. 2A and 2B.

FIGS. 4A, 5A through FIG. 16A are plan views illustrating a portion of the semiconductor device 10 of FIG. 1 marked by the dashed dot line Q. FIGS. 4B, 5B through 16B are cross-sectional views taken lone lines B1-B1', B2-B2', and B3-B3' of FIGS. 4A, 5A, . . . , and 16A. In FIGS. 4A through 16B, the same elements as those in FIGS. 1 through 3B are denoted by the same reference numerals, and a detailed explanation thereof will not be given.

Figure 4A:
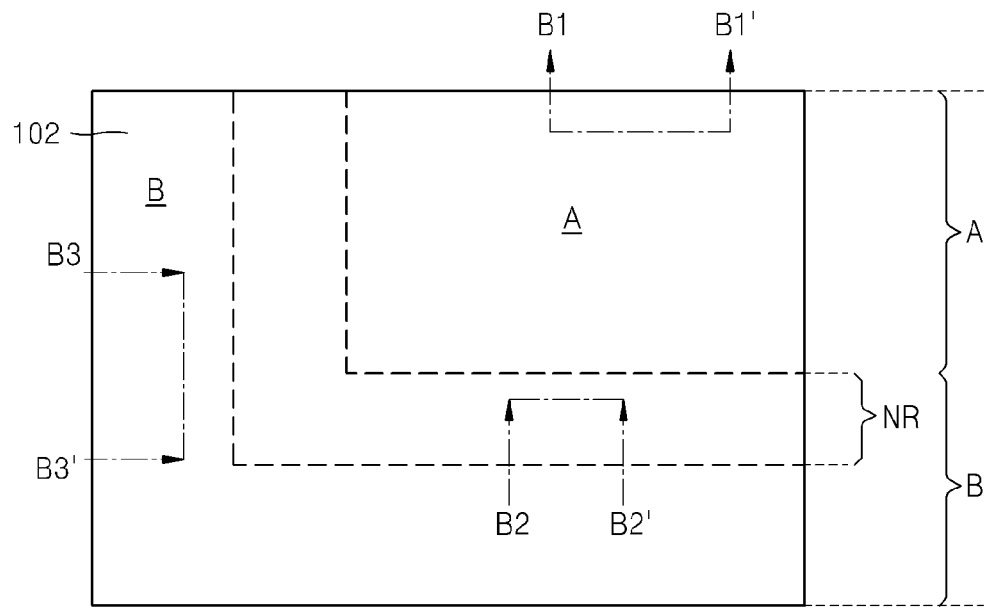
Figure 4B:
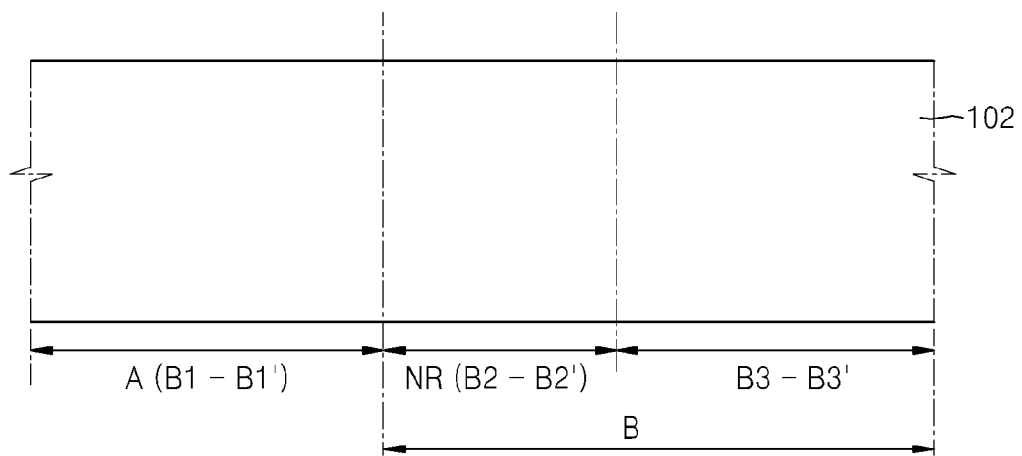

Referring to FIGS. 4A and 4B, a substrate 102 is prepared. The substrate 102 includes the first region A and the second region B, and the second region B includes the adjacent region NR that is adjacent to the first region A.

The substrate 102 may be a typical semiconductor substrate such as a silicon substrate.

Figure 5A:
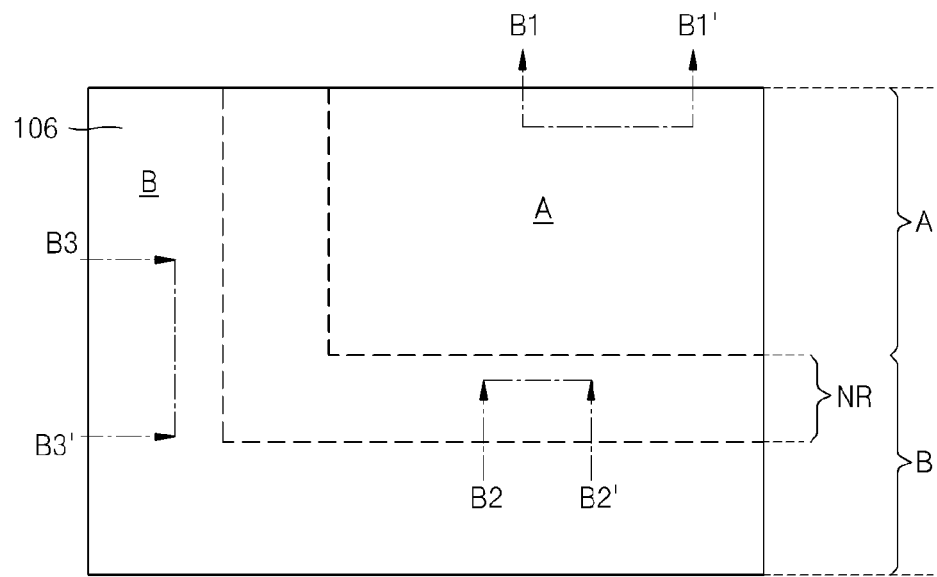
Figure 5B:
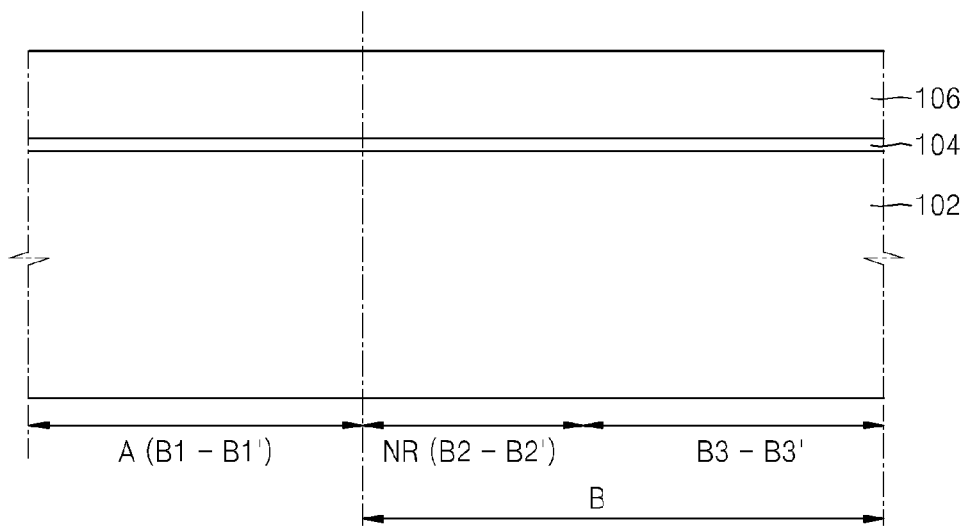

Referring to FIGS. 5A and 5B, a pad oxide film 104 is formed in the first region A and the second region B of the substrate 102. A hard mask layer 106 is formed on the pad oxide film 104.

In an example embodiment, the hard mask layer 104 may have a single-layer structure. Alternatively, the hard mask layer 106 may have a multi-layer structure in which two or more hard mask layers having different etching characteristics under a desired (and/or alternatively predetermined) etching condition are stacked. For example, the hard mask layer 106 may include a silicon nitride film, a silicon oxide film, or a combination thereof. When the hard mask layer 106 includes a silicon oxide film, the pad oxide film 104 may be omitted.

Figure 6A:
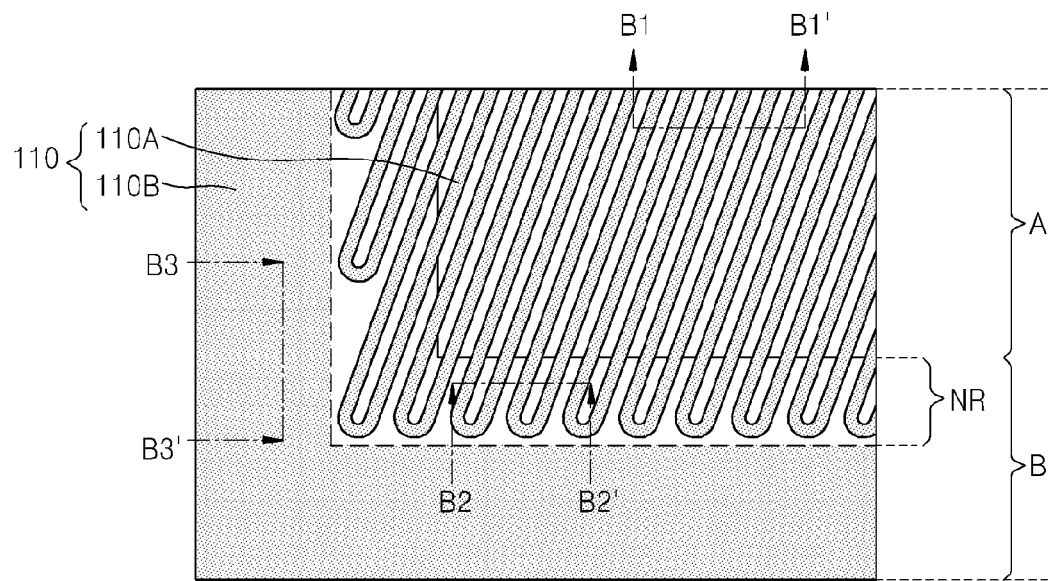
Figure 6B:
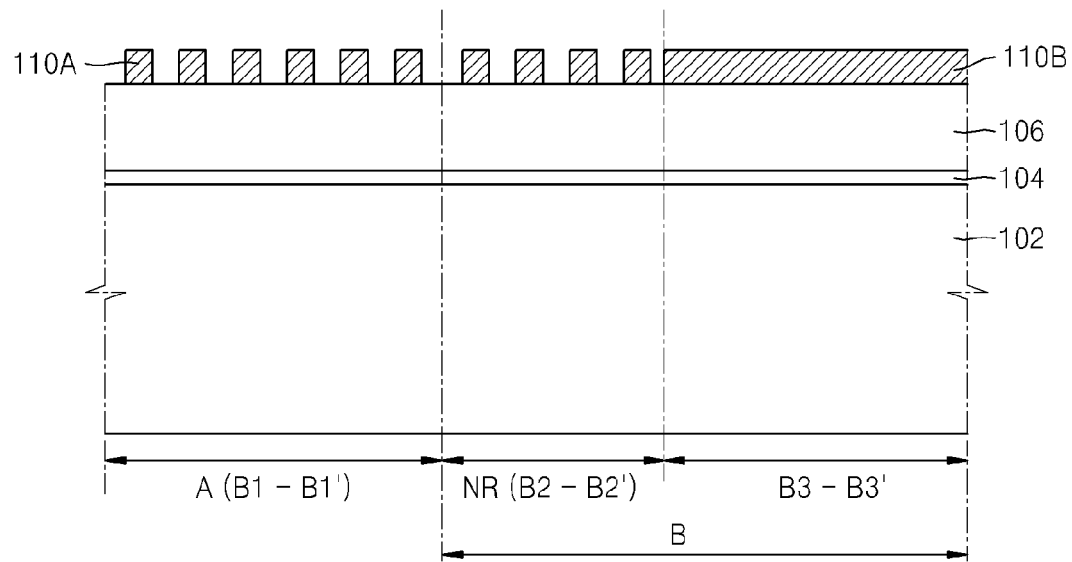

Referring to FIGS. 6A and 6B, a mask layer 110 is formed on the hard mask layer 106 in the first region A and the second region B.

The mask layer 110 may include a plurality of mask lines 110A that extend over the first region A and the adjacent region NR of the second region B, and a wide width mask layer 110B that is formed in a portion of the second region B other than the adjacent region NR.

Each of the plurality of mask lines 110A may be formed to have a ring shape. However, example embodiments are not limited thereto. For example, each of the plurality of mask lines 110A may be formed to have any of various shapes. For example, each of the plurality of mask lines 110A may have a bar shape that linearly extends.

The plurality of mask lines 110A may be formed to include linear portions that extend in parallel in a desired (and/or alternatively predetermined) direction. For example, the plurality of mask lines 110A may include portions that extend in parallel to the first straight line LINE of FIG. 2A or 3A.

In an example embodiment, the mask layer 110 may be formed of a material that has an etch selectivity different from that of the hard mask layer 106 in order to be used as an etching mask for the hard mask layer 106. For example, the mask layer 110 may be formed of any one material selected from silicon-containing materials such as polysilicon, SiON, $SiO_2$, $Si_3N_4$, and SiCN. Alternatively, the mask layer 110 may be formed of a metal or an organic material.

Figure 7A:
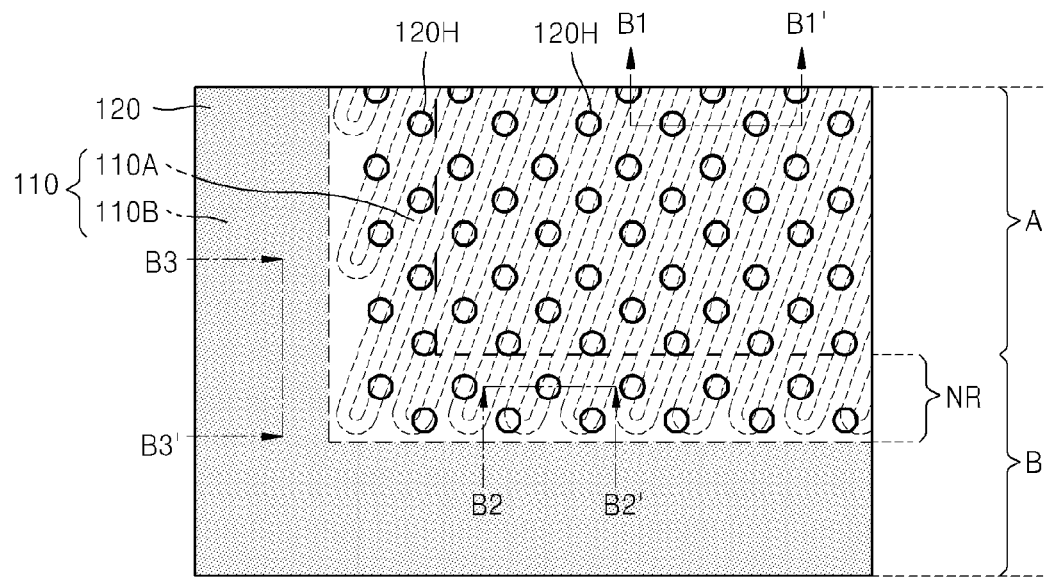
Figure 7B:
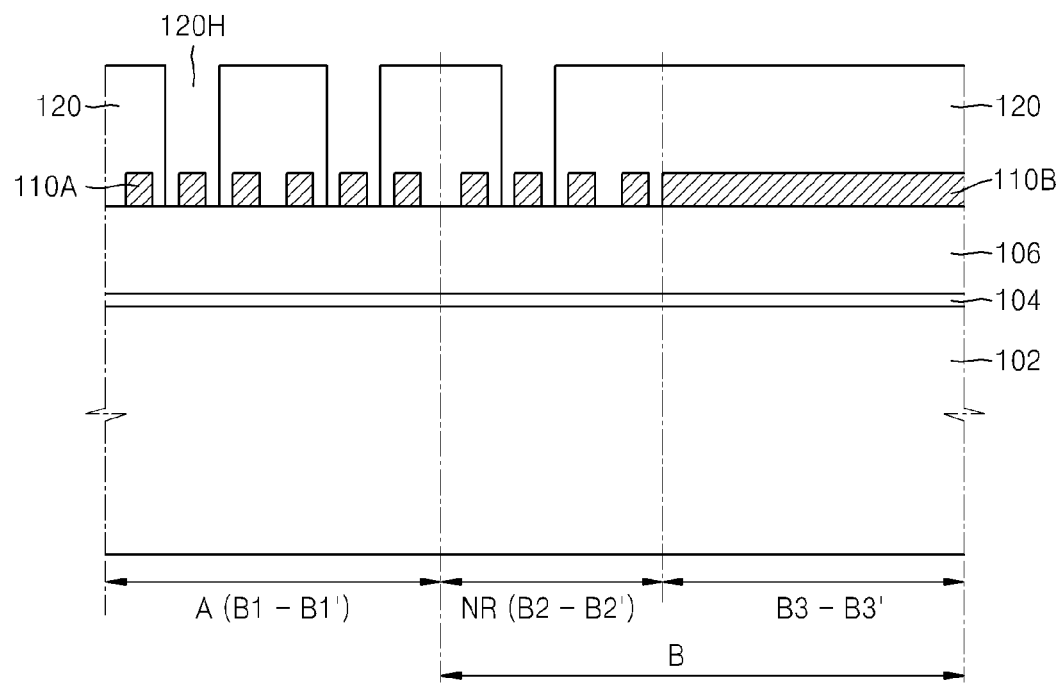

Referring to FIGS. 7A and 7B, a first trimming pattern 120 is formed on a resultant structure including the mask layer 110.

The first trimming pattern 120 may be formed to cover both the first region A and the second region B. A plurality of openings 120H that are formed over the mask lines 110A are formed within a first range including the first region A and the adjacent region NR of the second region B in the first trimming pattern 120. The plurality of openings 120H are spaced apart from one another.

In the first region A, the mask lines 110A are respectively exposed through the plurality of openings 120H. Although the mask lines 110A may be respectively exposed through the plurality of openings 120H even in the adjacent region NR of the second region, the example embodiments are not limited thereto.

In an example embodiment, the plurality of openings 120H may be formed in a longitudinal direction of the plurality of mask lines 110A. In an example embodiment, in the first region A, the plurality of openings 120H may be formed at desired (and/or alternatively predetermined) pitches in the longitudinal direction of the plurality of mask lines 110A. For example, the plurality of openings 120H may be repeatedly formed at the same as the first pitches P1 along the first straight line LINE of FIG. 2A.

Figure 8A:
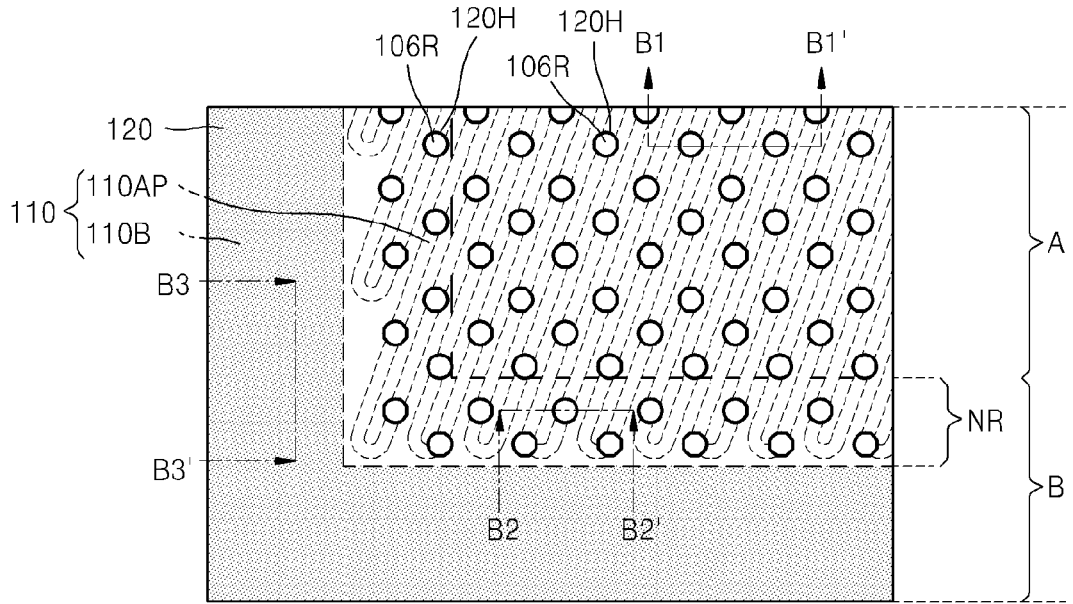
Figure 8B:
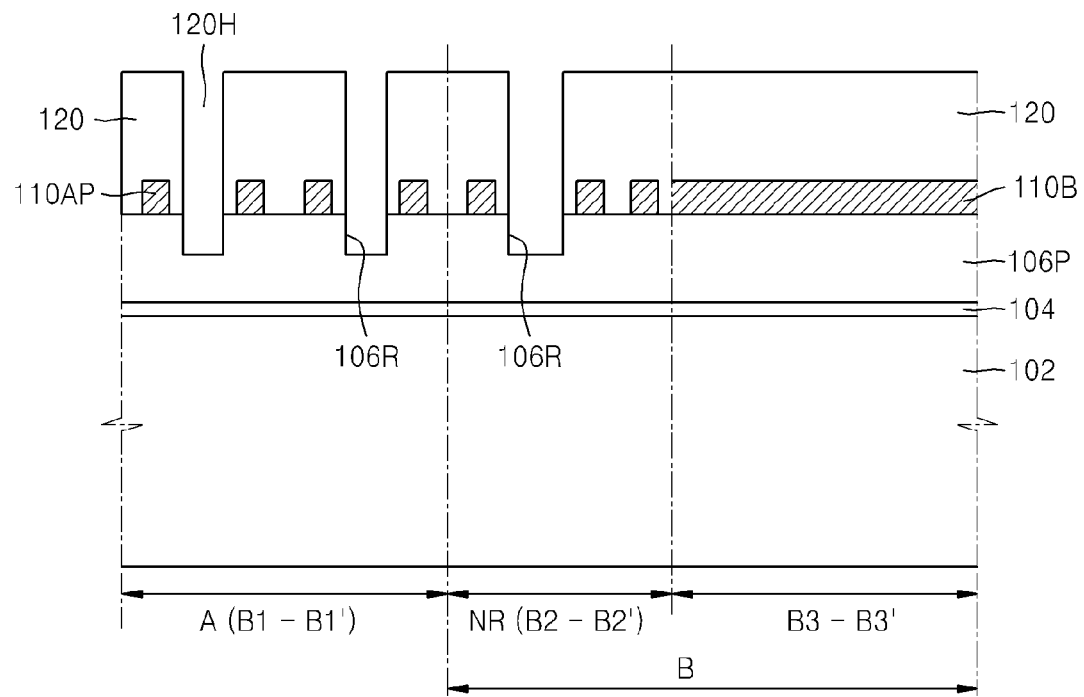

Referring to FIGS. 8A and 8B, a first trimming process that removes exposed portions of the plurality of mask lines 110A by using the first trimming pattern 120 as an etching mask is performed.

In the first trimming process, the plurality of mask lines 110A are divided into a plurality of mask patterns 110AP that extend over the first region A and the second region B.

While portions of the plurality of mask lines 110A that are exposed through the plurality of openings 120H formed in the first trimming pattern 120 are removed during the first trimming process, portions of the hard mask layer 106 that are exposed through the plurality of openings 120H around the plurality of mask patterns 110AP may also be removed. As a result, a hard mask pattern 106P in which a plurality of recess portions 106R having lower surfaces are formed at positions vertically corresponding to the plurality of openings 120H formed in the first trimming pattern 120 is formed. The hard mask pattern 106P is formed such that portions that are covered by the plurality of mask patterns 110AP and portions that vertically correspond to the plurality of openings 120H have different thicknesses. The plurality of recess portions 106R that are formed in the hard mask pattern 106P are exposed through the plurality of openings 120H.

In order to obtain the hard mask pattern 106P in which the plurality of recess portions 106R are formed, an etching atmosphere in which an etch selectivity between the mask layer 110 and the hard mask layer 106 is relatively low may be formed by controlling an etching atmosphere during the first trimming process.

Figure 9A:
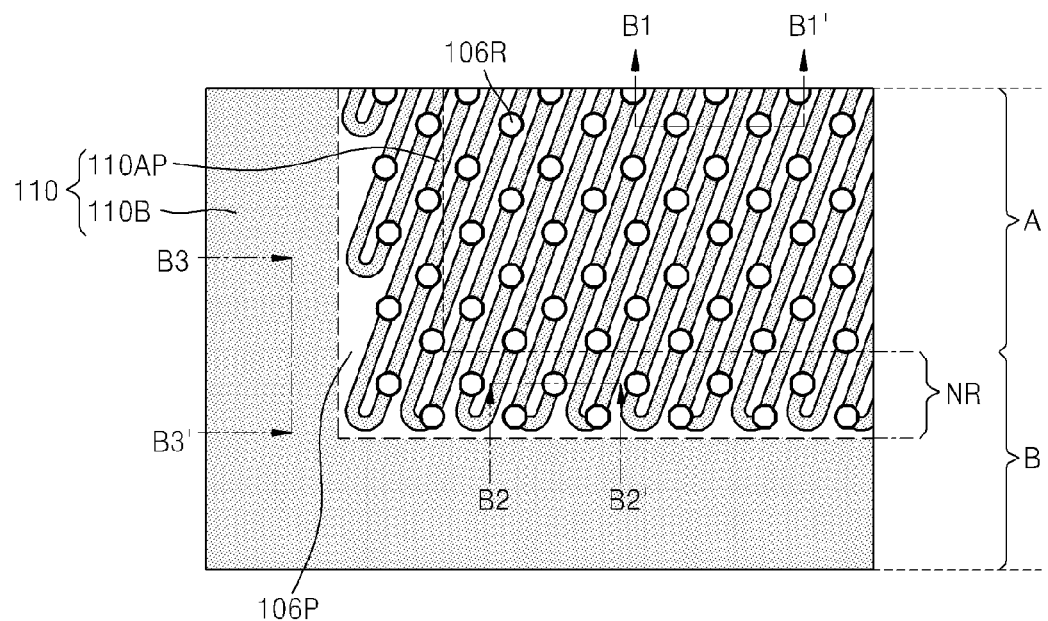
Figure 9B:
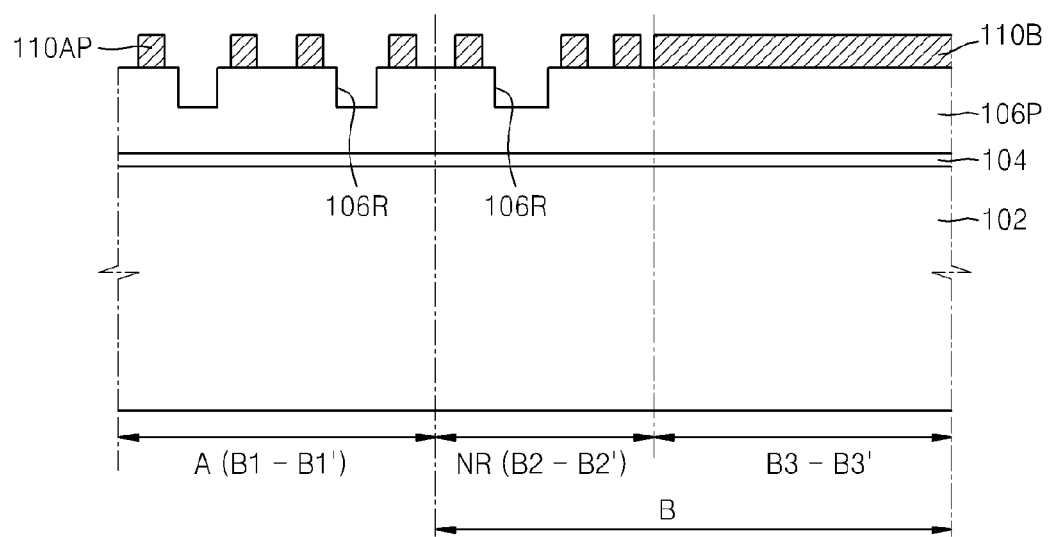

Referring to FIGS. 9A and 9B, the plurality of mask patterns 110AP that extend over the first region A and the second region B, and the wide width mask layer 110B that is in the second region B are exposed by removing the first trimming pattern 120.

Figure 10A:
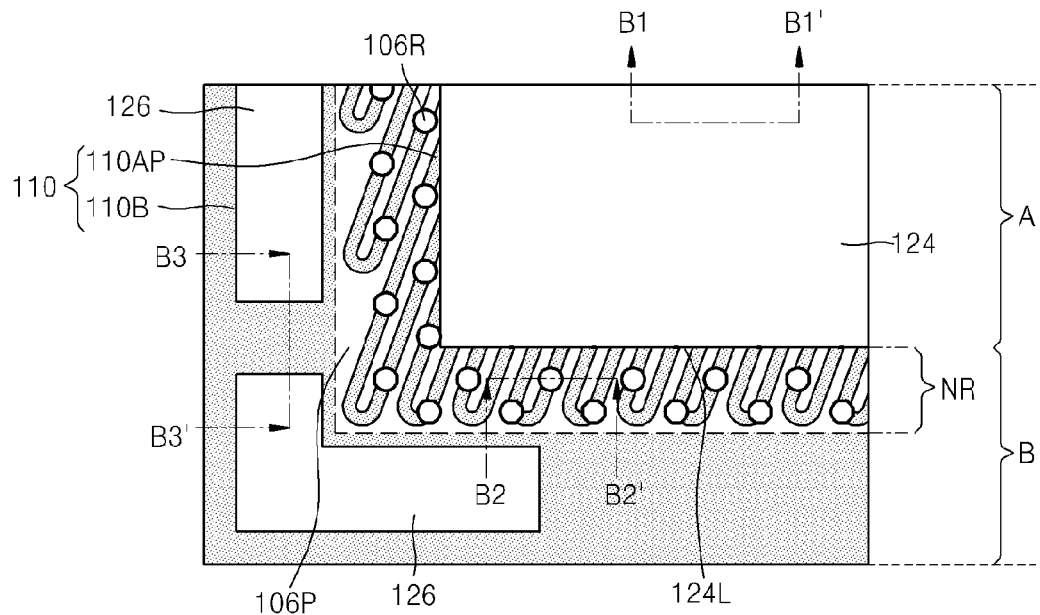
Figure 10B:
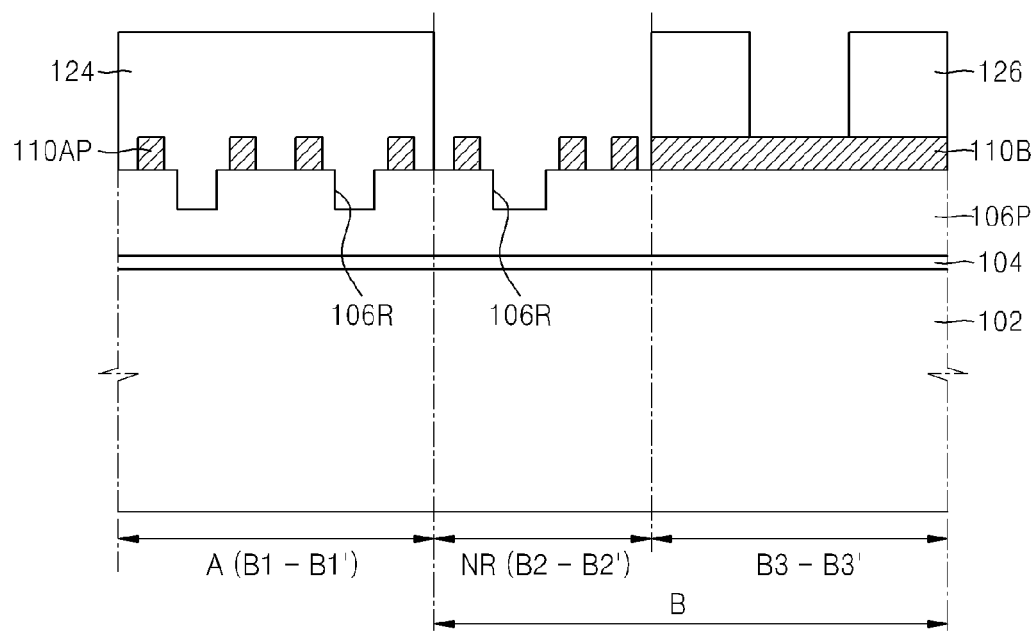

Referring to FIGS. 10A and 10B, a second trimming pattern 124 is formed on the plurality of mask patterns 110AP in the first region A, and a peripheral mask pattern 126 that defines an active region of the second region B is formed on the wide width mask layer 110B in the second region B.

In an example embodiment, the second trimming pattern 124 and the peripheral mask pattern 126 may be simultaneously formed, and may be formed of the same material. In an example embodiment, each of the second trimming pattern 124 and the peripheral mask pattern 126 may be formed of a material such as a spin-on hardmask (hereinafter, referred to as "SOH") that has a relatively high carbon content ranging from about 85 wt % to about 99 wt %. Alternatively, each of the second trimming pattern 124 and the peripheral mask pattern 126 may be formed of an amorphous carbon layer (ACL), $SiO_2$, $Si_3N_4$, SiCN, polysilicon or a combination thereof.

Spin coating or chemical vapor deposition (CVD) may be used in order to form the second trimming pattern 124 and the peripheral mask pattern 126. A process for forming the second trimming pattern 124 and the peripheral mask pattern 126 by using an SOH is as follows. First, an organic compound layer having a thickness ranging from about 1000 Å to about 5000 Å is formed on the substrate 102. In this case, spin coating or another deposition may be used. The organic compound layer may be formed of a hydrocarbon compound including an aromatic ring such as phenyl, benzene, or naphthalene, or a derivative thereof. The organic compound layer may be formed of a material that has a relatively high carbon content ranging from about 85 wt % to about 99 wt % based on a total weight. A carbon-containing film may be formed by first baking the organic compound layer at a temperature ranging from about 150° C. to 250° C. The first baking may be performed for about 60 seconds. Next, the carbon-containing film is cured by being second baked at a temperature ranging from about 300° C. to 550° C. As such, since the carbon-containing film is cured by being second baked, even though deposition is performed at a relatively high temperature equal to or higher than about 400° C. when another film is formed on the carbon-containing film, the carbon-containing film is not badly affected during the deposition. Next, the second trimming pattern 124 and the peripheral mask pattern 126 may be formed by patterning the cured carbon-containing film by using photolithography.

Although an edge portion of the second trimming pattern 124 has a linear outline in FIG. 10A, example embodiments are not limited thereto and various modifications may be made, which will be explained below in detail with reference to FIGS. 21C and 21D.

Figure 11A:
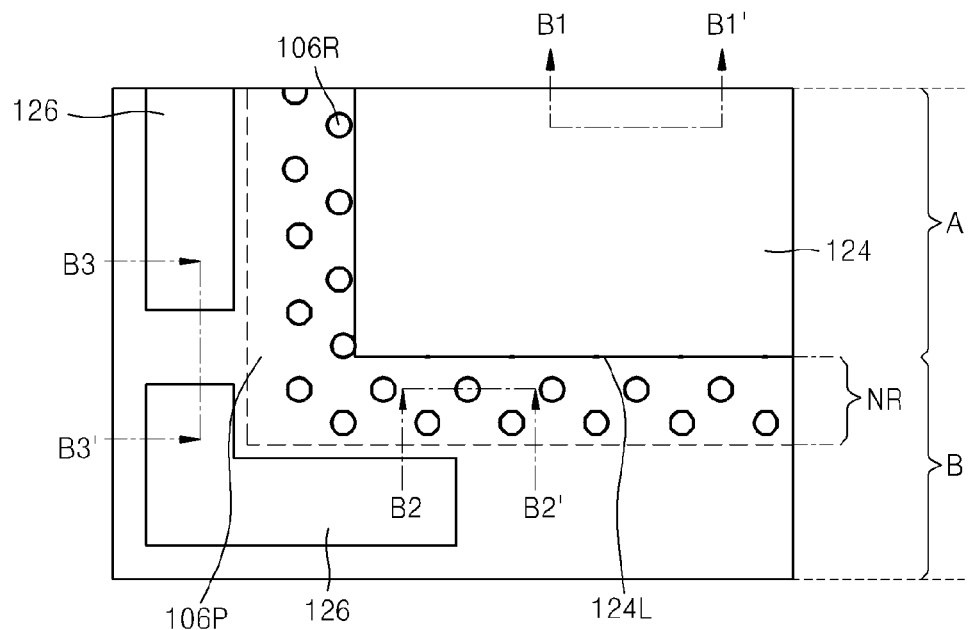
Figure 11B:
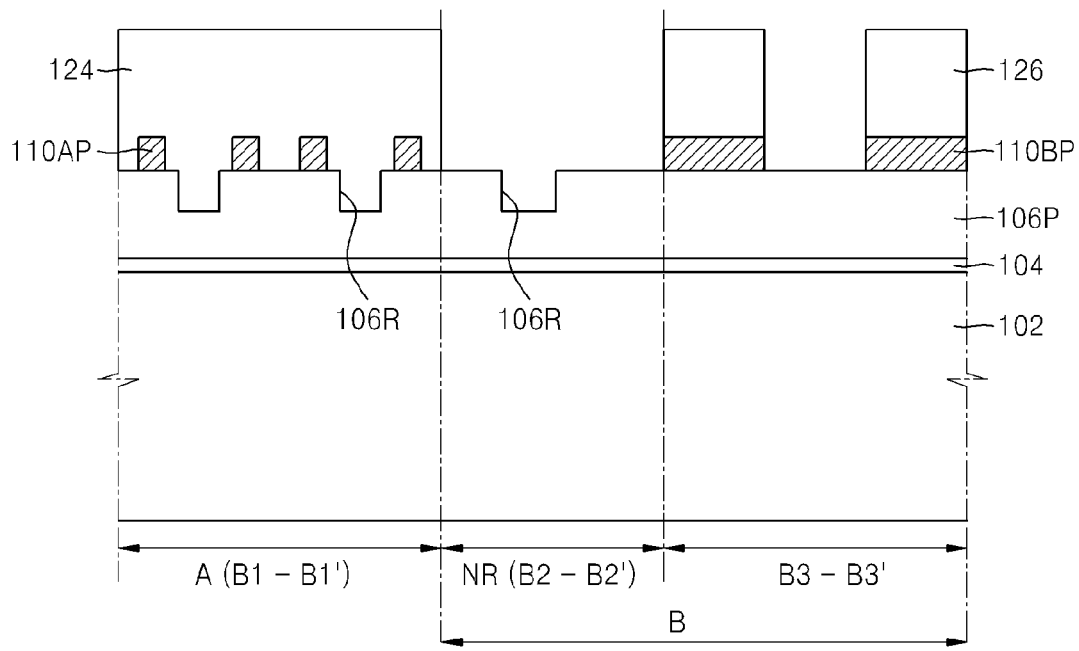

Referring to FIGS. 11A and 11B, a second trimming process that etches and removes exposed portions of the plurality of mask patterns 110AP is performed by using the second trimming pattern 124 as an etching mask.

The plurality of mask patterns 110AP that are in the adjacent region NR of the second region B may be removed due to the second trimming process.

While the second trimming process is performed, a wide width mask pattern 110BP that defines an active region of the substrate 102 in the second region B is formed by removing an exposed portion of the wide width mask layer 110B by using the peripheral mask pattern 126 as an etching mask in the second region B.

Figure 12A:
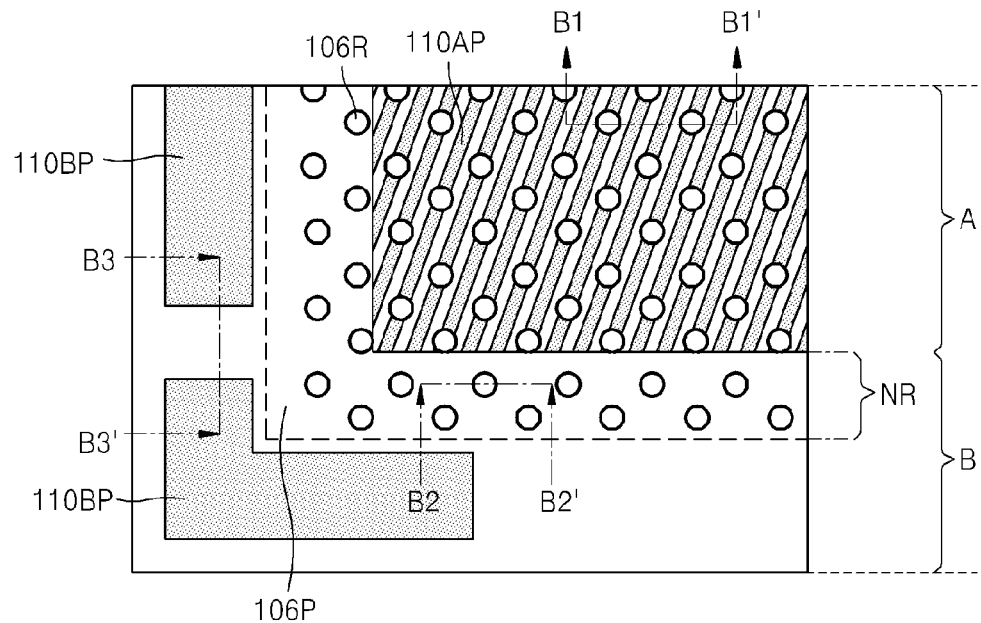
Figure 12B:
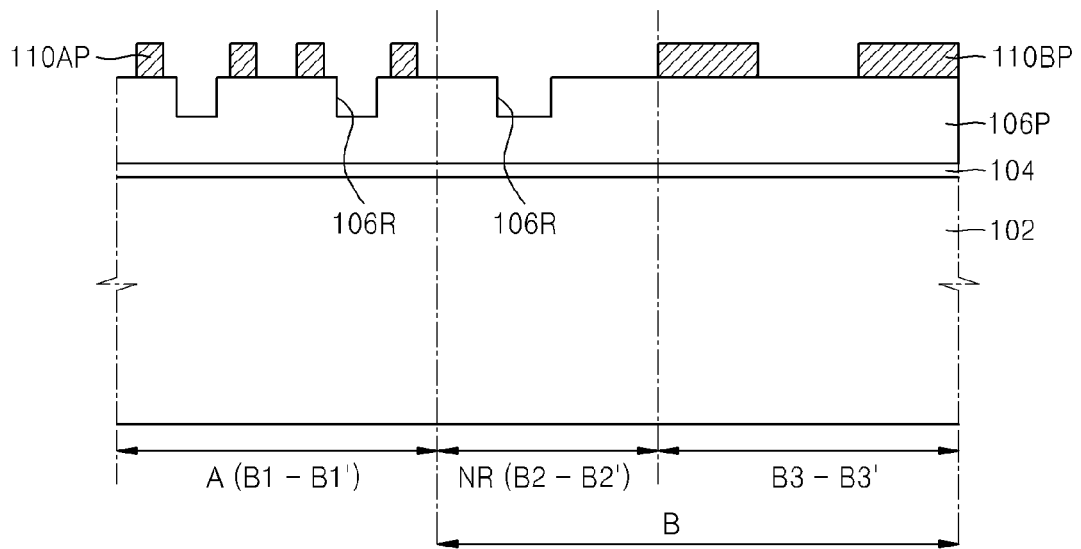

Referring to FIGS. 12A and 12B, the plurality of mask patterns 110AP that remain in the first region A and the wide width mask pattern 110BP that remains in the second region B are exposed by removing the second trimming pattern 124 and the peripheral mask pattern 126 on a resultant structure of FIGS. 11A and 11B.

Figure 13A:
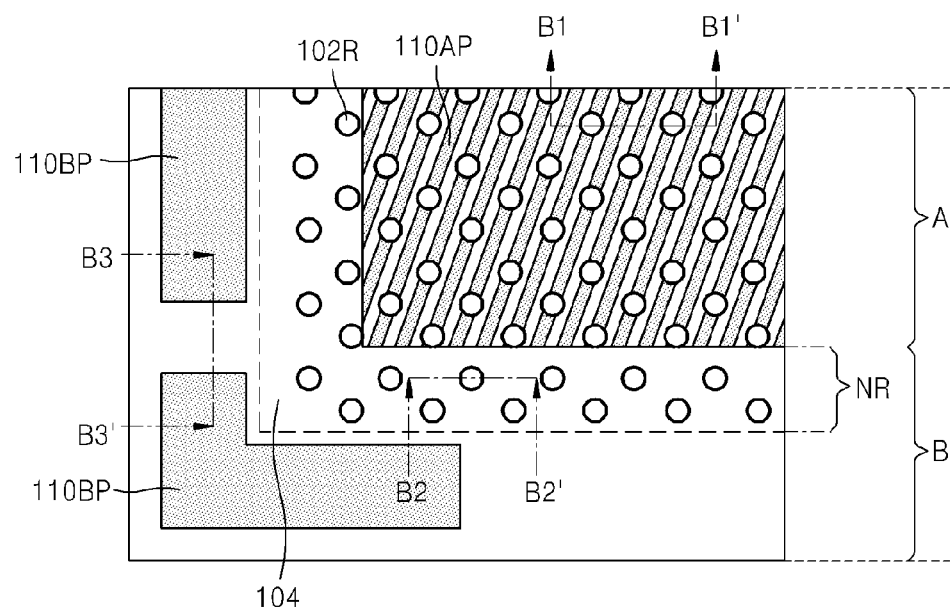
Figure 13B:
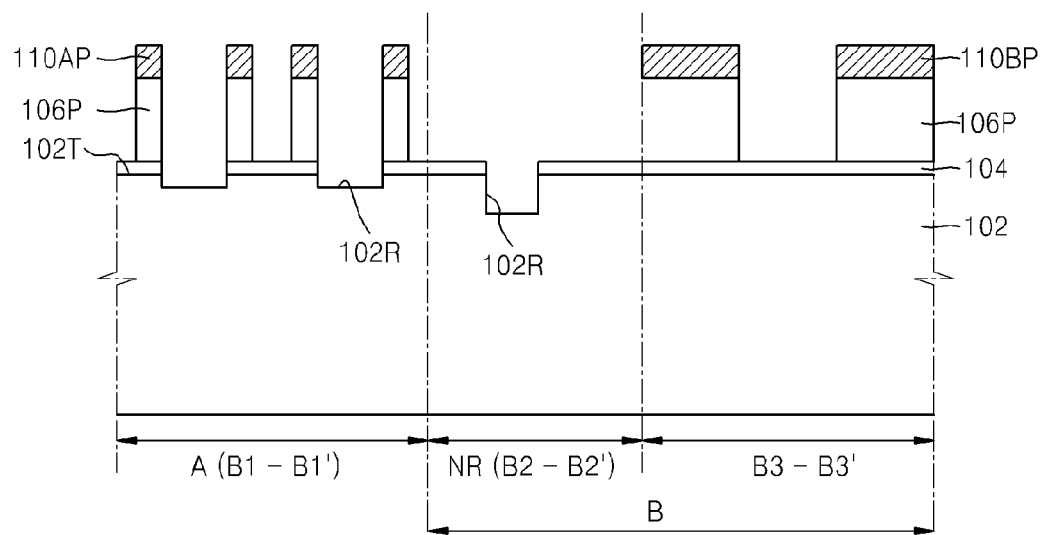

Referring to FIGS. 13A and 13B, exposed portions of the hard mask pattern 106P that correspond to portions that are to be active regions in the first region A and the second region B are removed by being etched by using the plurality of mask patterns 110AP and the wide width mask pattern 110BP as an etching mask.

While the exposed portions of the hard mask pattern 106P are etched, recess portions 102R that have levels lower than that of a top surface 102T of the substrate 102 may be formed by partially removing the pad oxide film 104 and the substrate 102 at positions vertically corresponding to the plurality of recess portions 106R that are formed in a top surface of the hard mask pattern 106P. Since a width exposed between the mask patterns 110AP in the first region A is less than that in the second region B and a pattern density between the mask patterns 110AP in the first region A is higher than that in the second region B, a depth of each of the recess portions 102R that are formed in the substrate 102 in the first region A may be less than a depth of each of the recess portions 102R that are formed in the substrate 120 in the second region B due to loading effect. For example, reactive-ion etching (RIE) may be used in order to etch an exposed portion of the hard mask pattern 106P. While the hard mask pattern 106P is etched by using RIE and then the exposed substrate 102 is etched, RIE lag may affect. As a result, the recess portions 102R that have smaller depths than those in the second region B may be formed in the first region A in which etching is performed through a relatively small width between the mask patterns 110AP. Alternatively, the recess portions 102R may not be formed in the substrate 102 in the first region A, and may be formed in the substrate 120 only in the second region B. However, example embodiments are not limited thereto.

Figure 14A:
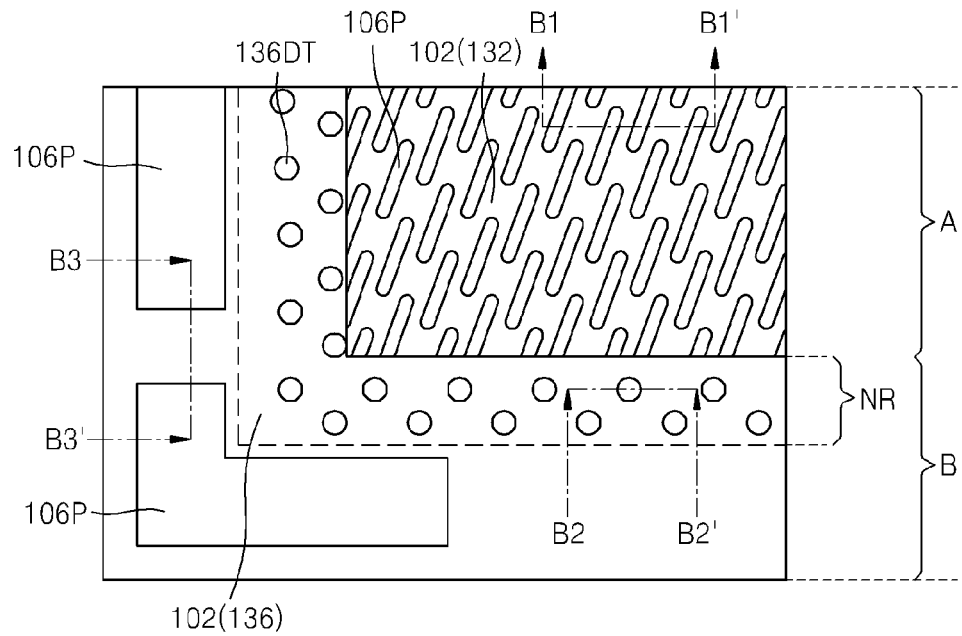
Figure 14B:
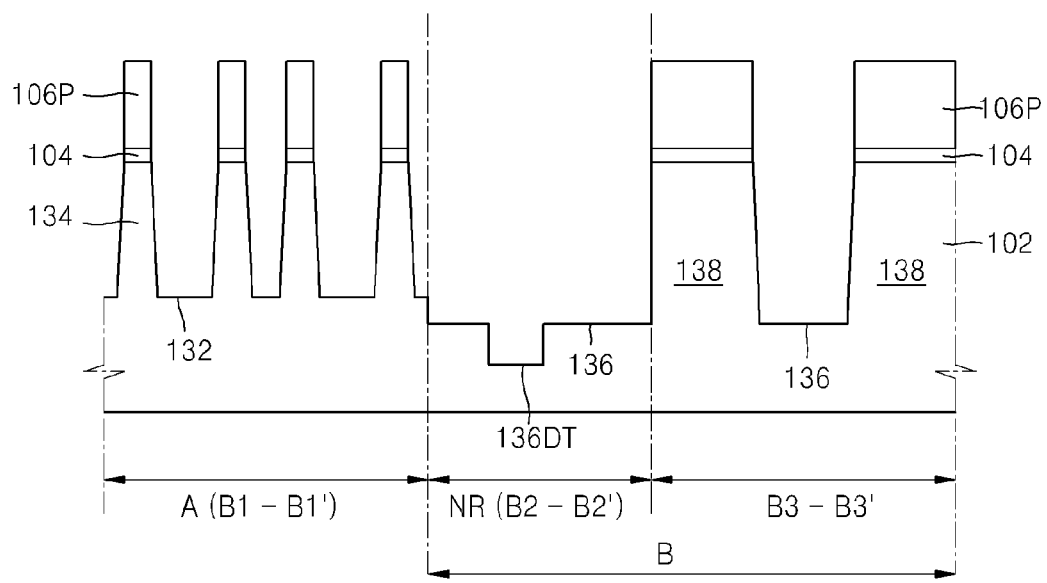

Referring to FIGS. 14A and 14B, a first trench 132 and a second trench 136 are respectively formed in the first region A and the second region B by etching the pad oxide film 104 and the substrate 102 by using the plurality of mask patterns 110AP and the wide width mask pattern 110BP (see FIGS. 13A and 13B) and the hard mask pattern 106P that is disposed under the plurality of mask patterns 110AP and the wide width mask pattern 110BP as an etching mask.

While the etching for forming the first trench 132 and the second trench 136 is performed, the plurality of mask patterns 110AP and the wide width mask pattern 110BP may be removed to expose the mask pattern 106. However, example embodiments are not limited thereto.

A plurality of first active regions 134 are defined by the first trench 132 in the first region A, and a plurality of second active regions 138 are defined by the second trench 136 in the second region B.

The recess portions 102R that are formed in the substrate 102 in the adjust region NR of the second region B are transferred downward in a thickness direction of the substrate 102 while the substrate 102 is etched in order to form the second trench 136, and thus deep trenches 136DT are formed in a bottom surface of the second trench 136 at positions vertically corresponding to the plurality of openings 120H formed in the first trimming pattern 120 (see FIGS. 7A and 7B) in the bottom surface of the second trench 136.

While the substrate 102 is etched in order to form the first trench 132 in the first region A, like in FIGS. 13A and 13B, a depth to which the substrate 102 is etched is reduced due to pattern loading effect and/or RIE lag, and thus the recess portions 102R of the substrate 102 in the first region A may not be transferred downward. Also, the first trench 132 that has a depth less than that of the second trench 136 may be formed in the first region A.

Figure 15A:
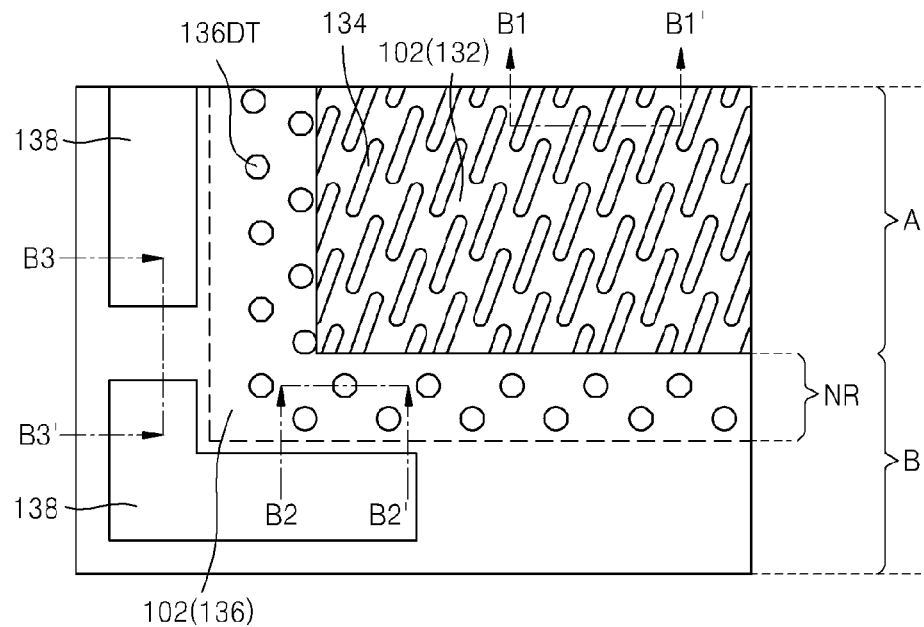
Figure 15B:
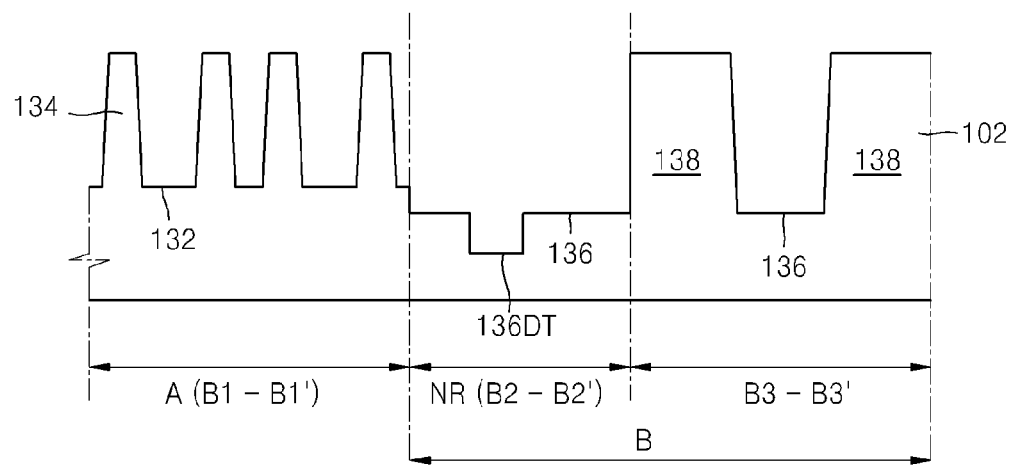

Referring to FIGS. 15A and 15B, top surfaces of the plurality of first active regions 134 and top surfaces of the plurality of second active regions 138 are exposed by removing the hard mask pattern 106P and the pad oxide film 104 (see FIGS. 14A and 14B) that remain on the substrate 102.

Figure 16A:
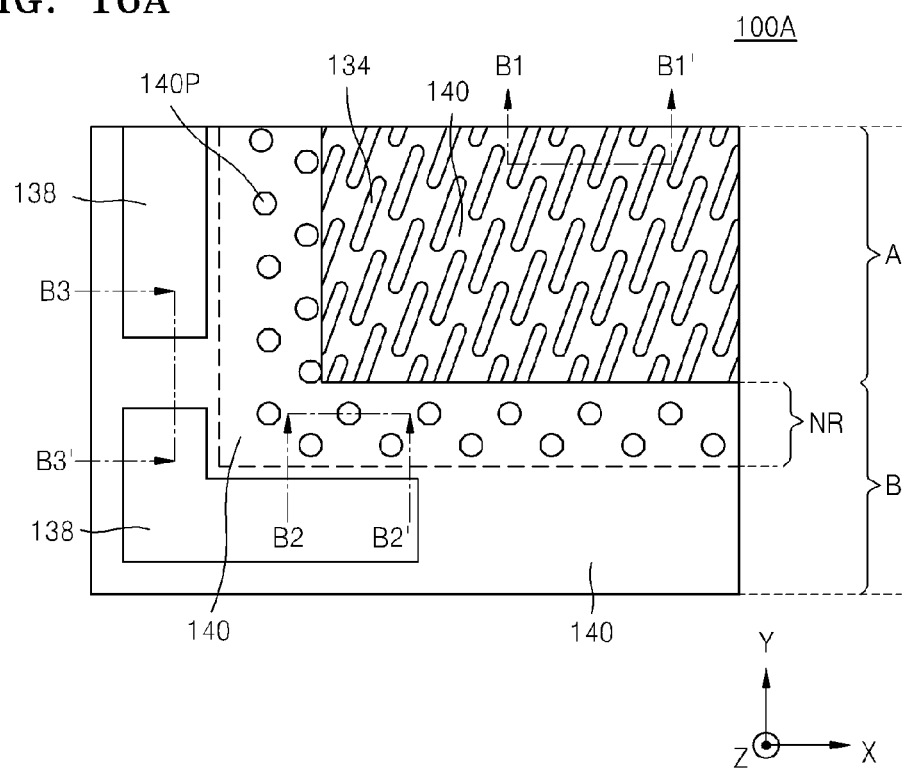
Figure 16B:
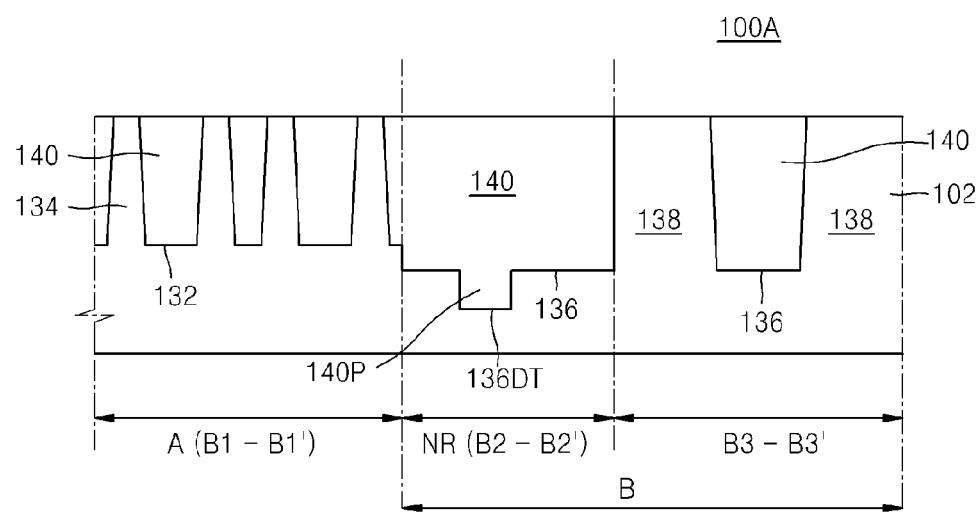

Referring to FIGS. 16A and 16B, a device isolation film 140 is formed by filling an insulating material in the first trench 132, the second trench 136, and the deep trenches 136DT.

A protrusion 140P that fills each of the deep trenches 136DT is formed on a bottom surface of the device isolation film 140.

As described with reference to FIGS. 4A through 16B, the mask lines 110A are formed in the first region A and the adjacent region NR to extend beyond the first region A, and the plurality of first active regions 134 are defined by performing a first trimming process on the mask lines 110A by using an etching mask including the plurality of openings 120H that are formed over the first region A and the adjacent region NR in the first trimming pattern 120 to correspond to the mask lines 110A. Since the first trimming process is performed, CD distribution of the plurality of active regions 134 at an edge portion of the first region A may be limited (and/or prevented) from being degraded.

A process of forming the device isolation film 140 of FIGS. 16A and 16B will be explained in detail with reference to FIGS. 17A through 17F.

Figure 17A:
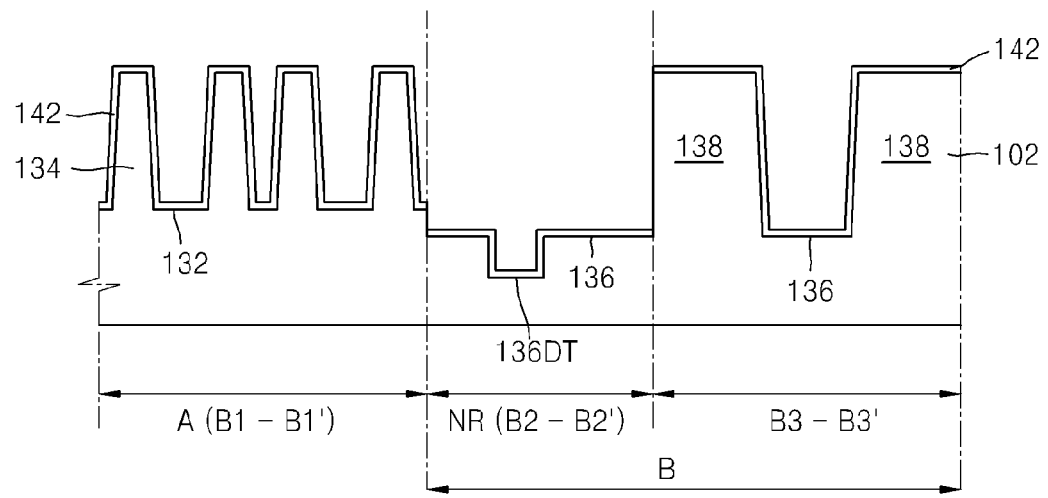
FIGS. 17A through 17F are cross-sectional views for explaining a process of forming a device isolation film of FIGS. 16A and 16B.

Referring to FIG. 17A, a polysilicon thin film 142 is formed on an exposed surface of the substrate 102 in the first region A and the second region B of a resultant structure of FIGS. 15A and 15B.

The polysilicon thin film 142 is formed in order to improve switching characteristics of a cell transistor by reducing the amount of consumption of the plurality of active regions 134 during subsequent oxidation and securing a sufficient area for the plurality of first active regions 134. In an example embodiment, the polysilicon thin film 142 may be formed to cover to a uniform thickness an inner wall of the first trench 132, an inner wall of the second trench 136, an inner wall of each of the deep trenches 136DT, top surfaces of the plurality of first active regions 134, and top surfaces of the plurality of second active regions 138. For example, the polysilicon thin film 142 may be formed to have a thickness ranging from about 10 Å to about 30 Å.

In an example embodiment, a process of forming the polysilicon thin film 142 of FIG. 17A may be omitted.

Figure 17B:
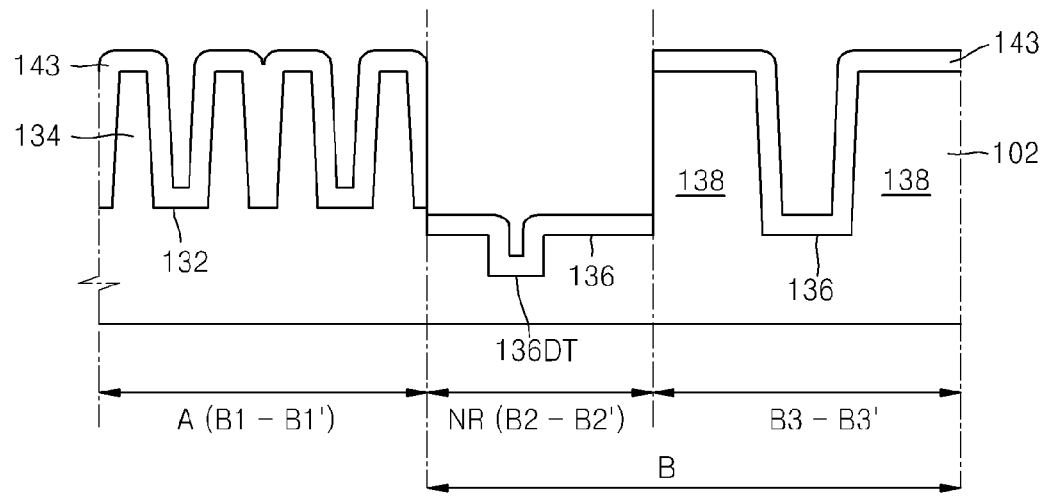

Referring to FIG. 17B, a first insulating film 143 is formed on the substrate 102 in the first region A and the second region B.

In an example embodiment, the first insulating film 143 may be obtained by oxidizing the polysilicon thin film 142.

A thickness TH1 of the first insulating film 143 may be equal to or greater than ½ of a shortest distance between the plurality of first active regions 134 in the first region A. Accordingly, in the first region A, a portion of the first trench 132 having a small width is filled with the first insulating film 143 whereas a portion of the first trench 132 having a relatively large width may not be completely filled with the first insulating film 143. In the second region B, the first insulating film 143 may not completely fill the second trench 136 and may conformally cover the inner wall of the second trench 136. In an example embodiment, a seam may exist in the first insulating film 143 at a portion of the first trench 132 having a relatively small width. Also, a void (not shown) that is formed due to the seam may exist in the first insulating film 143 at the portion of the first trench 132 having the relatively small width.

In an example embodiment, the first insulating film 143 may be a silicon oxide film. The first insulating film 143 may be formed by using at least one selected from atomic layer deposition (ALD), chemical vapor deposition (CVD), radical oxidation, and natural oxidation.

In an example embodiment, while the first insulating film 143 is formed, at least a part of the polysilicon thin film 142 may be oxidized, and a resultant structure after the oxidation may constitute a part of the first insulating film 143. In FIG. 17B, all parts of the polysilicon thin film 142 are oxidized, a resultant structure after the oxidation constitutes the first insulating film 143, and no polysilicon thin film 142 remains between the substrate 102 and the first insulating film 143.

When a process of forming the polysilicon thin film 142 of FIG. 17A is omitted, the first insulating film 143 may be formed by using ALD.

Figure 17C:
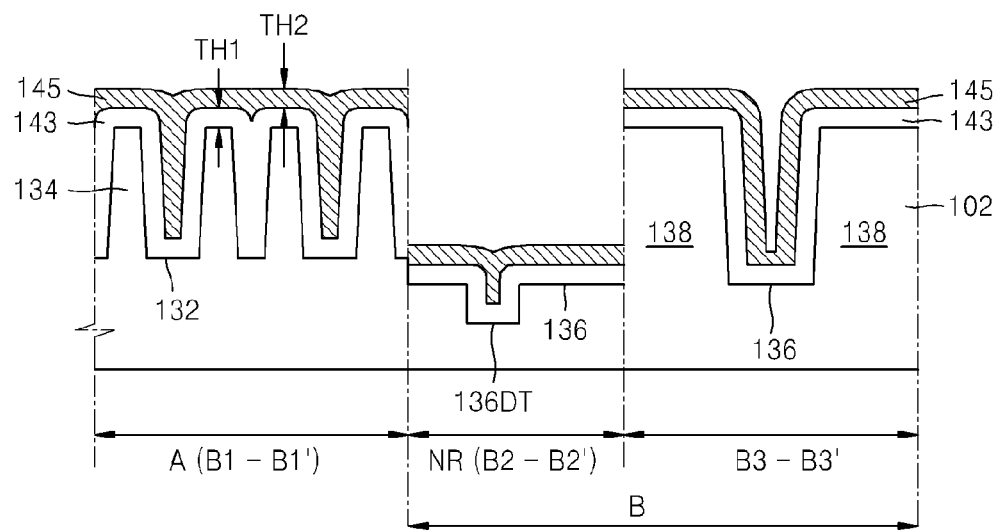

Referring to FIG. 17C, a second insulating film 145 is formed on the first insulating film 143 in the first region A and the second region B.

In an example embodiment, a thickness TH2 of the second insulating film 145 may be greater than the thickness TH1 of the first insulating film 143 (TH1<TH2). However, example embodiments are not limited thereto.

A space of the first trench 132 in the first region A which remains without being filled with the first insulating film 143 is filled with the second insulating film 145. The second insulating film 145 is formed in the second trench 136 in the second region B to conformally cover the first insulating film 143, and a space of the second trench 136 remains on the second insulating film 145.

In an example embodiment, the second insulating film 145 is a nitride film. For example, the second insulating film 145 may be a silicon nitride film. The second insulating film 145 may be formed by using ALD or CVD.

In an example embodiment, a seam (not shown) may exist in the second insulating film 145 in the first trench 132. Also, a void (not shown) that is formed due to the seam may exist in the second insulating film 145 in the first trench 132.

Figure 17D:
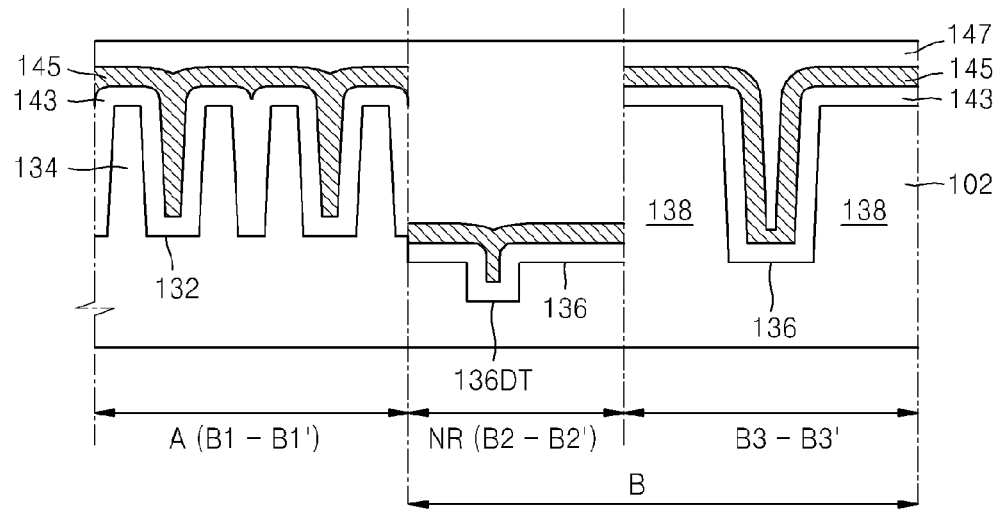

Referring to FIG. 17D, a third insulating film 147 is formed on the second insulating film 145 in the first region A and the second region B.

The third insulating film 147 may be formed to have a thickness great enough to fill the remaining space of the second trench 136 in the second region B.

In an example embodiment, the third insulating film 147 is an oxide film. For example, the third insulating film 147 is formed of at least one material selected from tonen silazene (TOSZ), high density plasma (HDP) oxide, flowable oxide (FOX), spin on glass (SOG), undoped silica glass (USG), tetraethyl orthosilicate (TEOS), and low temperature oxide (LTO).

Figure 17E:
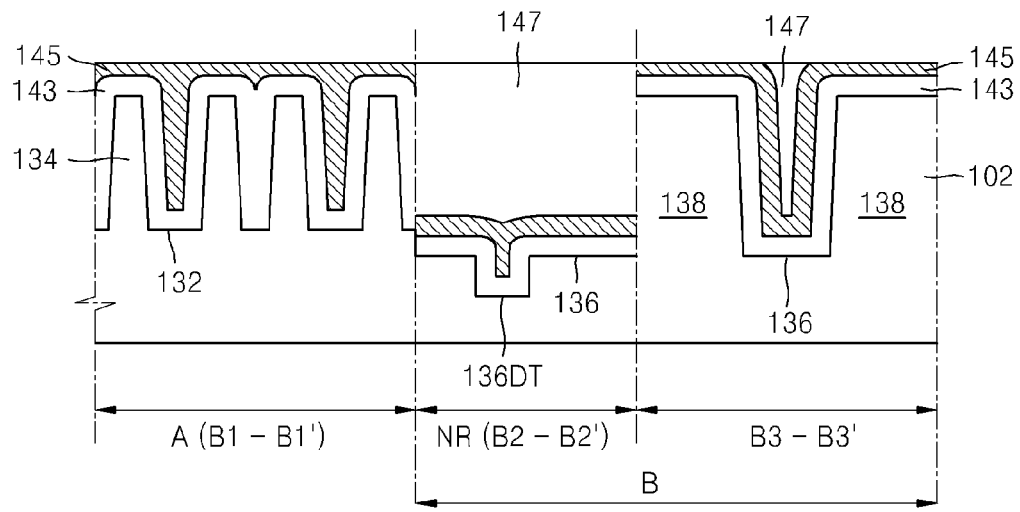

Referring to FIG. 17E, the third insulating film 147 is planarized by using the second insulating film 145 as an etching stop film.

In an example embodiment, chemical mechanical polishing (CMP) may be used in order to planarize the third insulating film 147. After the CMP performed on the third insulating film 147, only a portion of the third insulating film 147 in the second trench 136 in the second region B may remain, and a portion of the third insulating film 147 in the first region A may be completely removed. The second insulating film 145 may be partially removed from a top surface of the second insulating film 145 while the third insulating film 147 is planarized.

Figure 17F:
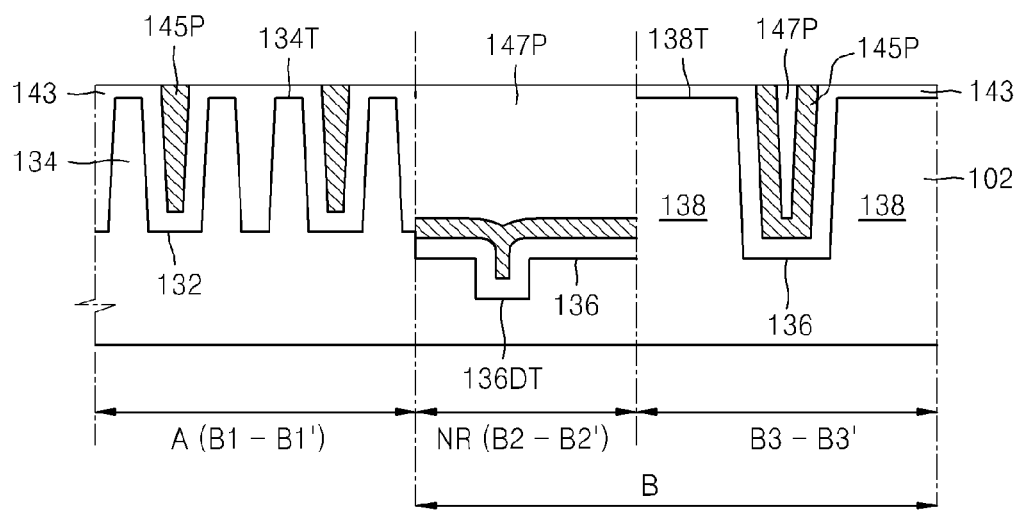

Referring to FIG. 17F, a third insulating pattern 147P is formed by removing the third insulating film 147 that is exposed in the second region B by a desired (and/or alternatively predetermined) thickness from a top surface of the third insulating film 147, a second insulating pattern 145P is formed by removing the second insulating film 145 that is exposed in the first region and the second region B by a desired (and/or alternatively predetermined) thickness from a top surface of the second insulating film 145, and a top surface of the first insulating film 143 is exposed in the first region A and the second region B.

In an example embodiment, a stripping process using phosphoric acid ($H_3PO_4$) may be performed in order to remove the third insulating film 147 by a desired (and/or alternatively predetermined) thickness from a top surface of the third insulating film 147. Also, a stripping process using hydrofluoric acid (HF) may be used in order to remove the second insulating film 145 by a desired (and/or alternatively predetermined) thickness from a top surface of the second insulating film 145.

Top surfaces 134T of the plurality of first active regions 134 in the first region A and top surfaces 138T of the plurality of second active regions 138 in the second region B are covered by the first insulating film 143. The first insulating film 143 remaining in the first region A and the second region B may function as a sacrificial film for protecting a surface of the substrate 102 during a subsequent ion implantation process for implanting impurity ions into the substrate 102 or during a subsequent etching process. Accordingly, a process of forming a separate sacrificial film during the subsequent ion implantation process or the subsequent etching process may be omitted.

A plurality of ion implantation regions (not shown) such as channel ion implantation regions (not shown) or a plurality of source/drain regions (not shown) may be formed in the plurality of first active regions 134 in the first region A and the plurality of second active regions 134 in the second region B by performing at least one time an ion implantation process for implanting impurity ions into the substrate 102 in a state where the first insulating film 143 covers a top surface of the substrate 102 in the first region A and the second region B.

The device isolation film 140 of FIGS. 16A and 16B may be obtained from the first insulating film 143, the second insulating film pattern 145P, and the third insulating film pattern 147P in the first region A and the second region B after subsequent desired (and/or alternatively predetermined) processes.

FIGS. 18A through 18J are cross-sectional views according to a process order, for explaining a method of manufacturing a semiconductor device 100B (see FIG. 18J), according to an example embodiment of inventive concepts. The semiconductor device 100B may have a structure similar to that of the semiconductor device 10B of FIGS. 3A and 3B.

FIGS. 18A through 18J are cross-sectional views taken along lines B1-B1', B2-B2', and B3-B3' of FIG. 3A. In FIGS. 18A through 18J, the same elements as those in FIGS. 1 through 16B are denoted by the same reference numerals, and a detailed explanation thereof will not be given.

Figure 18A:
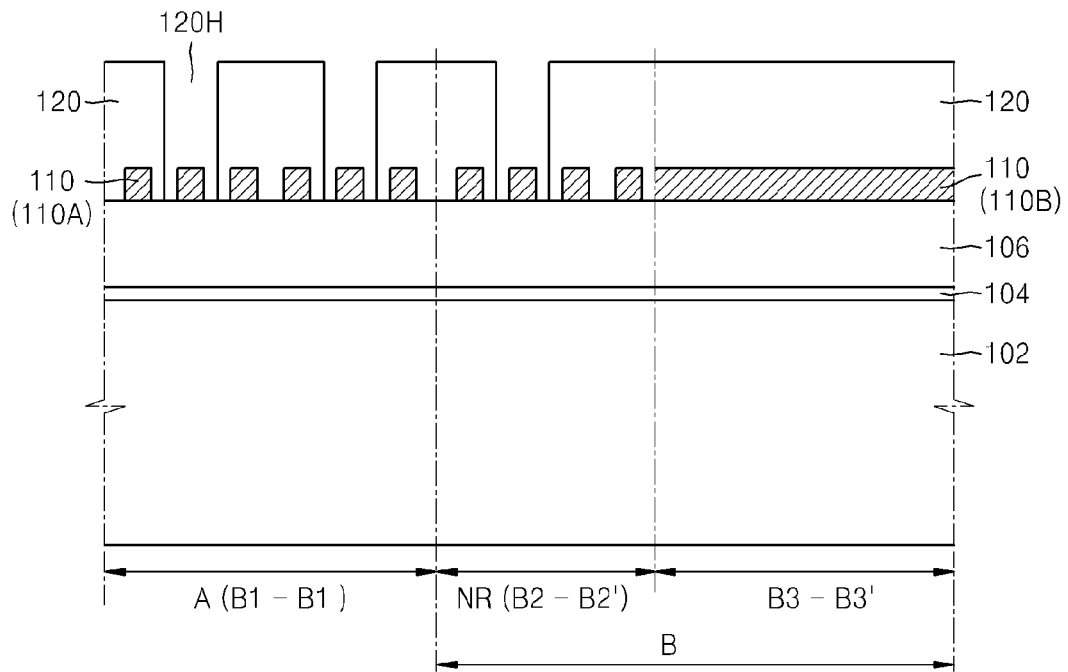
FIGS. 18A through 18J are cross-sectional views according to a process order, for explaining a method of manufacturing a semiconductor device, according to an example embodiment of inventive concepts.

Referring to FIG. 18A, in the same method as that described with reference to FIGS. 4A through 7B, the pad oxide film 104 and the hard mask layer 106 are formed on the substrate 102 in the first region A and the second region B, the mask layer 110 including the plurality of mask lines 110A and the wide width mask layer 110B is formed on the hard mask layer 104, and the first trimming pattern 120 is formed on the mask layer 110.

Figure 18B:
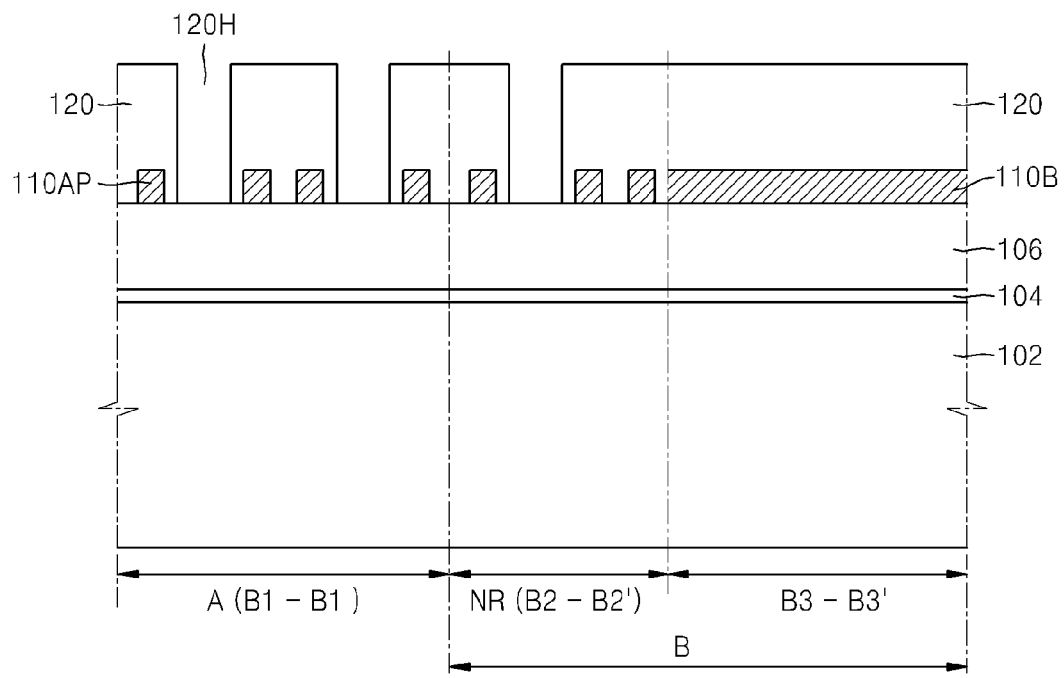

Referring to FIG. 18B, in a manner similar to that described with reference to FIGS. 8A and 8B, a first trimming process that removes portions of the plurality of mask lines 110A exposed through the plurality of openings 120H is performed by using the first trimming pattern 120 as an etching mask.

The plurality of mask lines 110A (see FIG. 18A) are divided into the plurality of mask patterns 110AP during the first trimming process.

However, the first trimming process is performed in an etching atmosphere in which portions of the hard mask layer 106 which are exposed through the plurality of openings 120H around the plurality of mask patterns 110AP are limited and/or suppressed from being removed. That is, the hard mask layer 106 may be limited and/or suppressed from being etched by controlling an etching atmosphere during the first trimming process such that an etch selectivity between the mask layer 110 and the hard mask layer 106 is relatively high. As a result, recess portions may not be formed in a top surface of the hard mask layer 106 or may be formed to have depths small enough not to affect a subsequent process.

Figure 18C:
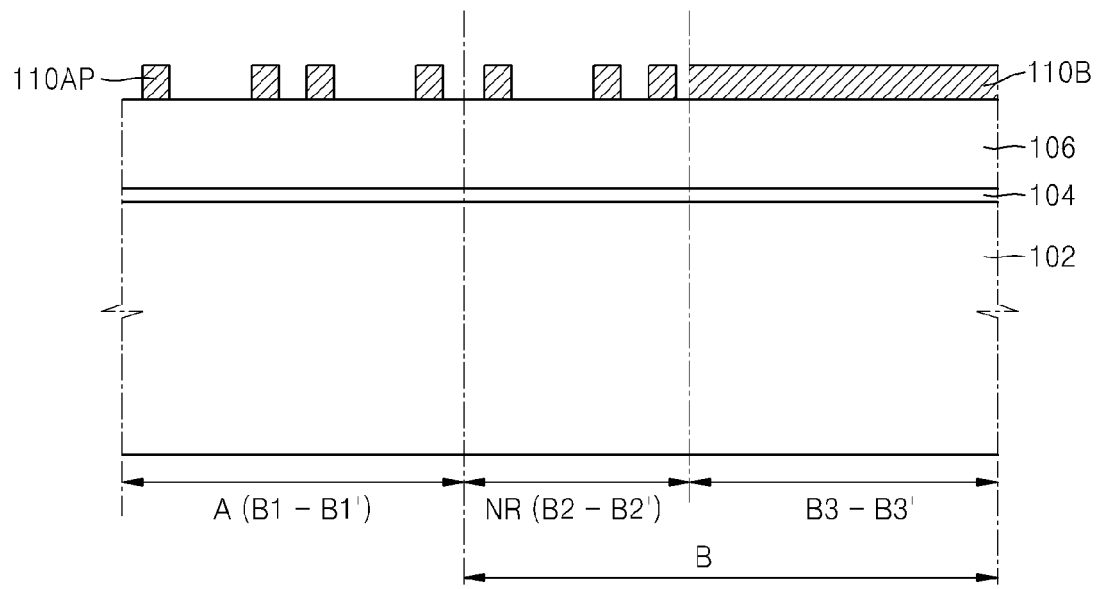

Referring to FIG. 18C, the plurality of mask patterns 110AP that extend over the first region A and the second region B, and the wide width mask layer 110B that is in the second region B are exposed by removing the first trimming pattern 120 (see FIG. 18B).

Figure 18D:
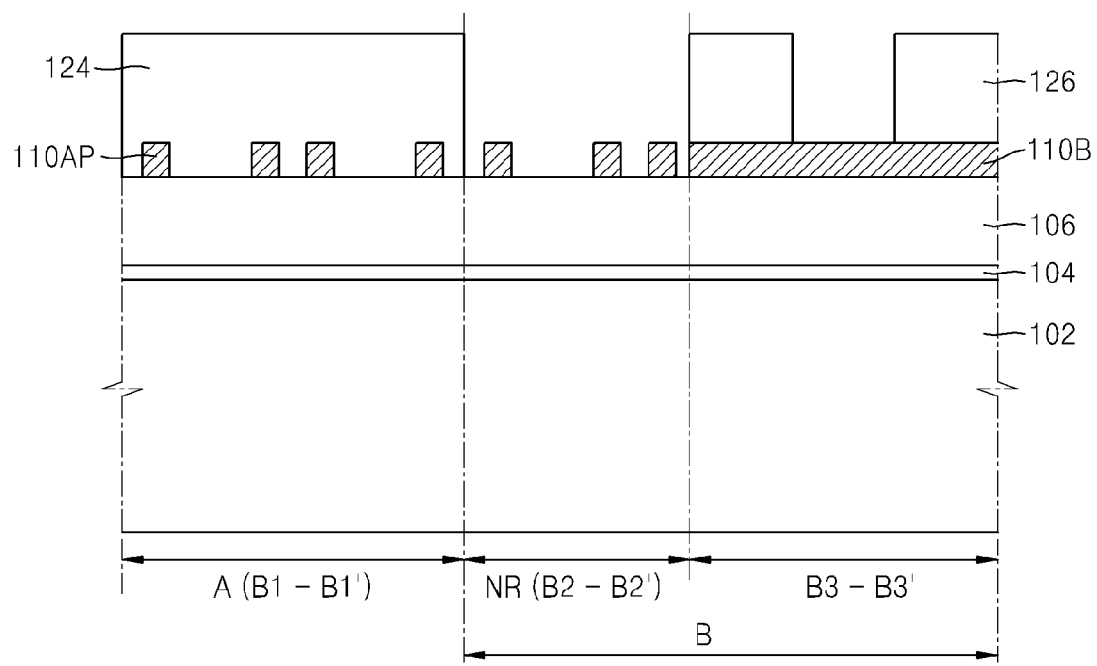

Referring to FIG. 18D, in the same method as that described with reference to FIGS. 10A and 10B, the second trimming pattern 124 is formed on the plurality of mask patterns 110AP in the first region A, and the peripheral mask pattern 126 that defines an active region of the second region B is formed on the wide width mask layer 110B in the second region B.

Figure 18E:
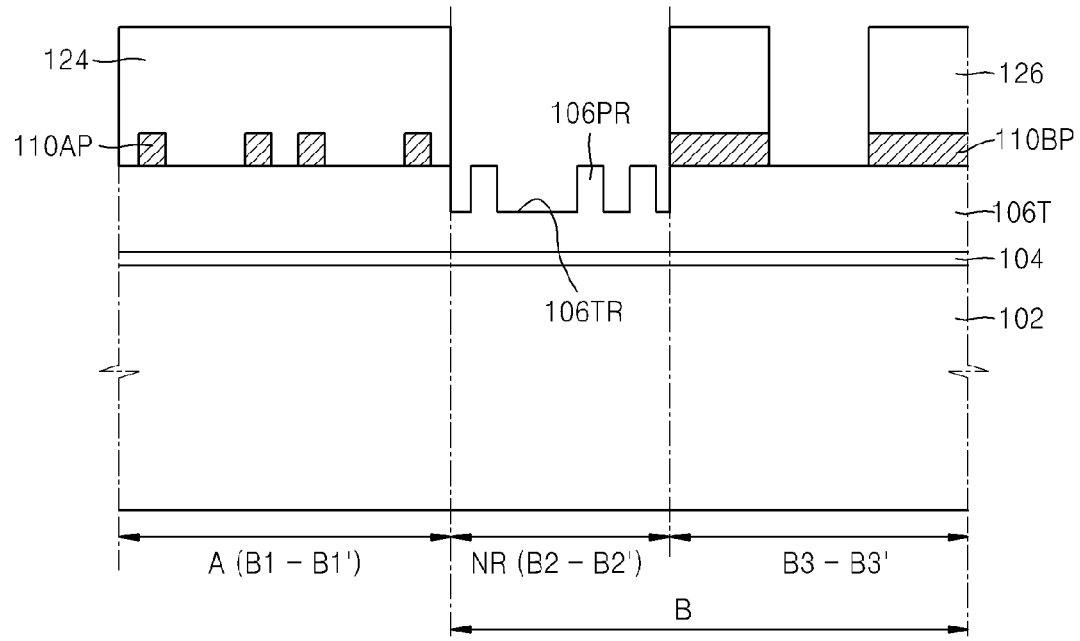

Referring to FIG. 18E, in a method similar to that described with reference to FIGS. 11A and 11B, a second trimming process that etches and removes exposed portions of the plurality of mask patterns 110AP by using the second trimming pattern 124 as an etching mask is performed.

While portions of the plurality of mask patterns 110AP which are exposed to the outside in the adjacent region NR are removed during the etching for the second trimming process, the hard mask layer 106 that is exposed to the etching atmosphere along with the plurality of mask patterns 110AP around the exposed portions of the plurality of mask patterns 110AP may be partially removed. As a result, a hard mask pattern 106T in which a recess portion TR having a low surface is formed in a portion other than portions covered by the plurality of mask patterns 110AP is formed in the adjacent region NR. The recess portion 106TR may constitute an integrated recess portion that surrounds and integrally connects a plurality of protruding portions 106PR corresponding to portions of the hard mask pattern 106T covered by the plurality of mask patterns 110AP. The hard mask pattern 106T is formed such that portions covered by the plurality of mask patterns 110AP and other portions have different thicknesses.

In order to form the hard mask pattern 106T including the recess portion 106TR, an etching atmosphere in which an etch selectivity between the mask patterns 110AP and the hard mask layer 106 is relatively small may be formed by controlling an etching atmosphere during the second trimming process.

While the second trimming process is performed, a wide width mask pattern 110BP that defines an active region of the substrate 102 in the second region B is formed by etching and removing an exposed portion of the wide width mask layer 110B by using the peripheral mask pattern 126 as an etching mask in the second region B.

Figure 18F:
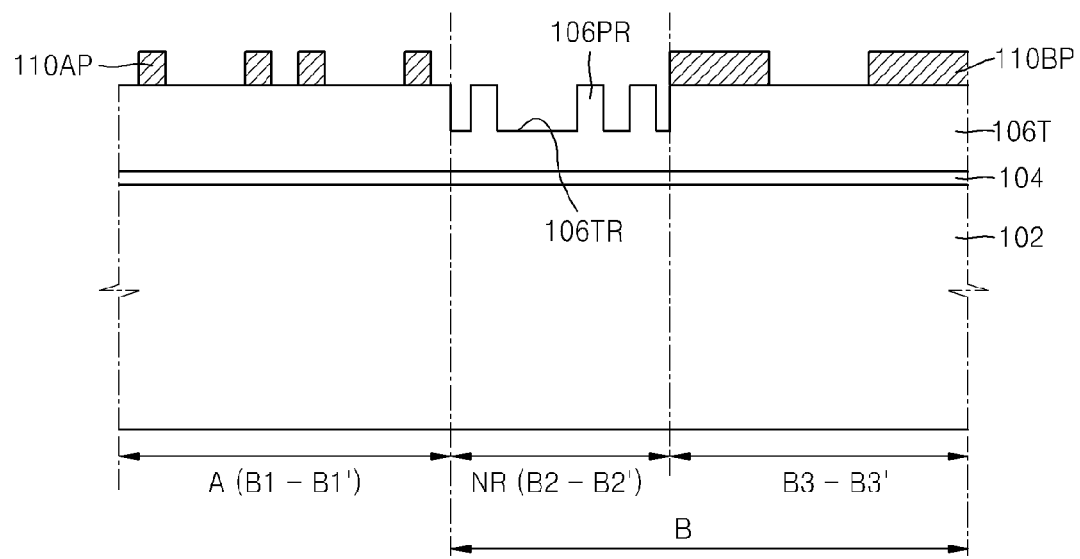

Referring to FIG. 18F, in the same method as that described with reference to FIGS. 12A and 12B, the plurality of mask patterns 110AP that remain in the first region A and the wide width mask pattern 110BP that remains in the second region B are exposed by removing the second trimming pattern 124 and the peripheral mask pattern 126.

Figure 18G:
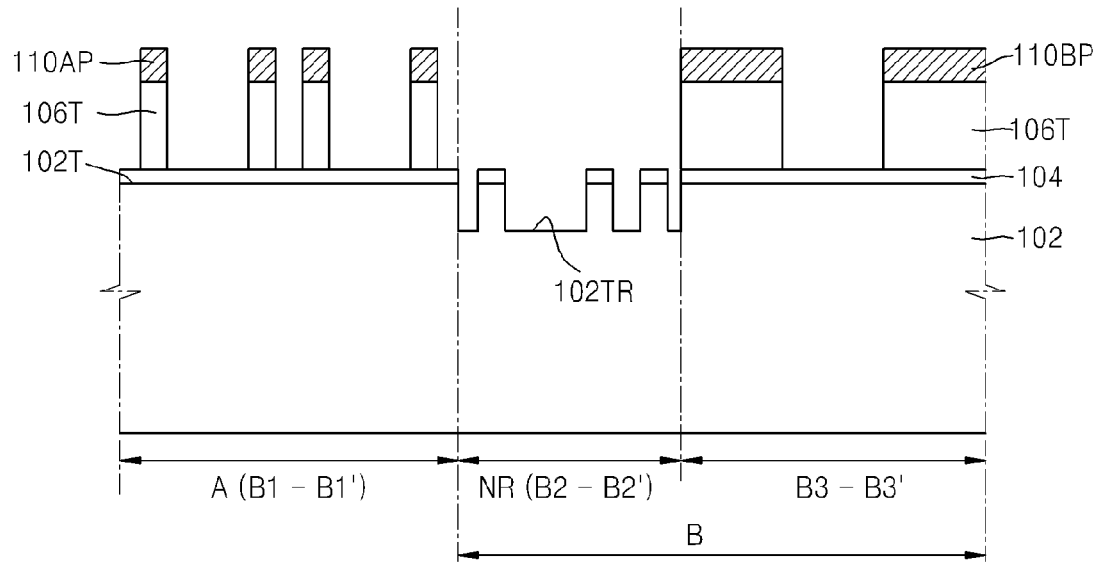

Referring to FIG. 18G, in the same method as that described with reference to FIGS. 13A and 13B, exposed portions of the hard mask pattern 106T that correspond to portions that are to be active regions in the first region A and the second region B are removed by being etched by using the plurality of mask patterns 110AP and the wide width mask pattern 110BP as an etching mask.

While the exposed portions of the hard mask pattern 106T are etched, the pad oxide film 104 and the substrate 102 may be partially removed at positions vertically corresponding to the recess portion 106TR that is formed in a top surface of the hard mask pattern 106T, to form a recess portion 102TR that has a level lower than that of the top surface 102T of the substrate 102.

Figure 18H:
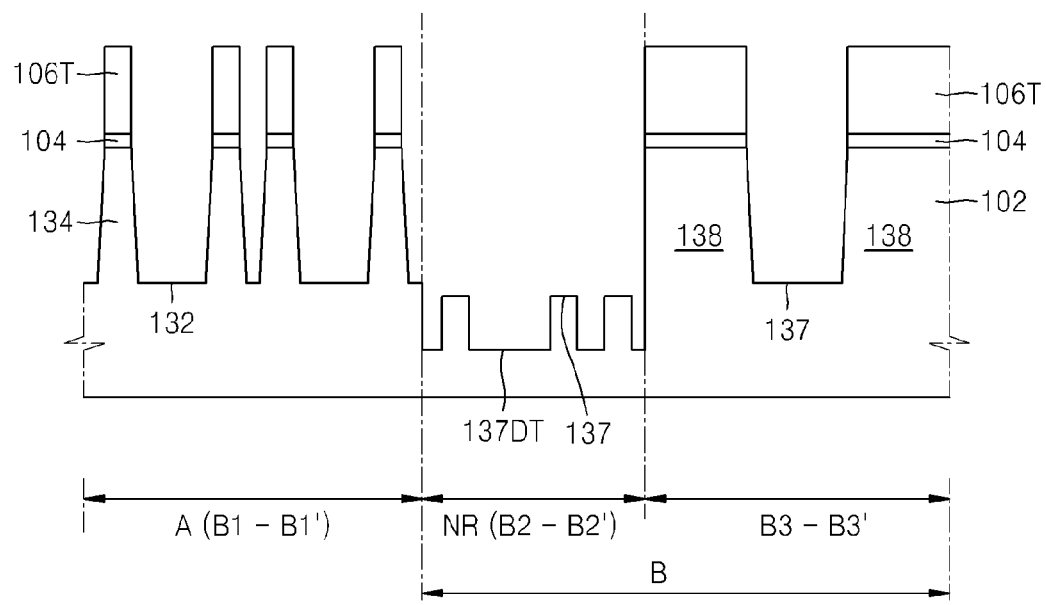

Referring to FIG. 18H, in the same method as that described with reference to FIGS. 14A and 14B, the first trench 132 and the second trench 137 are respectively formed in the first region A and the second region B by etching the pad oxide film 104 and the substrate 102 by using the plurality of mask patterns 110AP and the wide width mask pattern 110BP and the hard mask pattern 106T that is disposed under the plurality of mask patterns 110AP and the wide width mask pattern 110BP as an etching mask.

While the etching for forming the first trench 132 and the second trench 137 is performed, the plurality of mask patterns 110AP and the wide width mask pattern 110BP may be removed to expose the hard mask pattern 106T. However, example embodiments are not limited thereto.

The plurality of first active regions 134 are defined by the first trench 132 in the first region A, and the plurality of second active regions 138 are defined by the second trench 137 in the second region B.

The recess portions 102R formed in the substrate 102 are transferred downward while the substrate 102 is etched in order to form the second trench 137 in the adjacent region NR of the second region B, and thus a deep trench 137DT that is recessed to have a level lower than those of other points of a bottom surface of the second trench 137 is formed at a position vertically corresponding to a position of the recess portion 102TR of the substrate 102 in the bottom surface of the second trench 137.

Figure 18I:
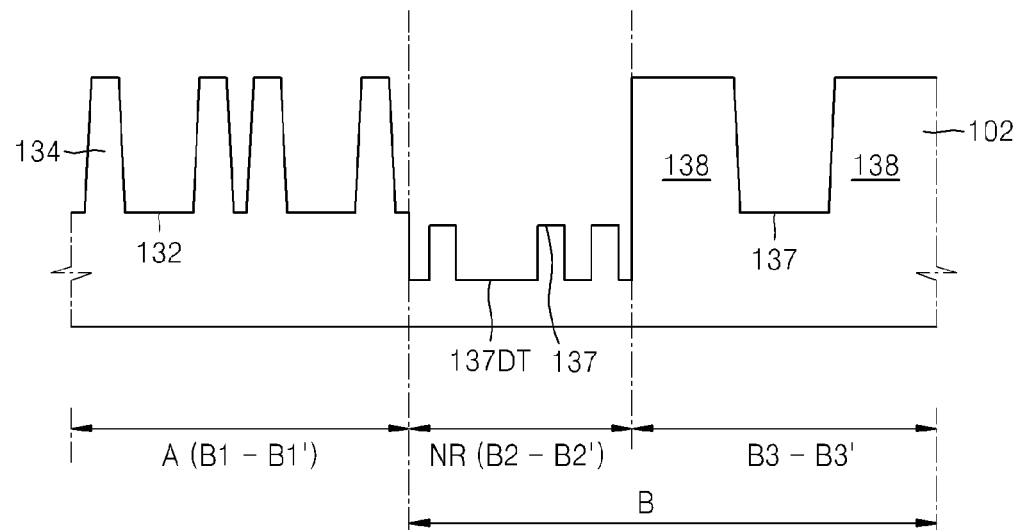

Referring to FIG. 18I, in the same method as that described with reference to FIGS. 15A and 15B, top surfaces of the plurality of first active regions 134 and top surfaces of the plurality of second active regions 138 are exposed by removing the hard mask pattern 106T and the pad oxide film 104 remaining on the substrate 102.

Figure 18J:
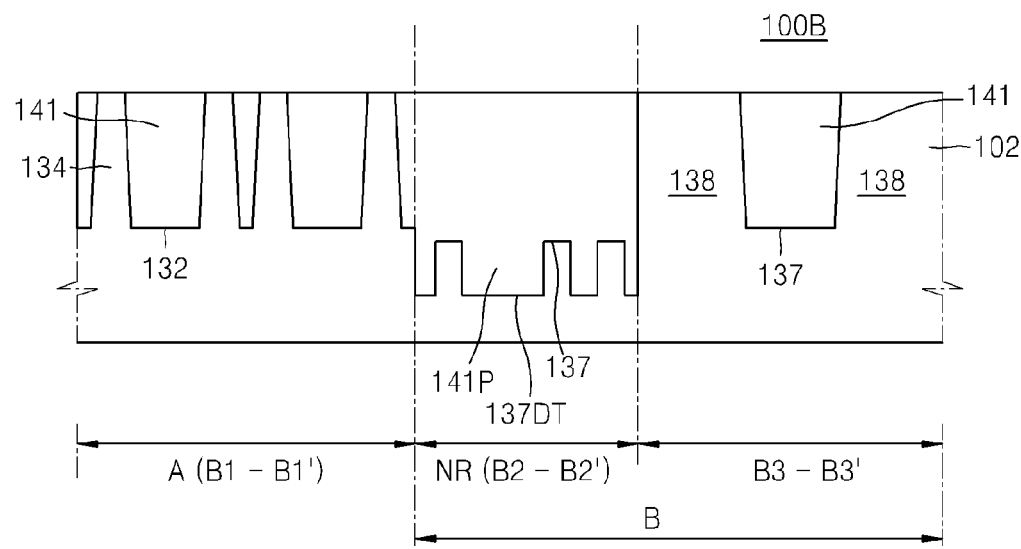

Referring to FIG. 18J, in the same method as that described with reference to FIGS. 16A and 16B, a device isolation film 141 is formed by filling an insulating material in the first trench 132, the second trench 137, and the deep trench 137DT.

A protrusion 141P that fills the deep trench 137DT is formed on a bottom surface of the device isolation film 141.

In an example embodiment, in order to form the device isolation film 141, the same process as a process of forming the first insulating film 143, the second insulating film pattern 145P, and the third insulating film pattern 147P described with reference to FIGS. 17A through 17F may be performed.

FIGS. 19A through 19I are cross-sectional views according to a process order, for explaining a method of manufacturing a semiconductor device, according to an example embodiment of inventive concepts. In particular, a process of FIGS. 19A through 19I may be used in order to form the mask layer 110 of FIGS. 6A and 6B.

FIGS. 19A through 19I are cross-sectional views taken along lines B1-B1', B2-B2', and B3-B3' of FIG. 2A. In FIGS. 19A through 19I, the same elements as those of FIGS. 1 through 16B are denoted by the same reference numerals, and a detailed explanation thereof will not be given.

Figure 19A:
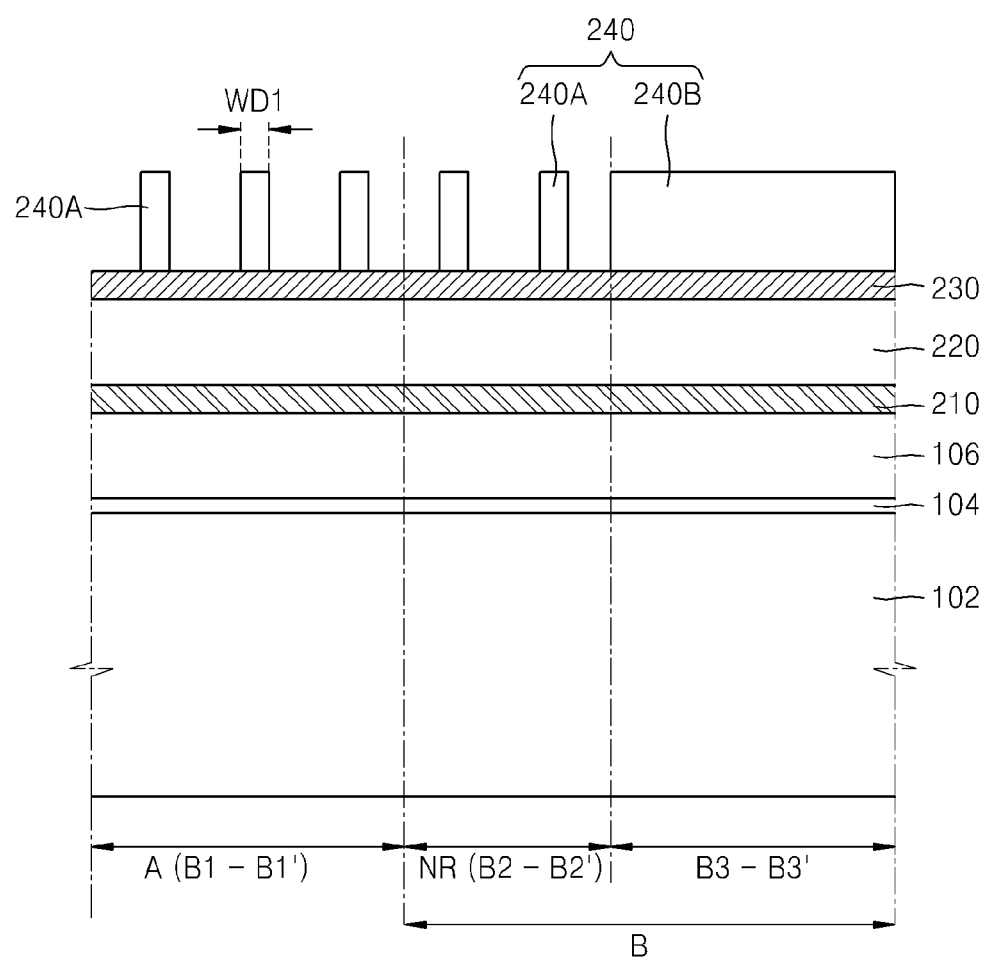
FIGS. 19A through 19I are cross-sectional views according to a process order, for explaining a method of manufacturing a semiconductor device, according to an example embodiment of inventive concepts.

Referring to FIG. 19A, in the same method as that described with reference to FIGS. 4A through 5B, the pad oxide film 104 and the hard mask layer 106 are formed on the substrate 102 in the first region A and the second region B.

Next, a buffer mask layer 210, a dual mask layer 220, and a variable mask layer 230 are sequentially formed on the hard mask layer 104, and a mask pattern 240 is formed on the variable mask layer 230.

The mask pattern 240 includes active regions to be finally formed in the first region A and the adjacent region NR of the second region B, for example, first mask portions 240A each having a small width WD 1 corresponding to a short axis width Sx of each of the first active regions 14 of FIG. 2A and a second mask portion 240B having a relatively large width in a portion of the second region B other than the adjacent region NR. The first mask portions 240A and the second mask portion 240B may be simultaneously formed by performing one time photolithography using one photo mask.

The buffer mask layer 210 may be formed of a material that has an etch selectivity different from that of the hard mask layer 106 under a desired (and/or alternatively predetermined) etching condition. In an example embodiment, the buffer mask layer 210 may be formed of polysilicon.

Portions of the dual mask layer 220 formed in the first region A and the adjacent region NR of the second region B may be used as a sacrificial film for forming a plurality of etching mask patterns whose pattern density is doubled in the first region A. A portion of the dual mask layer 220 that is formed in a portion of the second region B other than the adjacent region NR may form a part of an etching mask necessary to form a desired pattern in the second region B.

In an example embodiment, the dual mask layer 220 may be formed of a carbon-containing film such as an SOH or an ACL. Alternatively, the dual mask layer 220 may be formed of any one material selected from silicon-containing materials such as $SiO_2$, $Si_3N_4$, SiCN, and polysilicon.

The variable mask layer 230 is formed to act as an etching mask that is variable relative to the dual mask layer 220 according to widths of the first mask portions 240A and the second mask portion 240B of the mask pattern 240 that is formed on the variable mask layer 230. The variable mask layer 230 may be formed to have the same thickness in the first region A and the second region B, but example embodiments are not limited thereto.

The variable mask layer 230 may be formed of a material that has an etch selectivity different from that of the dual mask layer 220 in order to be used as an etching mask for the dual mask layer 220. For example, the variable mask layer 230 may be formed of any one material selected from silicon-containing materials SiON, $SiO_2$, $Si_3N_4$, SiCN, and polysilicon. Alternatively, the variable mask layer 230 may be formed of a metal or an organic material.

The mask pattern 240 may have a structure in which an anti-reflection film and a photoresist film formed of an organic material or an inorganic material are stacked, but example embodiments are not limited thereto.

In the mask pattern 240, a width WD1 of each of the first mask portions 240A formed in the first region A and the adjacent region NR may correspond to a minimum feature size of the semiconductor device to be formed, and the second mask portion 240B that is formed in a portion of the second region B other than the adjacent region NR may have a width greater than the minimum feature size. For example, the width WD1 of each of the first mask portions 240A may range from several nanometers (nm) to tens of nanometers (nm).

Figure 19B:
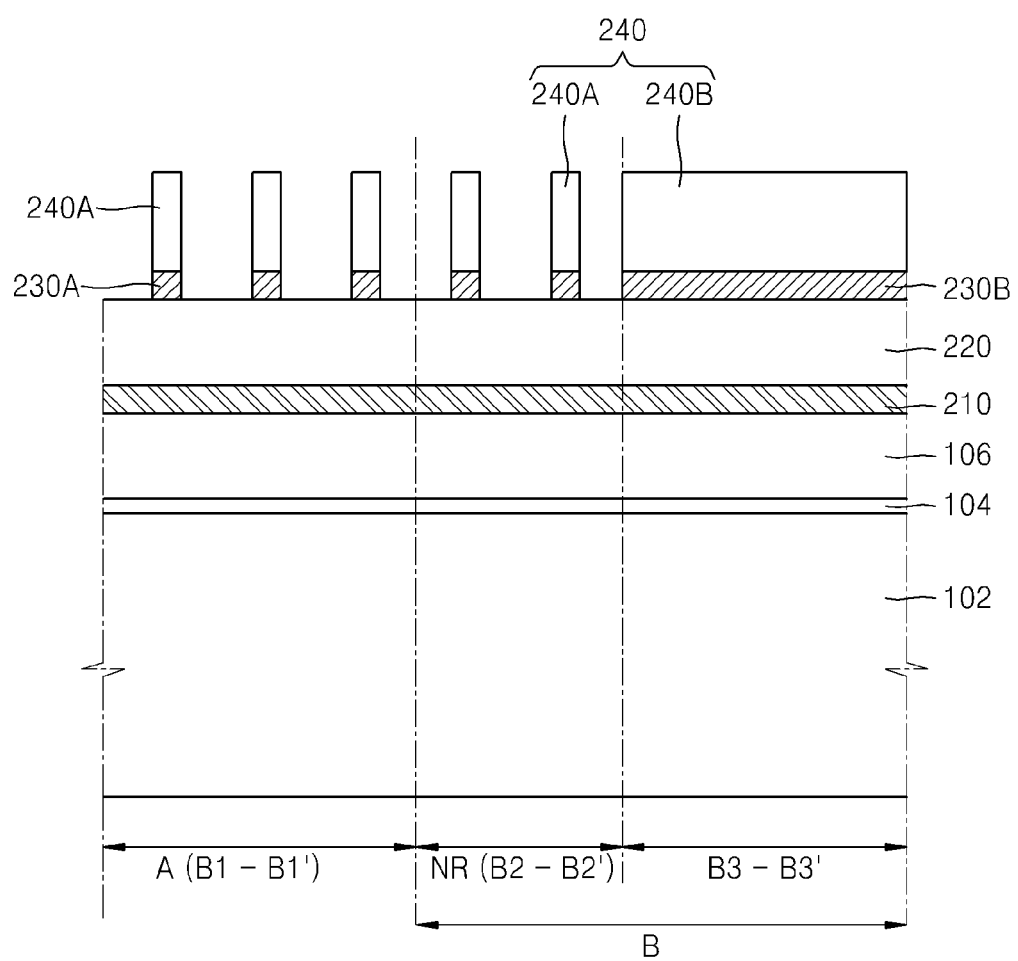

Referring to FIG. 19B, a first variable mask pattern 230A is formed in the first region A and the adjacent region NR by etching the variable mask layer 230 by using the mask pattern 240 as an etching mask in the first region A and the second region B, and a second variable mask pattern 230B is formed in a portion of the second region B other than the adjacent region NR. As a result, a width of the mask pattern 240 is transferred to the variable mask layer 230.

While the variable mask layer 230 is etched in order to form the first variable mask pattern 230A and the second variable mask pattern 230B, a thickness of the mask pattern 240 may be reduced.

Figure 19C:
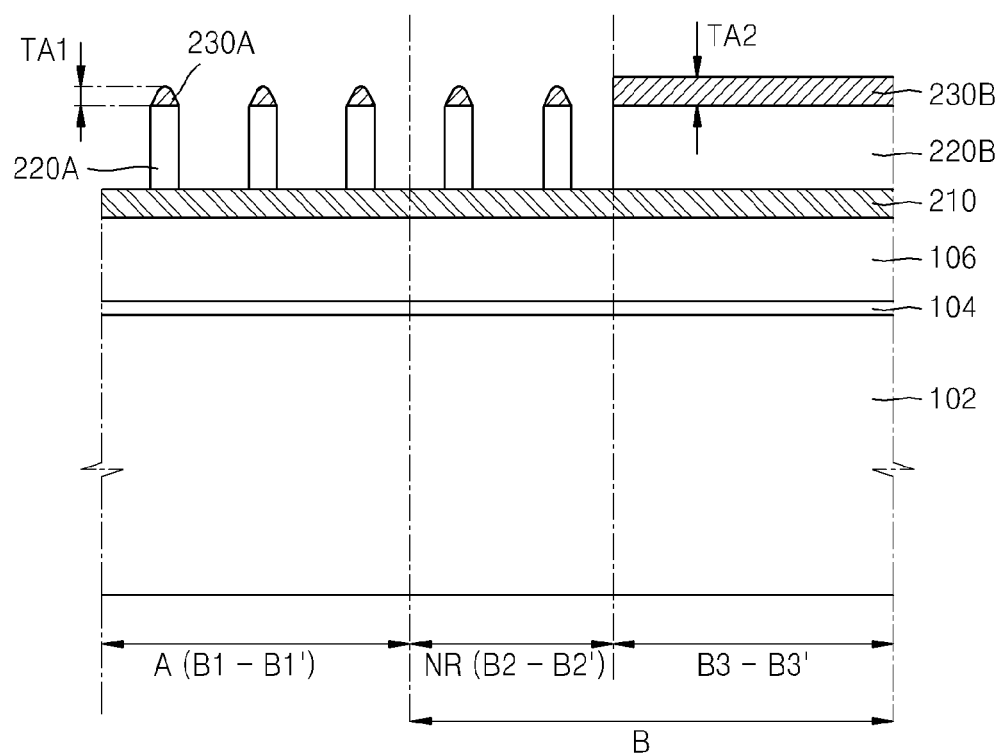

Referring to FIG. 19C, a first mask pattern 220A having a width corresponding to the small width WD1 of each of the first mask portions 240A is formed in the first region A and the adjacent region NR, and a second mask pattern 220B corresponding to a width of the second mask portion 240B is formed in a portion of the second region B other than the adjacent region NR, by etching the dual mask layer 220 until the buffer mask layer 210 is exposed by using the mask pattern 240, the first variable mask pattern 230A, and the second variable mask pattern 230B as an etching mask in the first region A and the second region B.

While the dual mask layer 220 is etched, the mask pattern 240 may be removed. Although not shown in FIG. 19C, after the dual mask layer 220 is etched, a part of the second mask portion 240B may remain on the second variable mask pattern 230B in a portion of the second region B other than the adjacent region NR.

The first variable mask pattern 230A that is in the first region A and the adjacent region NR and the second variable mask pattern 230B that is in a portion of the second region B other than the adjacent region NR are affected by an etching atmosphere in various directions while the dual mask layer 220 is etched. In this case, since a width of the first variable mask pattern 230A is less than a width of the second variable mask pattern 230B, the amount of removal is increased due to three-dimensional (3D) etching effect, and since the second variable mask pattern 230B has a relatively large width, the amount of removal of the second variable mask pattern 230B is less than that of the first variable mask pattern 230A. Accordingly, assuming that the variable mask layer 230 having the same thickness in the first region A and the second region B is formed, after the first mask pattern 220A and the second mask pattern 220B are formed, a thickness TA1 of the first variable mask pattern 230A remaining on the first mask pattern 220A may be less than a thickness TA2 of the second variable mask pattern 230B remaining on the second mask pattern 220B.

In an example embodiment, dry etching may be used in order to etch the dual mask layer 220. For example, when the dual mask layer 220 is formed of an SOH, plasma etching using a gas mixture containing oxygen (O2) and argon (Ar) may be performed in order to etch the dual mask layer 220.

Figure 19D:
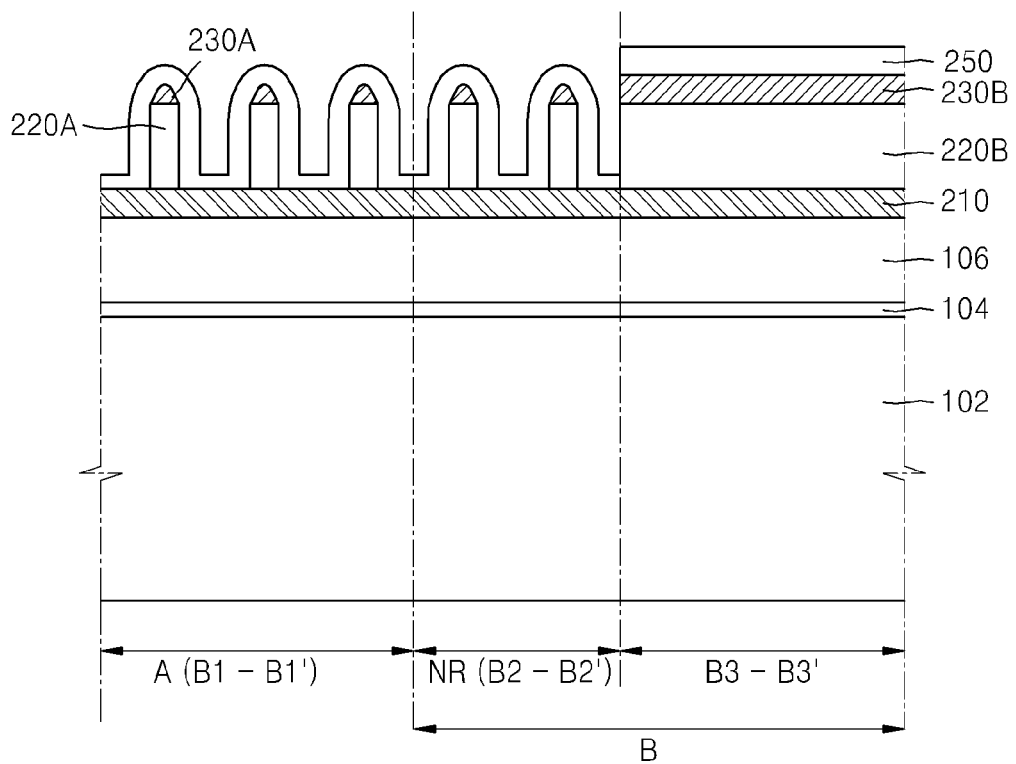

Referring to FIG. 19D, a spacer mask layer 250 that covers to a uniform thickness exposed surfaces of the first mask pattern 220A, the first variable mask pattern 230A, the second mask pattern 220B, and the second variable mask pattern 230B, and an exposed surface of the buffer mask layer 210 is formed.

The spacer mask layer 250 may be formed of a material having different etch selectivity for the first variable mask pattern 230A, the second variable mask pattern 230B, the first mask pattern 220A, the second mask pattern 220B, and the buffer mask layer 210. For example, the spacer mask layer 250 may be formed of an oxide film. ALD may be used in order to form the spacer mask layer 250 to a uniform thickness.

Figure 19E:
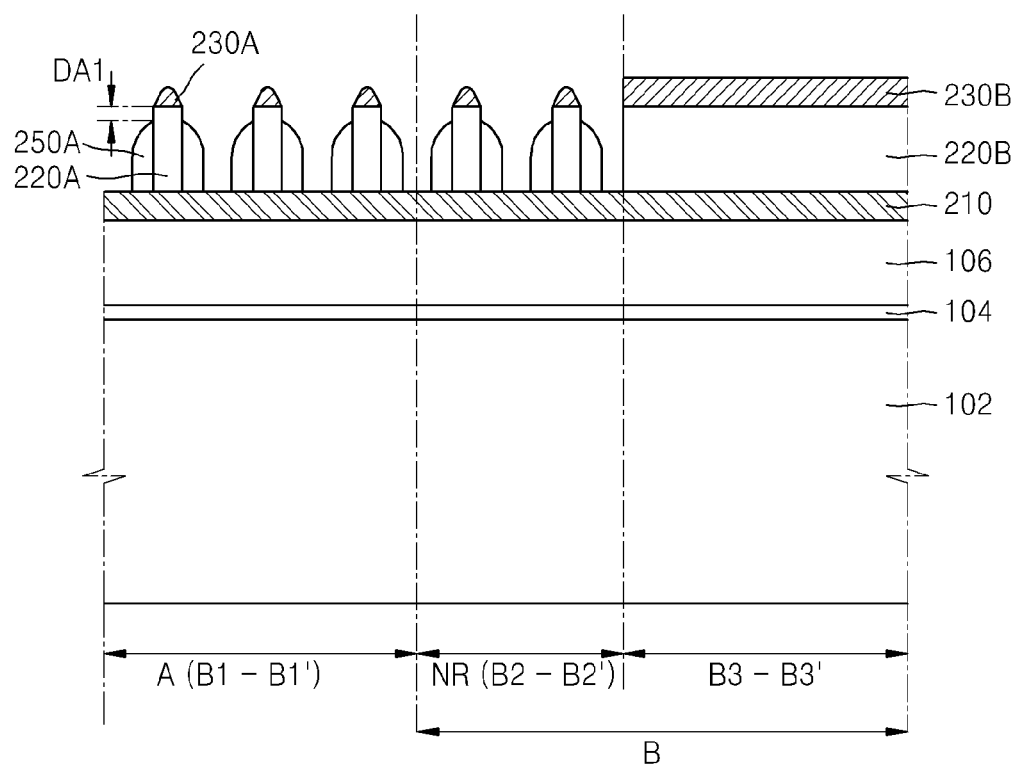

Referring to FIG. 19E, a first spacer 250A that covers side walls of the first mask pattern 220A is formed in the first region A and the adjacent region NR by etching the spacer mask layer 250 until a top surface of the buffer mask layer 210 is exposed. Although not shown in FIG. 19E, a second spacer (not shown) that covers side walls of the second mask pattern 220B may be formed in a portion of the second region B other than the adjacent region NR.

The first spacer 250A is used as an etching mask for doubling a pattern density in the first region A and the adjacent region NR.

While the spacer mask layer 250 is subjected to etch-back, an etch rate of the spacer mask layer 250 may be accelerated due to an inclined top surface of the spacer mask layer 250 in the first region A and the adjacent region NR, and thus an etch rate of the spacer mask layer 250 in the first region A and the adjacent region NR may be higher than an etch rate of the space mask layer 250 in a portion of the second region B other than the adjacent region NR. Accordingly, a height of the first spacer 250A formed on the buffer mask layer 210 in the first region A and the adjacent region NR may be less than a height of the second spacer formed on the side walls of the second mask pattern 220B in a portion of the second region B other than the adjacent region NR. Accordingly, a distance DA1 may exist between the first variable mask pattern 230A and the first spacer 250A in the first region A and the adjacent region NR, and the first mask pattern 220A may be exposed between the first variable mask pattern 230A and the first spacer 250A through the distance DA1.

Figure 19F:
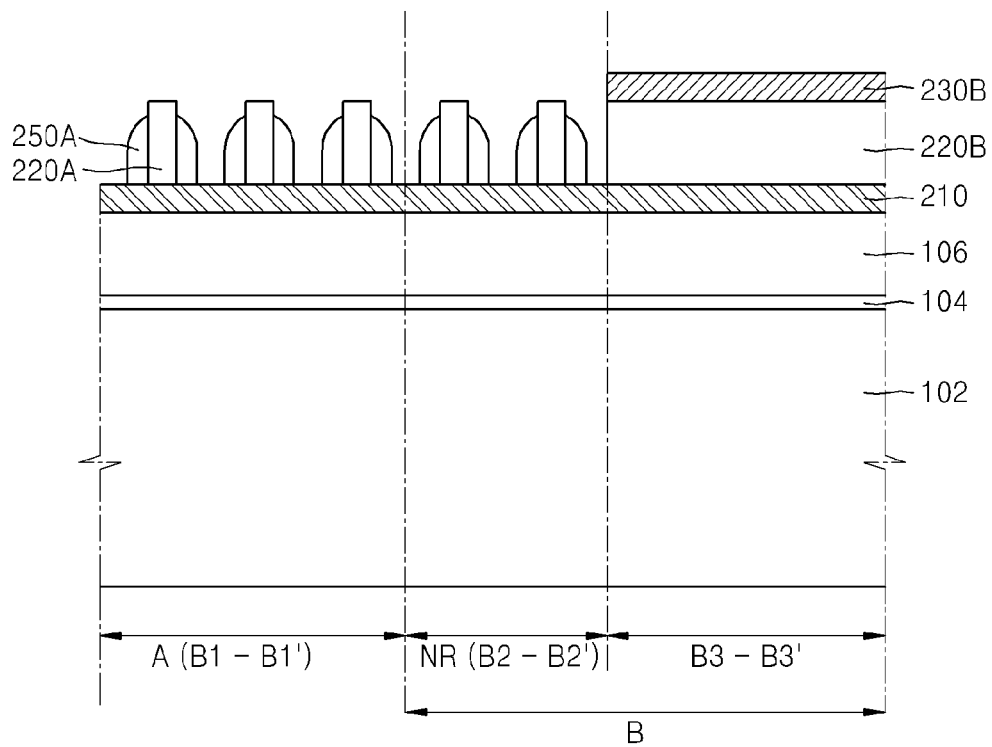

Referring to FIG. 19F, a top surface of only the first mask pattern 220A from among the first mask pattern 220A and the second mask pattern 220B is exposed to the outside by selectively removing only the first variable mask pattern 230A from among the first variable mask pattern 230A and the second variable mask pattern 230B.

When the first variable mask pattern 230A is removed, an etch selectivity difference of the first variable mask pattern 230A between the first mask pattern 220A the second mask pattern 220B, the first spacer 250A, and the buffer mask layer 210 may be used.

Since the first variable mask pattern 230A has a pattern size and a thickness that are less than those of the second variable mask pattern 230B, even when the first variable mask pattern 230A and the second variable mask pattern 230B are formed of the same material, an etch rate of the first variable mask pattern 230A may be higher than an etch rate of the second variable mask pattern 230B. Accordingly, at a time when the first variable mask pattern 230A is completely removed in the first region A and the adjacent region NR, the second variable mask pattern 230B may remain on a top surface of the second mask pattern 220B without a great change in its thickness.

Figure 19G:
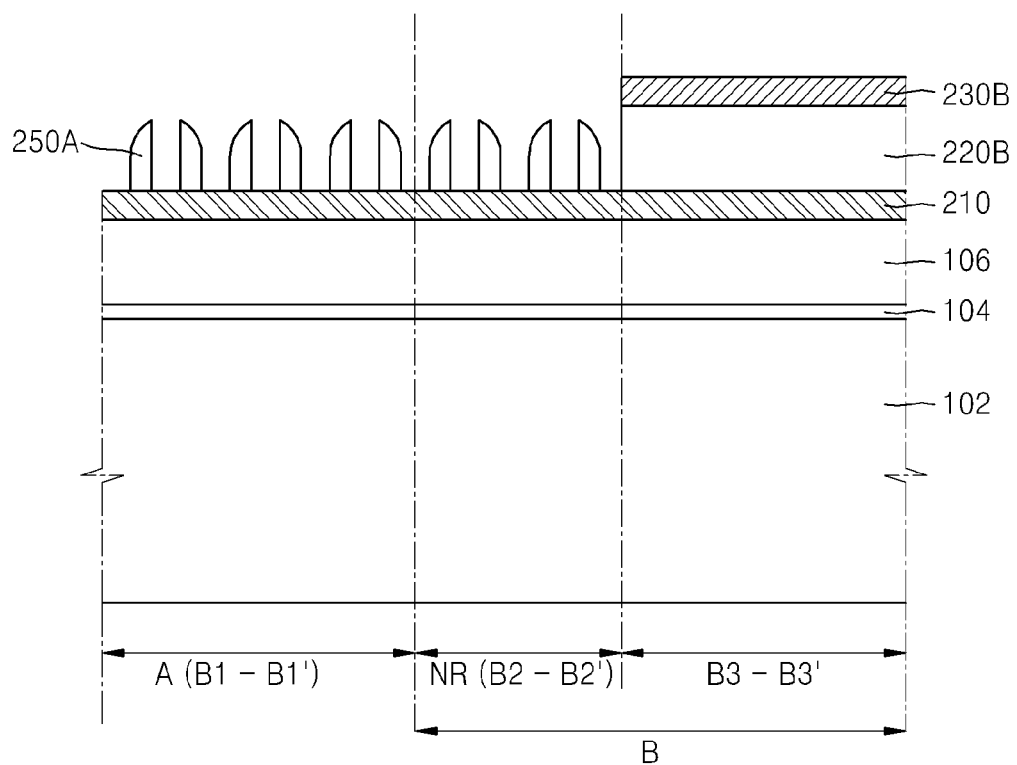

Referring to FIG. 19G, the buffer mask layer 210 is exposed through a space between two adjacent first spacers 250A in the first region A and the adjacent region NR by removing the first mask pattern 220A (see FIG. 19F) that is exposed in the first region A and the adjacent region NR.

The second spacer that covers the side walls of the second mask pattern 220B in a portion of the second region B other than the adjacent region NR may have a height that is greater than that of the first spacer 250A, and thus the second spacer and the second variable mask pattern 230B may contact each other and the second mask pattern 220B may be completely covered by the second spacer and the second variable mask pattern 230B not to be exposed to the outside. Accordingly, while the first mask pattern 220A is removed in the first region A and the adjacent region NR, the second mask pattern 220B may remain without being removed.

A process of removing the first mask pattern 220A may be performed under a condition in which the first spacer 250A that is in the first region A and the adjacent region NR and the second variable mask pattern 230B and the buffer mask layer 210 that are in the second region B are suppressed from being etched.

When the first mask pattern 220A is formed of an SOH, for example, ashing or stripping may be used in order to remove the first mask pattern 220A. Alternatively, dry or wet etching may be used in order to remove the first mask pattern 220A according to a material of the first mask pattern 220A.

Figure 19H:
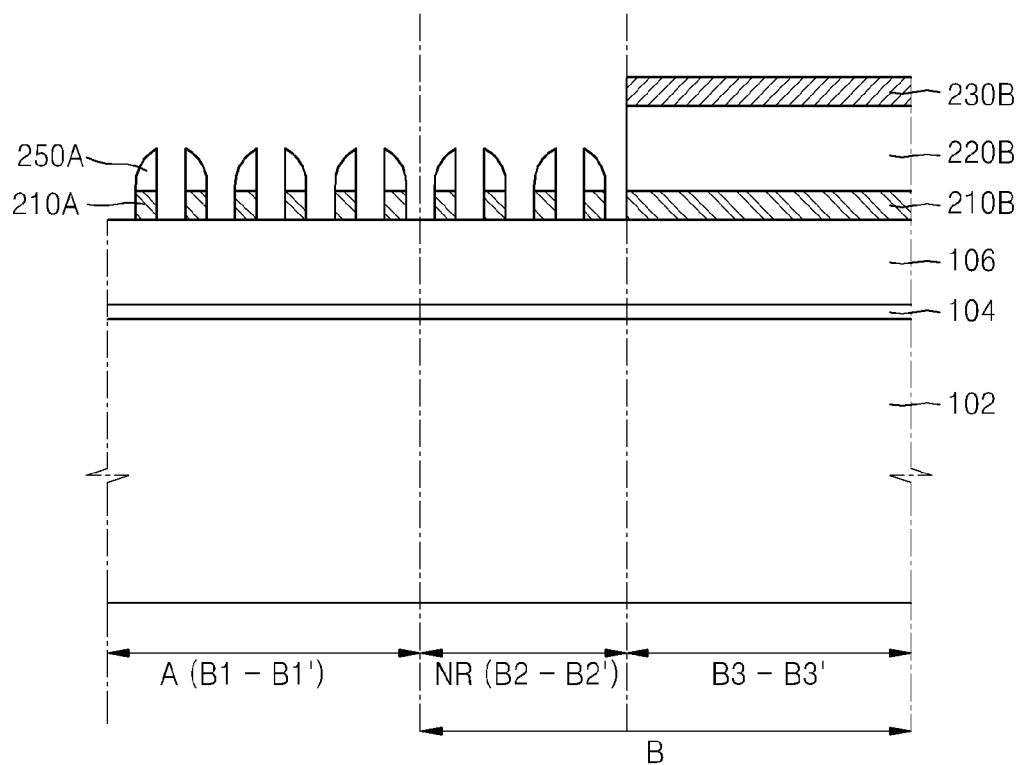

Referring to FIG. 19H, a first pattern 210A having a small width in the first region A and the adjacent region NR and a second pattern 210B having a relatively large width in a portion of the second region B other than the adjacent region NR are formed by etching the buffer mask layer 210 by using as an etching mask the first spacer 250A in the first region A and the adjacent region NR and using as an etching mask the second mask pattern 220B, the second spacer that covers the side walls of the second mask pattern 220B, and the second variable mask pattern 230B in a portion of the second region B other than the adjacent region Nr. If necessary, unnecessary films remaining on the first pattern 210A and the second pattern 210B may be removed. The first pattern 210A and the second pattern 210B may constitute the mask lines 110A and the wide width mask layer 110B of FIGS. 6A and 6B.

Figure 19I:
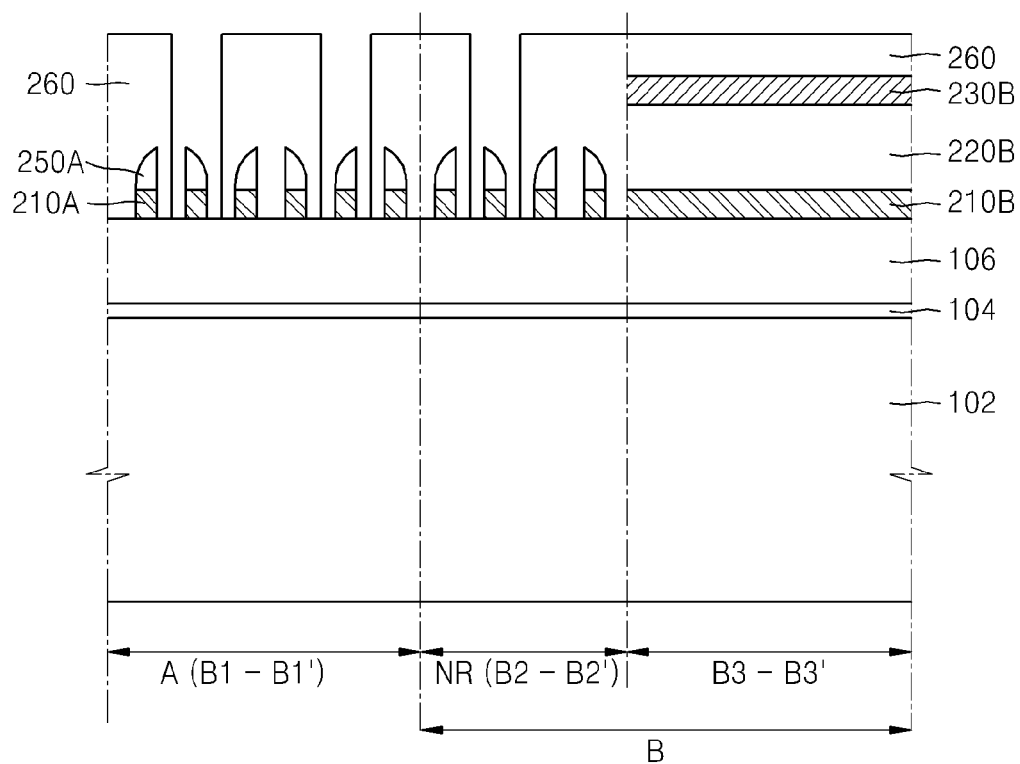

Referring to FIG. 19I, a first trimming pattern 260 is formed on a resultant structure including the first pattern 210A and the second pattern 210B.

The first trimming pattern 260 may correspond to the first trimming pattern 120 of FIGS. 7A and 7B.

In an example embodiment, the first trimming pattern 260 is formed in a state where the first spacer 250A, the second mask pattern 220B, and the second spacer that covers the side walls of the second mask pattern 220B remain on the first pattern 210A and the second pattern 210B as shown in a resultant structure of FIG. 19I, and then processes described with reference to FIGS. 8A through 16B are performed, thereby manufacturing the semiconductor device.

FIGS. 20A through 20E are cross-sectional views according to a process order, for explaining a method of manufacturing a semiconductor device 100C, according to an example embodiment of inventive concepts.

A process described with reference to FIGS. 20A through 20E is substantially the same as a process described with reference to FIGS. 19A through 19I. However, FIGS. 20A through 20E illustrate a side wall 220S of the second mask pattern 220B that is formed on a portion of the second region B other than the adjacent region NMR and a second spacer 250B that covers the side wall 220S of the second mask pattern 220B. In FIGS. 20A through 20E, the same elements as those in FIGS. 19A through 19I are denoted by the same reference numerals, and a detailed explanation thereof will not be given.

Figure 20A:
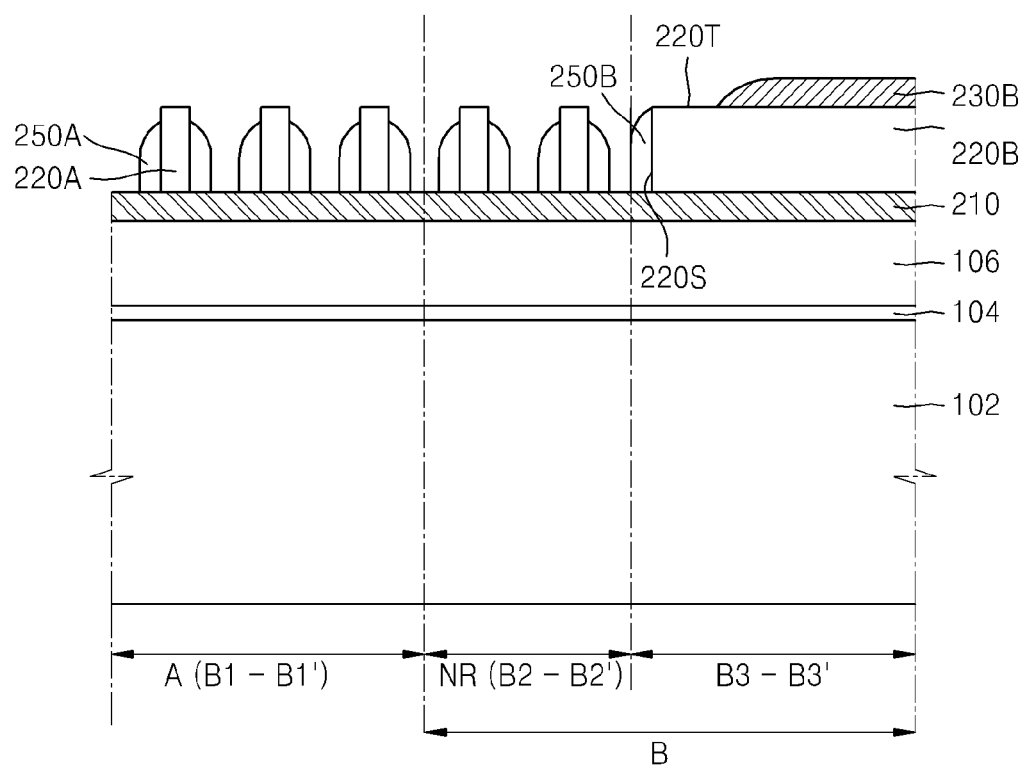
FIGS. 20A through 20E are cross-sectional views according to a process order, for explaining a method of manufacturing a semiconductor device, according to an example embodiment of inventive concepts.

Referring to FIG. 20A, in a manner similar to that described with reference to FIG. 19E, the first spacer 250A that covers side walls of the first mask pattern 220A and the second spacer 250B that covers side walls of the second mask pattern 220B are formed.

As described with reference to FIG. 19E, the second spacer 250B that covers the side walls of the second mask pattern 220B may have a height that is greater than that of the first spacer 250A in a portion of the second region B other than the adjacent region NR, but example embodiments are not limited thereto.

On a resultant structure including the first spacer 250A and the second spacer 250B, a top surface of the first mask pattern 220A is exposed to the outside by removing the first variable mask pattern 230A in a method similar to that described with reference to FIG. 19F. When overetching is performed while the first variable mask pattern 230A is etched in order to remove the first variable mask pattern 230A until the top surface of the first mask pattern 220A is exposed, a part of the second variable mask pattern 230B may be etched on an edge portion of the second mask pattern 220B that is formed in a portion of the second region B other than the adjacent region NR, unlike on a central portion of the second mask pattern 220B, and thus a top surface 220T of the edge portion of the second mask pattern 220B may be exposed to the outside.

Figure 20B:
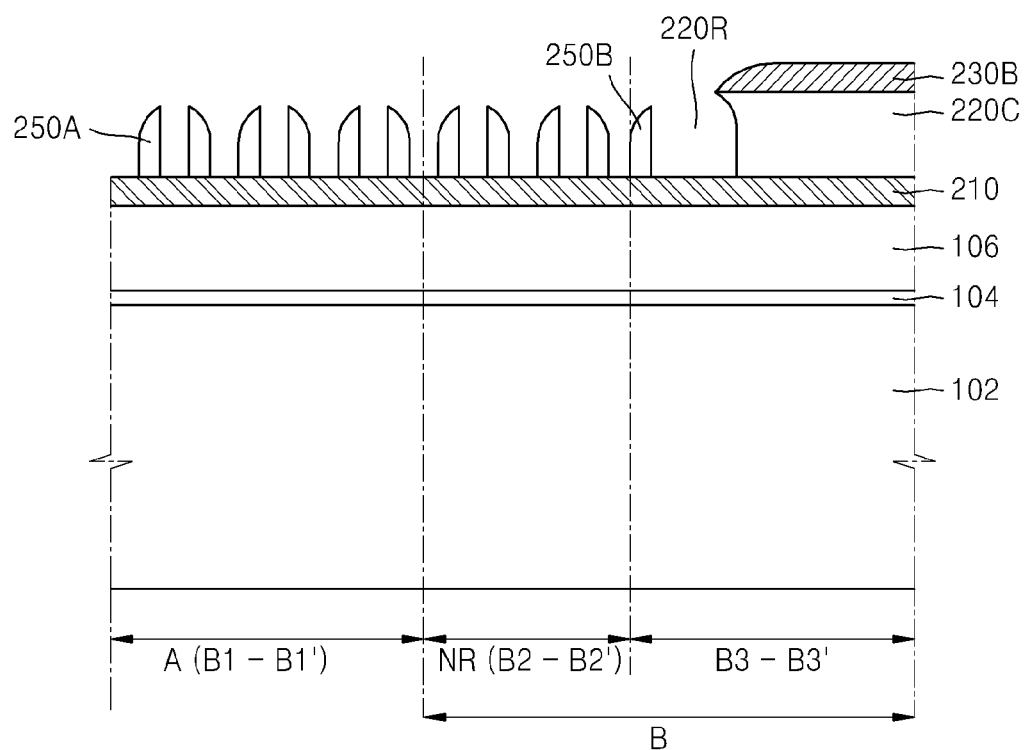

Referring to FIG. 20B, the first mask pattern 220A that is exposed in the first region A and the adjacent region NR is removed in a method similar to that described with reference to FIG. 19G. In this case, a part of the second mask pattern 220B may also be removed from the top surface 220T of the edge portion of the second mask pattern 220B that is exposed to the outside in the second region B, and thus a modified second mask pattern 220C may be formed in the second region B. A space 220R that exposes the buffer mask layer 210 may be formed between the modified second mask pattern 220C and the second spacer 250B.

Figure 20C:
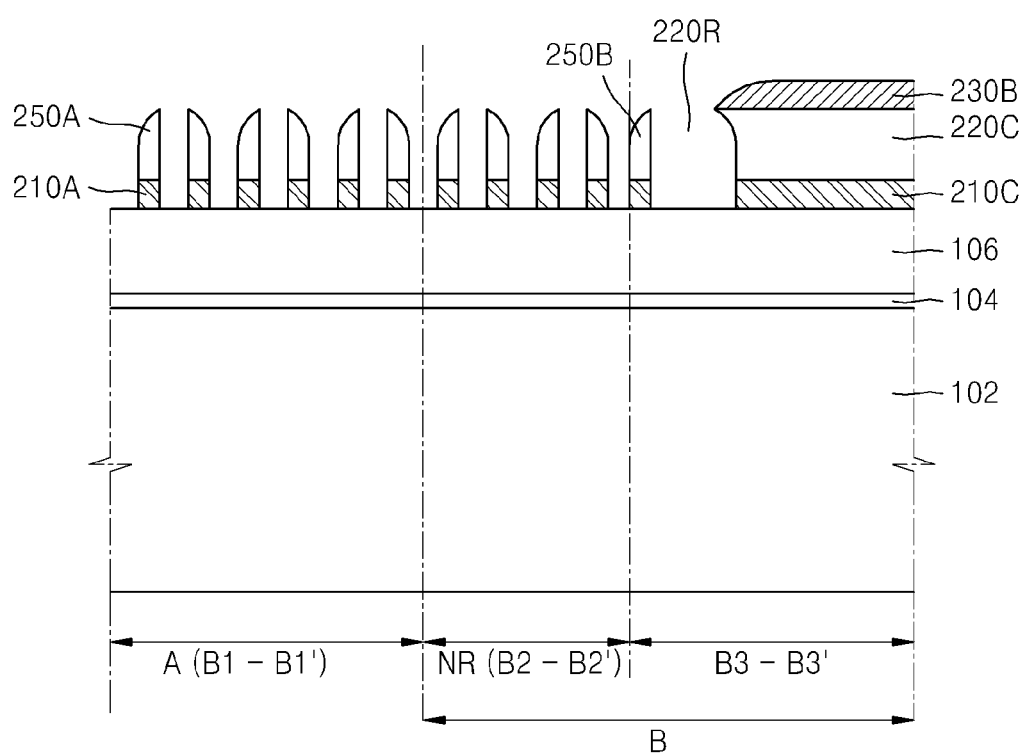

Referring to FIG. 20C, on a resultant structure including the space 220R of FIG. 20B, the first pattern 210A and a second pattern 210C are formed by etching the buffer mask layer 210 by using the first spacer 250A, the second spacer 250B, and the second variable mask pattern 230B as an etching mask in a manner similar to that described with reference to FIG. 19H. In this case, a portion of the buffer mask layer 210 that is exposed and vertically corresponds to the spacer 220R may also be etched, and the second pattern 210C may have a width that is less than that of the second pattern 210B of FIG. 19H.

Figure 20D:
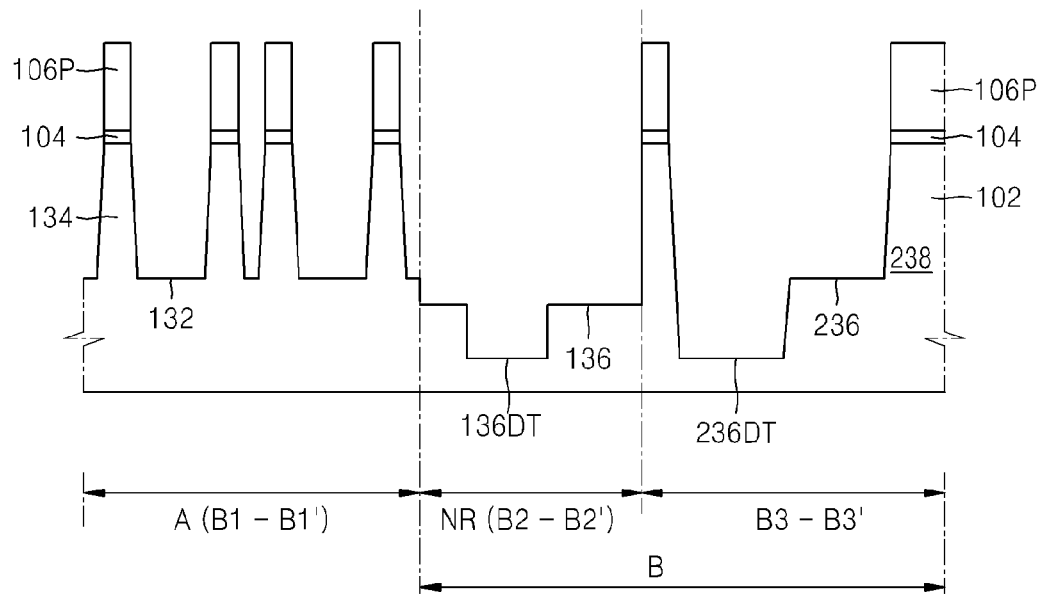

Referring to FIG. 20D, the first trench 132 is formed in the first region A of the substrate 102 and the second trench 136 is formed in the adjacent region NR of the second region B by performing processes described with reference to FIGS. 7A through 14B on a resultant structure of FIG. 20C. While the first trench 132 and the second trench 136 are formed, a third trench 236 that defines a third active region 238 is formed in the second region B of the substrate 102. In an example embodiment, the third trench 236 may communicate with the second trench 136.

An edge deep trench 236DT that is recessed to have a level lower than those of other points on a bottom surface of the third trench 236 is formed at an edge of the bottom surface of the third trench 236 in a surface of the substrate 102 that forms the bottom surface of the third trench 236. The edge deep trench 236DT which is a portion vertically corresponding to the exposed top surface 220T of the edge portion of the second mask pattern 220B of FIG. 20A is a result obtained after etching a portion of the buffer mask layer 210 under the spacer 220R of FIG. 20B and transferring the etched portion to other lower films in subsequent processes.

The edge deep trench 236DT may be formed at an edge of the bottom surface of the third trench 236 that is the closest to the first region A.

Figure 20E:
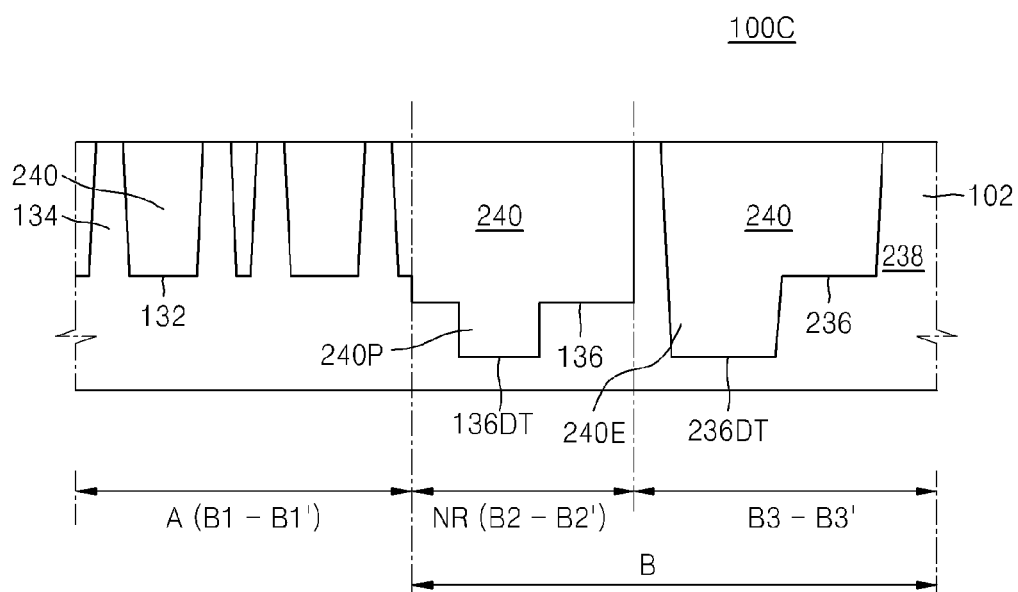

Referring to FIG. 20E, the hard mask pattern 106P and the pad oxide film 104 that remain on the substrate 102 are removed.

Next, the device isolation film 240 is formed by filling the second trench136 in the bottom surface of which the deep trenches 136DT is formed and the third trench 236 in the bottom surface of which the edge deep trench 236DT is formed.

A protrusion 240P that protrudes away from the top surface 102T of the substrate 102 in a thickness direction of the substrate 102 is formed by filling the deep trenches 136DT on a bottom surface of the device isolation film 240 in the second trench 136, and an edge protrusion 240E that protrudes away from the top surface 102T of the substrate 102 in the thickness direction of the substrate 102 is formed by filling the edge deep trench 236DT on the bottom surface of the device isolation film 240 in the third trench 236.

Figure 21A:
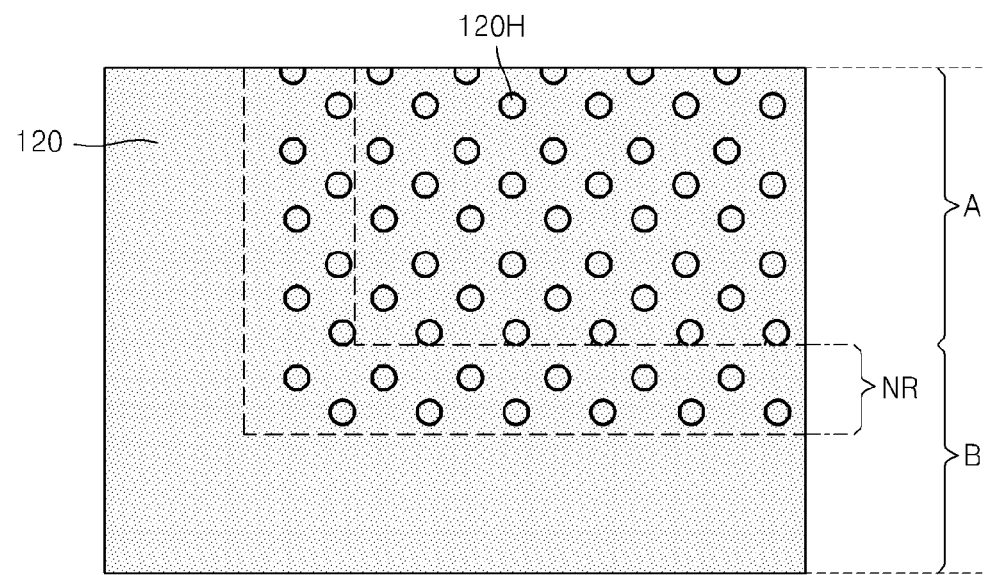
FIG. 21A is a plan view illustrating a first trimming pattern used to manufacture a semiconductor device, according to an example embodiment of inventive concepts.

FIG. 21A is a plan view illustrating the first trimming pattern 120 (see FIGS. 7A and 7B) used during a first trimming process for defining an active region in the first region A in order to manufacture a semiconductor device, according to an example embodiment of inventive concepts.

The first trimming pattern 120 is formed to cover the first region A and the second region B of the substrate 102 (see FIGS. 7A and 7B), and the plurality of openings 120H that are formed in the first trimming pattern 120 are distributed over the first region A and the adjacent region NR of the second region B.

Figure 21B:
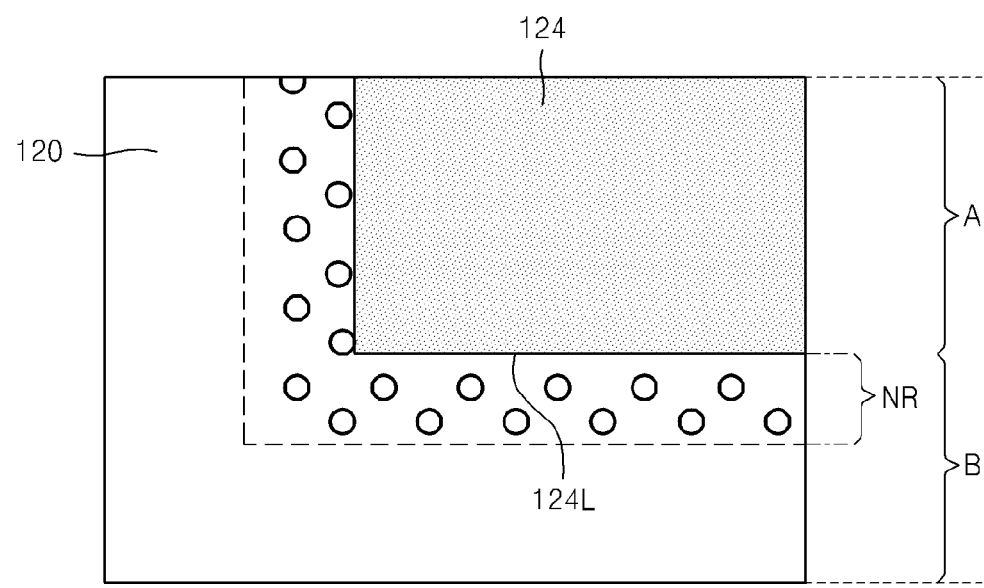
FIG. 21B is a plan view illustrating a second trimming pattern used to manufacture a semiconductor device, according to an example embodiment of inventive concepts.

FIG. 21B is a plan view illustrating the second trimming pattern 124 (see FIGS. 10A and 10B) used during a second trimming process for defining an active region in the first region A in order to manufacture a semiconductor device, according to an example embodiment of inventive concepts. For comparison, FIG. 21B also shows the first trimming pattern 120 of FIG. 21A.

The second trimming pattern 124 is formed to cover the first region A of the substrate 102 (see FIGS. 10A and 10B). A first range in which the plurality of openings 120H that are formed in the first trimming pattern 120 of FIG. 21A are formed is greater than a second range that is covered by the second trimming pattern 124, and the second range is included in the first range.

In FIG. 21B, the second trimming pattern 124 has a linear outline 124L. However, example embodiments are not limited thereto, and a planar shape of the second trimming pattern 124 may be modified in various ways.

Figure 21C:
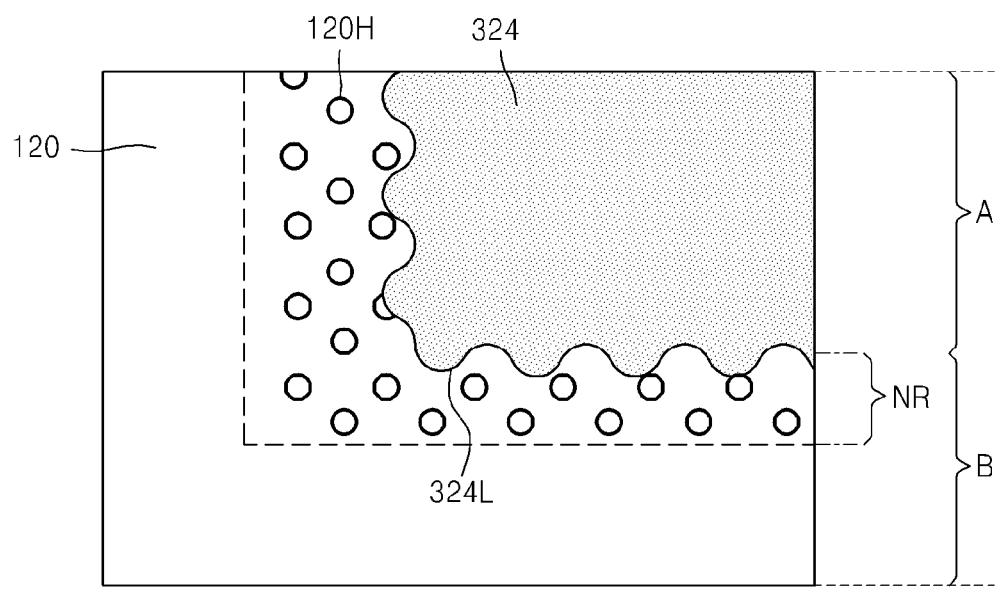
FIG. 21C is a plan view illustrating a second trimming pattern used to manufacture a semiconductor device, according to an example embodiment of inventive concepts.

FIG. 21C is a plan view illustrating a second trimming pattern 324 having an uneven outline 324L that is used during a second trimming process for defining an active region in the first region A in order to manufacture a semiconductor device, according to an example embodiment of inventive concepts. For comparison, FIG. 21C also shows the first trimming pattern 120 of FIG. 21A.

The second trimming pattern 324 may be formed to cover parts of the first region A and the adjacent region NR of the substrate 102 (see FIGS. 10A and 10B). A first range in which the plurality of openings 120H that are formed in the first trimming pattern 120 of FIG. 21A is greater than a third range that is covered by the second trimming pattern 324, and the third range is included in the first range.

Figure 21D:
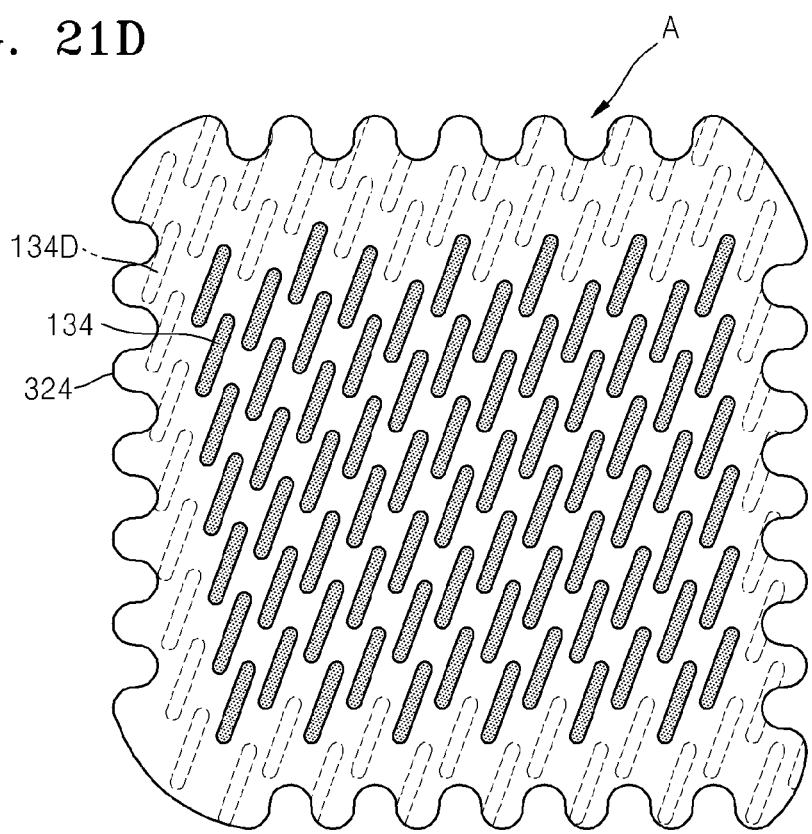
FIG. 21D is a plan view illustrating a range in which a plurality of first active regions are formed when a second trimming process is performed by using the second trimming pattern of FIG. 21C.

FIG. 21D is a plan view illustrating a range in which the plurality of first active regions 134 that are formed in the first region A are formed when a second trimming process is performed by using the second trimming pattern 324 of FIG. 21C.

In FIG. 21D, some active regions adjacent to an edge portion of the first region A may be used as dummy active regions 134D as marked by a dashed line from among the plurality of active regions 134 that are formed in the first region A corresponding to the third range defined by the second trimming pattern 324.

Figure 22A:
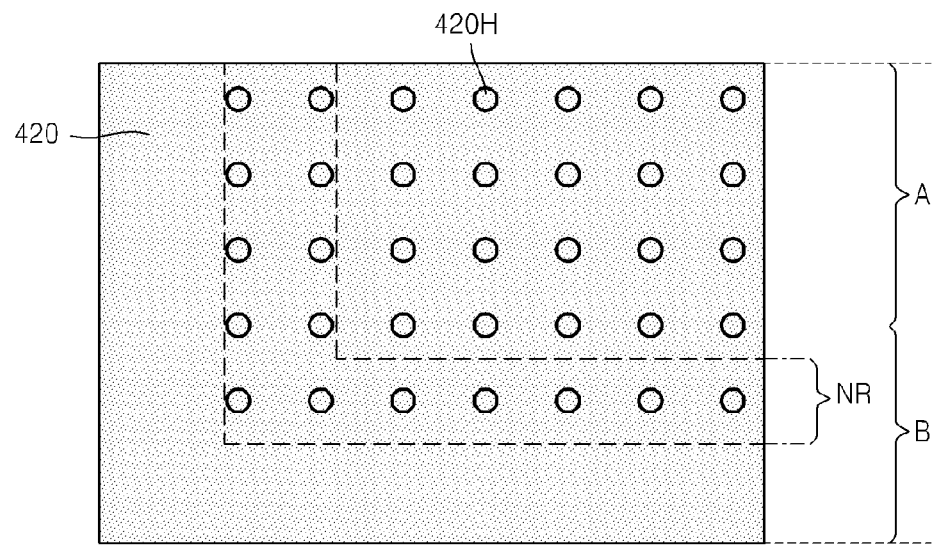
FIG. 22A is a plan view illustrating a first trimming pattern used to manufacture a semiconductor device, according to an example embodiment of inventive concepts.

FIG. 22A is a plan view illustrating a first trimming pattern 420 used during a first trimming process for defining an active region in the first region A in order to manufacture a semi-conductor device, according to an example embodiment of inventive concepts.

The first trimming pattern 420 is formed to cover the first region A and the second region B of the substrate 102 (see FIGS. 7A and 7B), and a plurality of openings 420H that are formed in the first trimming pattern 420 are distributed over the first region A and the adjacent region NR of the second region B. Also, a density of the plurality of openings 420H formed in the first trimming pattern 420 may be less than a density of the plurality of openings 120H formed in the first trimming pattern 120 of FIG. 21A. For example, the plurality of openings 420H may be formed at first positions alternately selected in a row direction and a column direction from among the plurality of openings 120H necessary for the first region A during a first trimming process described with reference to FIGS. 7A and 7B.

Figure 22B:
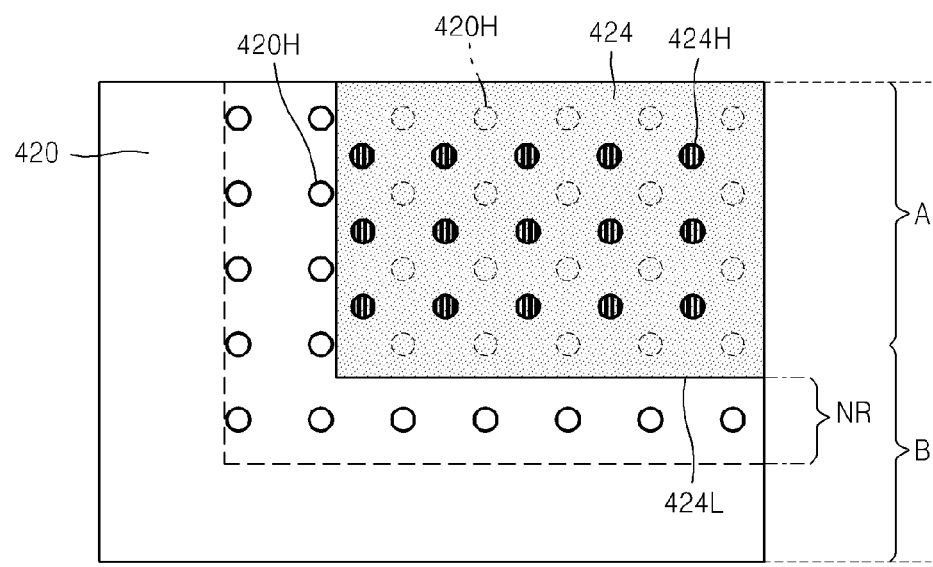
FIG. 22B is a plan view illustrating a second trimming pattern used to manufacture a semiconductor device, according to an example embodiment of inventive concepts.

FIG. 22B is a plan view illustrating a second trimming pattern 424 used during a second trimming process for defining an active region in the first region A in order to manufacture a semiconductor device, according to an example embodiment of inventive concepts. For comparison, FIG. 22B also shows the first trimming pattern 420 of FIG. 22A.

The second trimming pattern 424 may be formed to cover the first region A of the substrate 102 (see FIGS. 10A and 10B). A first range in which the plurality of openings 420H that are formed in the first trimming pattern 420 of FIG. 22A is greater than a second range that is covered by the second trimming pattern 424, and the second range is included in the first range.

A plurality of openings 424H are formed in the second trimming pattern 424. A density of the plurality of openings 424H formed in the second trimming pattern 424 may be similar or equal to a density of the plurality of openings 420H formed in the first trimming pattern 420 of FIG. 22A. The plurality of openings 424H are formed not to vertically overlap with the plurality of openings 420H formed in the first trimming pattern 420. For example, the plurality of openings 424H may be formed at second positions corresponding to positions other than positions at which the plurality of openings 420H of FIG. 22A are formed from among positions corresponding to the plurality of openings 120H necessary for the first region A during a first trimming process described with reference to FIGS. 7A and 7B.

Since the first trimming process 420 and the second trimming pattern 424 of FIGS. 22A and 22B are used during a first trimming process and a second trimming process in a method of manufacturing a semiconductor device according to an example embodiment of inventive concepts, an interval between openings that are to be etched during an etching process that is performed during the first trimming process and the second trimming process may be increased. Accordingly, the risk of defects that may be caused due to a high pattern density during the etching process due to the openings may be avoided.

The second trimming pattern 424 has a linear outline 424L in FIG. 22B. However, example embodiments are not limited thereto, and a planar shape of the second trimming pattern 424 may be modified in various ways.

Figure 22C:
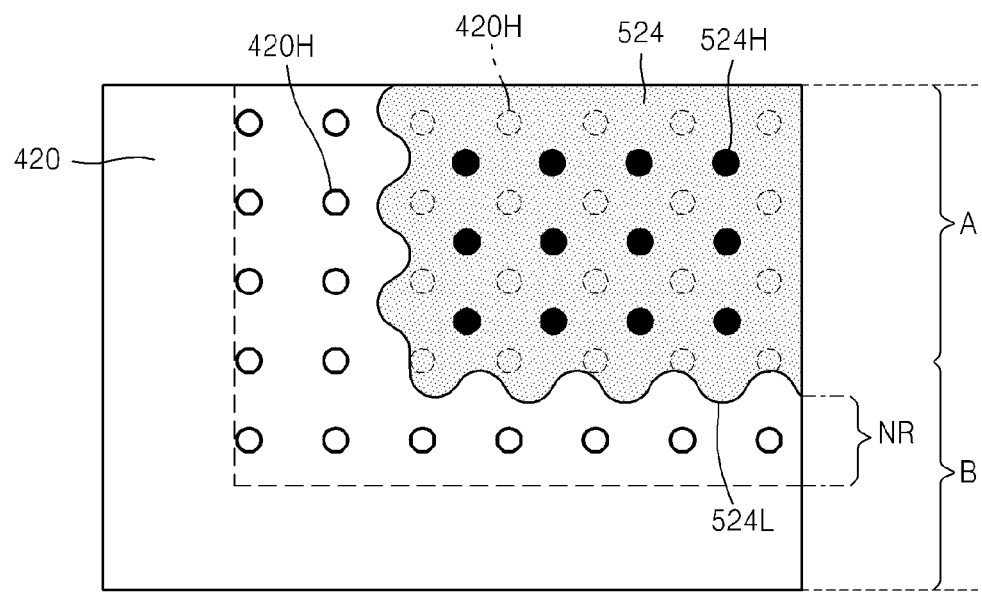
FIG. 22C is a plan view illustrating a second trimming pattern used to manufacture a semiconductor device, according to an example embodiment of inventive concepts.

FIG. 22C is a plan view illustrating a second trimming pattern 524 having an uneven outline 524L that is used during a second trimming process for defining an active region in the first region A in order to manufacture a semiconductor device, according to an example embodiment of inventive concepts. For comparison, FIG. 22C also shows the first trimming pattern 420 of FIG. 22A.

A plurality of openings 524H that correspond to the plurality of openings 424H of FIG. 22B are formed in the second trimming pattern 524. The second trimming pattern 524 may be formed to cover parts of the first region A and the adjacent region NR of the substrate 102 (see FIGS. 10A and 10B). A first range in which the plurality of openings 420H that are formed in the first trimming pattern 420 of FIG. 22A are formed is greater than a third range that is covered by the second trimming pattern 424, and the third range is included in the first range.

Figure 23:
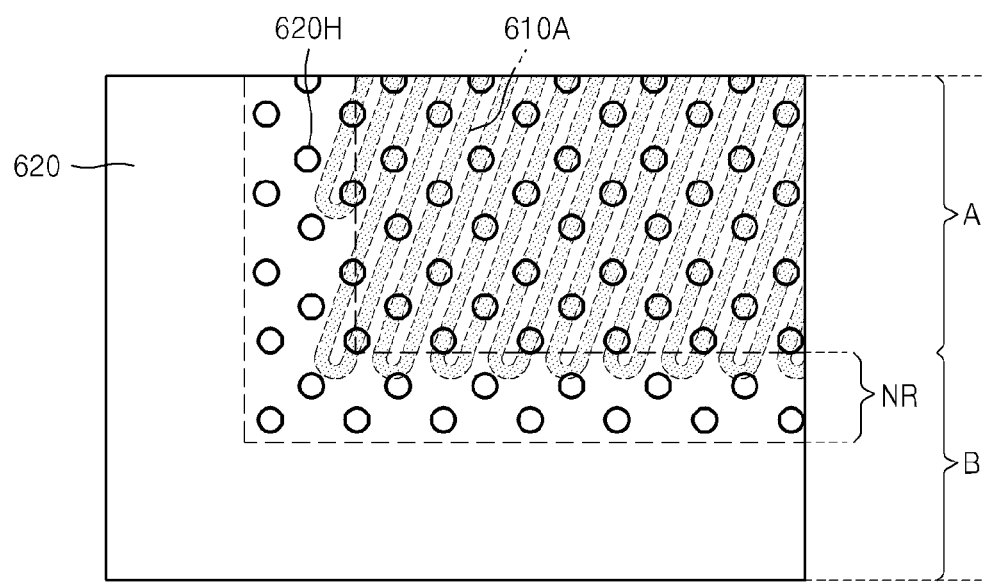
FIG. 23 is a plan view illustrating a first trimming pattern used to manufacture a semiconductor device, according to an example embodiment of inventive concepts.

FIG. 23 is a plan view illustrating a first trimming pattern 620 used during a first trimming process for defining an active region in the first region A in order to manufacture a semi-conductor device, according to an example embodiment of inventive concepts.

The first trimming pattern 620 is formed to cover the first region A and the second region B of the substrate 102 (see FIGS. 7A and 7B), and a plurality of openings 620H that are formed in the in the first trimming pattern 620 are distributed over the first region A and the adjacent region NR of the second region B.

In FIG. 23, a mask line 610A that is covered by the first trimming pattern 620 is marked by a dashed line. The mask line 610A has substantially the same structure as that of the mask lines 110A of FIGS. 6A and 6B. Although the mask line 610A is formed over the first region A and the adjacent region NR around the first region A, a first range in which the mask line 610 is formed on the substrate 102 may be less than a second range in which the plurality of openings 620H are formed in the first trimming pattern 620, and the first range may be included in the second range.

Since the plurality of openings 620H are formed in the first trimming pattern 620 in a range that includes the first range in which the mask line 610A is formed and is wider than the first range as described above, CD distribution of an active region at an edge portion of the first region A may be limited (and/or prevented) from being degraded.

Figure 24A:
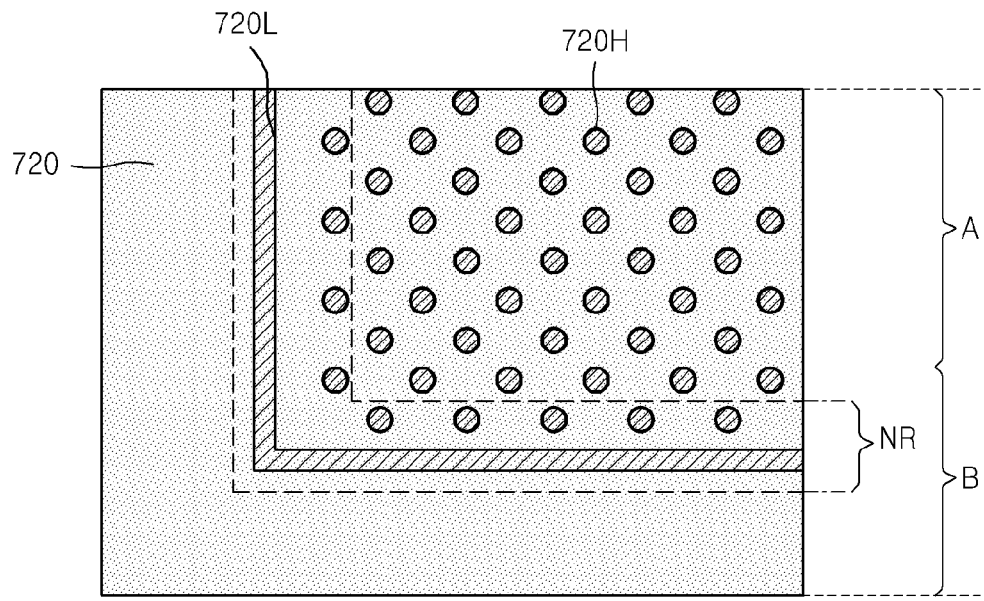
FIG. 24A is a plan view illustrating a first trimming pattern used to manufacture a semiconductor device, according to an example embodiment of inventive concepts.

FIG. 24A is a plan view illustrating a first trimming pattern 720 used during a first trimming process for defining an active region in the first region A in order to manufacture a semi-conductor device, according to an example embodiment of inventive concepts.

A plurality of openings 720H that have a similar structure to that of the plurality of openings 120H formed in the first trimming pattern 120 of FIGS. 7A and 7B are formed over the first region A and the adjacent region NR in the first trimming pattern 720. Also, an opening 720L having a linear shape that surrounds the first region A is formed to correspond to the adjacent region NR.

Figure 24B:
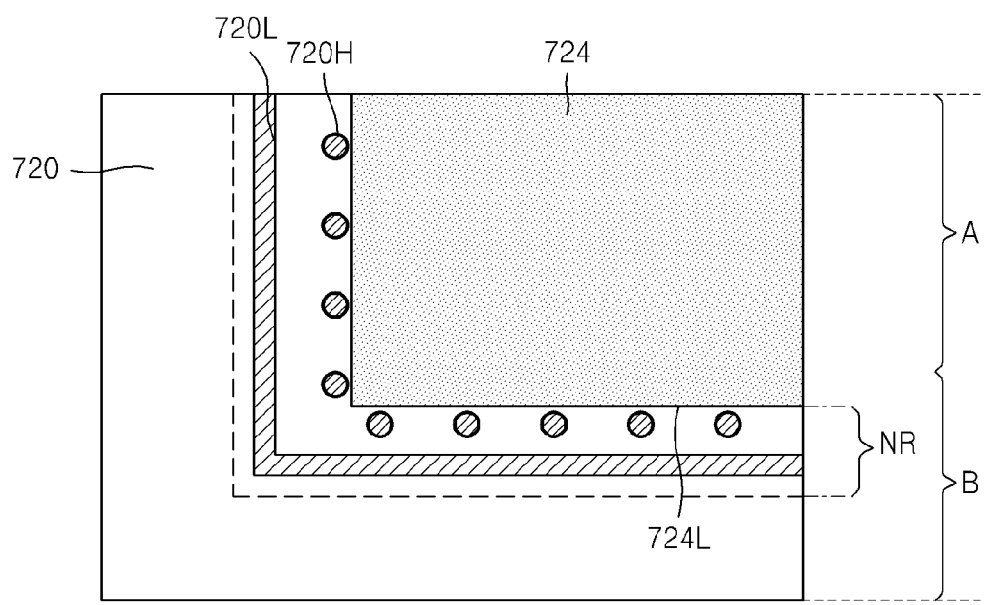
FIG. 24B is a plan view illustrating a second trimming pattern used to manufacture a semiconductor device, according to an example embodiment of inventive concepts.

FIG. 24B is a plan view illustrating a second trimming pattern 724 used during a second trimming process for defining an active region in the first region A in order to manufacture a semiconductor device, according to an example embodiment of inventive concepts. For comparison, FIG. 24B also shows the first trimming pattern 720 of FIG. 24A.

The second trimming pattern 724 may be formed to cover the first region A of the substrate 102 (see FIGS. 10A and 10B). A first range in which the plurality of openings 720H that are formed in the first trimming pattern 720 of FIG. 24A is greater than a second range that is covered by the second trimming pattern 724, and the second range is included in the first range. The opening 720L having the linear shape formed in the first trimming pattern 720 is formed outside the second range.

The second trimming pattern 724 has a linear outline 724L in FIG. 24B. However, example embodiments are not limited thereto, and a planar shape of the second trimming pattern 724 may be modified in various ways.

In a process described with reference to FIGS. 7A and 7B from among processes described with reference to FIGS. 4A through 16B, the first trimming pattern 720 in which the plurality of openings 720H and the opening 720L having the linear shape of FIGS. 24A and 24B are formed may be used, instead of the first trimming pattern 120. In this case, as a deep trench that is formed in a bottom surface of the second trench 136 of FIG. 15B, a deep trench having an island shape and a deep trench having a linear shape (e.g., a linear deep trench) surrounding the first region A of the substrate 102 may be formed. Likewise, a protrusion having an island shape and a protrusion having a linear shape surrounding the first region A of the substrate 102 may be formed on the device isolation film 140 of FIG. 16B.

Figure 25:
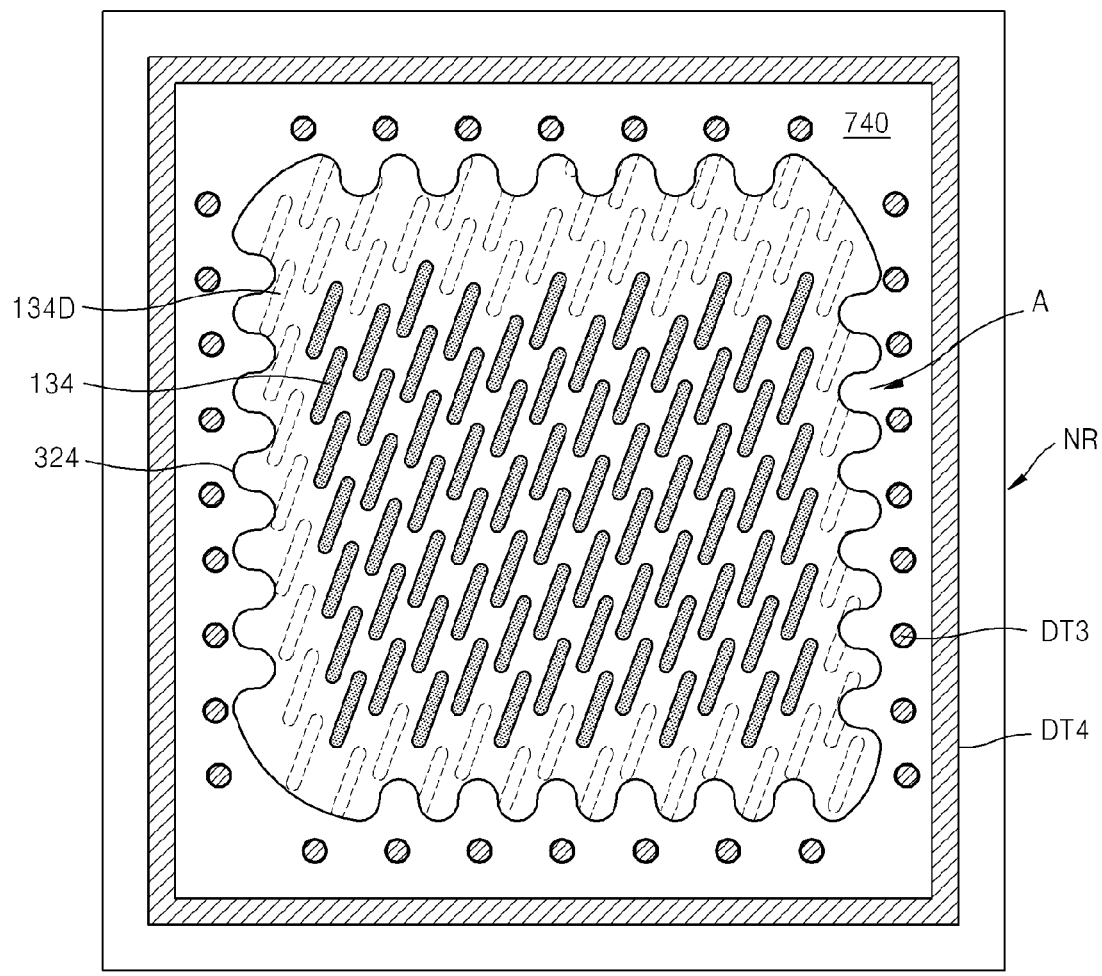
FIG. 25 is a view illustrating a semiconductor device according to an example embodiment of inventive concepts.

FIG. 25 is a view illustrating a semiconductor device 100D according to an example embodiment of inventive concepts.

The semiconductor device 100D includes the first region A in which the plurality of active regions 134A of FIG. 21D are formed and the adjacent region NR that surrounds the first region A. A plurality of deep trenches DT3 having shapes that correspond to the plurality of openings 720H of FIG. 24A and a deep trench DT4 having a linear shape that surrounds the first region A to correspond to the opening 720L having the linear shape of FIG. 24A are formed in a bottom surface of a device isolation film 740 that is in the adjacent region NR.

Figure 26:
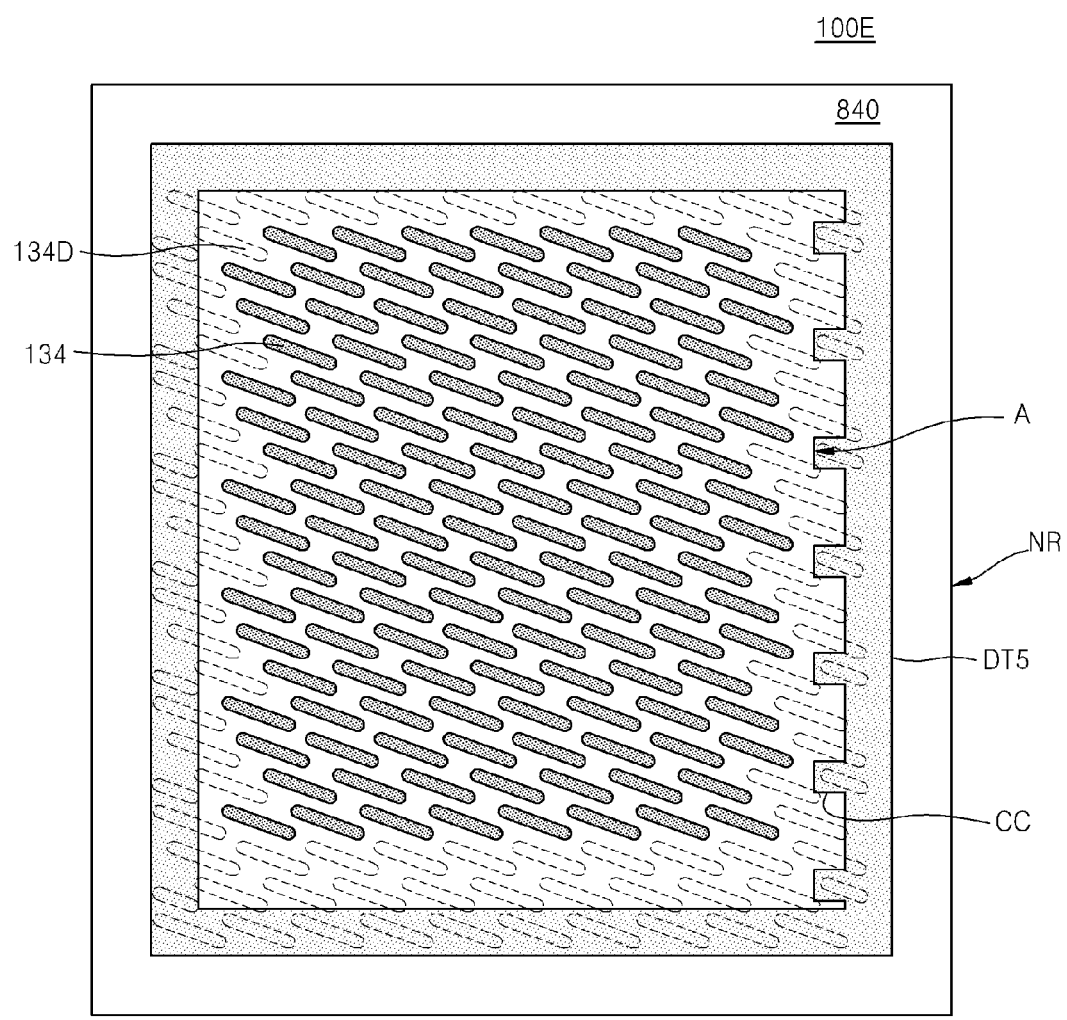
FIG. 26 is a view illustrating a semiconductor device according to an example embodiment of inventive concepts.

FIG. 26 is a view illustrating a semiconductor device 100E according to an example embodiment of inventive concepts.

The semiconductor device 100E of FIG. 26 includes a device isolation film 840 in which a deep trench DT5 having a linear shape that surrounds the first region A is formed in the adjacent region NR, like the deep trench DT4 having the linear shape that is formed in the device isolation film 740 of the semiconductor device 100D of FIG. 25.

However, at least a part of the deep trench DT5 that is formed in the device isolation film 840 includes a concave-convex portion CC that partially protrudes toward a central portion of the first region A.

In an example embodiment, lateral portions or vertical (upper and lower) portions of the plurality of active regions 134 that are formed at an edge portion of the first region A may be controlled to be horizontally or vertically symmetric about a line that passes through the center of the first region A by appropriately selecting a position, a size, an interval, etc. of the concave-convex portion CC.

Figure 27:
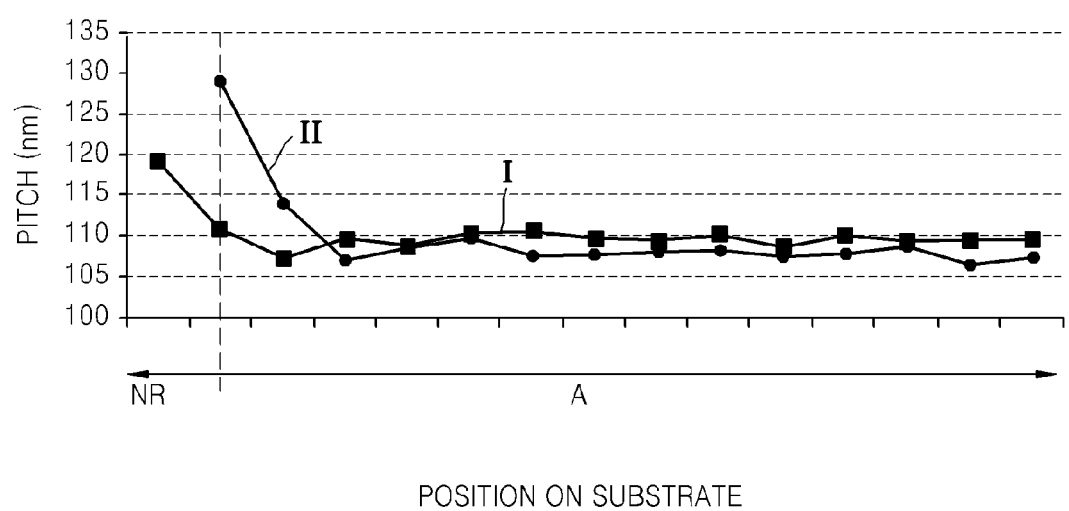
FIG. 27 is a graph illustrating a result obtained after measuring critical dimension (CD) distribution of a plurality of openings formed in a photoresist pattern used as an etching mask in an etching process for forming the plurality of openings in a first trimming pattern according to a method of manufacturing a semiconductor device, according to an example embodiment of inventive concepts.

FIG. 27 is a graph illustrating a result obtained after measuring CD distribution in the first region A and the adjacent region NR around the first region A on the substrate 102 for a plurality of holes that are formed, to correspond to the plurality of openings 120H, in a photoresist pattern (not shown) that is used as an etching mask during an etching process for forming the plurality of openings 120H in the first trimming pattern 120 of FIGS. 7A and 7B.

FIG. 27 shows a result obtained after measuring a pitch between a boundary between the first region A and the adjacent region NR and each of the holes that are aligned away from the boundary.

In FIG. 27, a measurement result I corresponds to a case where a plurality of hole patterns are formed in portions of the photoresist pattern used as the etching mask which correspond to the first region A and the adjacent region NR in order to perform a first trimming process by forming the plurality of openings 120H in the first trimming pattern 120 over the first region A and the adjacent region NR of FIGS. 7A and 7B. A measurement result II corresponds to a case where a plurality of hole patterns are formed only in portions of the photoresist pattern used as the etching mask which correspond to only the first region A.

As found from the result of FIG. 27, when the plurality of hole patterns that are formed in the photoresist pattern are distributed over the first region A and the adjacent region NR, CD uniformity for the plurality of hole patterns is improved.

Accordingly, when a semiconductor device is manufactured by using the first trimming pattern 120 in which the plurality of openings 120H are formed over the first region A and the adjacent region NR of FIGS. 7A and 7B, CD uniformity of the plurality of active regions 134 in the first region A may be improved.

Figure 28:
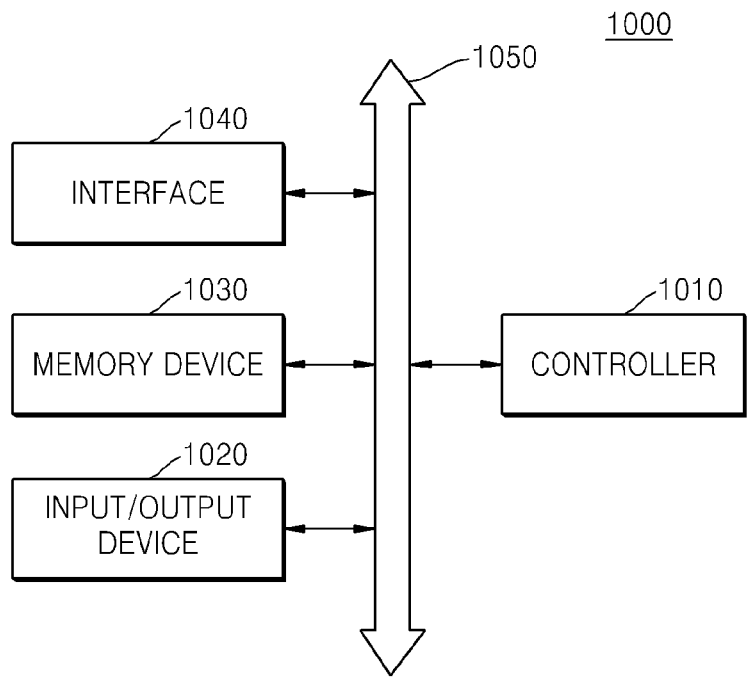
FIG. 28 is a block diagram illustrating a system including a semiconductor device, according to an example embodiment of inventive concepts.

FIG. 28 is a block diagram illustrating a system 1000 including a semiconductor device, according to an example embodiment of inventive concepts.

The system 1000 includes a controller 1010, an input/output device 1020, a memory device 1030, and an interface 1040. The system 1000 may be a mobile system or a system that transmits or receives information. In an example embodiment, the mobile system is a portable computer, a web tablet, a wireless phone, a mobile phone, a digital music player, or a memory card. The controller 1010 for controlling an execution program in the system 1000 may include a microprocessor, a digital signal processor, a microcontroller, or the like. The input/output device 1020 may be used to input or output data of the system 1000. The system 1000 may be connected to an external device, for example, a personal computer or a network, by using the input/output device 1020, and may exchange data with the external device. The input/output device 1020 may be, for example, a keypad, a keyboard, or a display device.

The memory device 1030 may store code and/or data for operating the controller 1010, or may store data processed by the controller 1010. The memory device 1030 may include a semiconductor device including a fin field effect transistor. The memory device 1030 may include a semiconductor device according to an example embodiment of inventive concepts. For example, the memory device 1030 may include at least one of the semiconductor devices 10A, 10B, 100A, 100B, 100C, 100D, and 100E of FIGS. 1 through 26.

The interface 1040 may be a path through which data is transmitted between the system 1000 and the external device. The controller 1010, the input/output device 1020, the memory device 1030, and the interface 1040 may communicate with one another via a bus 1050. The system 1000 may be applied to a mobile phone, an MP3 player, a navigation system, a portable multimedia player (PMP), a solid-state disk (SSD), or a household appliance.

Figure 29:
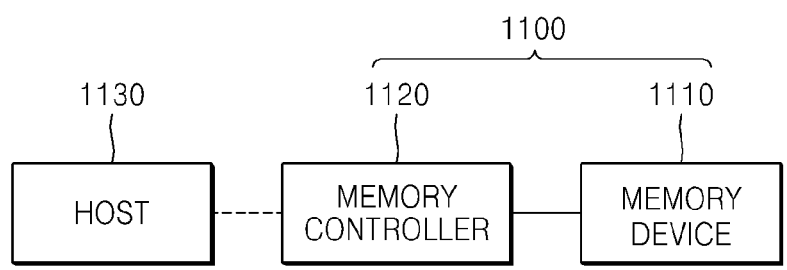
FIG. 29 is a block diagram illustrating a memory card including a semiconductor device, according to an example embodiment of inventive concepts.

FIG. 29 is a block diagram illustrating a memory card 1100 including a semiconductor device, according to an example embodiment of inventive concepts.

The memory card 1100 includes a memory device 1110 and a memory controller 1120.

The memory device 1110 may store data. In an example embodiment, the memory device 1110 may be a nonvolatile memory device that may maintain stored data even when not powered. The memory device 1110 may include at least one of the semiconductor devices 10A, 10B, 100A, 100B, 100C, 100D, and 100E of FIGS. 1 through 26.

The memory controller 1120 may read data stored in the memory device 1110 or store data in the memory device 1110 in response to a read/write request of a host 1130. The memory controller 1120 may include at least one of the semiconductor devices 10A, 10B, 100A, 100B, 100C, 100D, and 100E of FIGS. 1 through 26.

Since a semiconductor device according to the inventive concept includes an island-type active region having high CD uniformity over a cell array region, electrical characteristics and reliability may be improved.

Since a method of manufacturing a semiconductor device according to the inventive concept forms a mask line necessary to define a plurality of active regions not only in a high-density region for forming the plurality of active regions at a high density but also in a region adjacent to the high-density region and forms a plurality of openings not only in the high-density region but also in the region adjacent to the high-density region in order to perform a trimming process on the mask line by using an etching mask in which the plurality of openings are formed, CD distribution of the plurality of active regions at an edge portion of the high-density region may be limited (and/or prevented) from being degraded during the trimming process.

It should be understood that example embodiments described herein should be considered in a descriptive sense only and not for purposes of limitation. Descriptions of features or aspects within each device or method according to the above-described example embodiments should typically be considered as available for other similar features or aspects in other devices or methods according to other example embodiments. While some example embodiments have been particularly shown and described, it will be understood by one of ordinary skill in the art that variations in form and detail may be made therein without departing from the spirit and scope of the claims.

What is claimed is:

1. A semiconductor device comprising:
    a substrate having a cell array region and a peripheral circuit region,
    the substrate including a plurality of first active regions defined by a first trench isolation region in the substrate in the cell array region, the plurality of first active regions each being aligned to extend longitudinally in a first direction in the cell array region, the plurality of first active regions being repeatedly disposed at first pitches in the first direction in the cell array region,
    the substrate including a second active region defined by a second trench isolation region in the substrate in the peripheral circuit region,
    the substrate including at least one deep trench isolation region defined by a portion of the second trench isolation region that is recessed in the substrate in the peripheral circuit region to a level lower than a level of other points of a bottom surface of the second trench isolation region in the substrate in the peripheral circuit region,
    the level of the at least one deep trench isolation region being recessed in the substrate lower than a bottom of an adjacent sidewall of the second active region,
    the at least one deep trench isolation region including at least one point in the substrate in the peripheral circuit region that is spaced apart in the first direction from a corresponding one of the plurality of first active regions, and
    the at least one deep trench isolation region including two deep trench isolation regions that are spaced apart from each other by the first pitch in the first direction.

2. The semiconductor device of claim 1, wherein at least a part of the at least one deep trench isolation region is disposed in a part of the second trench isolation region between the cell array region and the second active region.

3. The semiconductor device of claim 1, wherein the at least one deep trench isolation region is a plurality of deep trench isolation regions defined by portions of the second trench isolation region that are recessed in the substrate in the peripheral circuit region to have respective levels lower than the level of other points of the bottom surface of the second trench isolation region, and
    the plurality of deep trench isolation regions are spaced apart from each other along the bottom surface of the second trench isolation region.

4. The semiconductor device of claim 1, wherein
    each of the plurality of first active regions has a long axis extending longitudinally in the first direction and a short axis that is perpendicular to the long axis, and
    the at least one deep trench isolation region is spaced apart in the first direction and aligned with the long axis corresponding to at least one of the plurality of first active regions.

5. The semiconductor device of claim 1, wherein
    the substrate includes a plurality of island patterns defined by the bottom surface of the second trench isolation region in the substrate in the peripheral circuit region,
    the at least one deep trench isolation region surrounds the plurality of island patterns,
    the plurality of island patterns are spaced apart from one another along the bottom surface of the second trench isolation region.

6. The semiconductor device of claim 1, wherein
    the at least one deep trench isolation region includes a linear deep trench isolation region defined by a part of the second trench isolation region that is recessed in the substrate in the peripheral circuit region to a depth lower than the level of the other points of the bottom surface of the second trench isolation region in the substrate in the peripheral circuit region, and
    the linear deep trench isolation region surrounds the cell array region.

7. The semiconductor device of claim 6, wherein the linear deep trench isolation region includes concave-convex portions that extend toward the cell array region.

8. The semiconductor device of claim 1, wherein
    the substrate includes a third active region defined by a third trench isolation region in the substrate in the peripheral circuit region,
    the substrate includes an edge deep trench isolation region at an edge of a bottom surface of the third trench isolation region, the edge deep trench isolation region is recessed in the substrate in the peripheral circuit region to a level lower than a level of other points of the bottom surface of the third trench isolation region.

9. The semiconductor device of claim 8, wherein the edge deep trench isolation region is disposed at the edge of the bottom surface of the third trench isolation region that is the closest to the cell array region.

10. A semiconductor device comprising:
a substrate having a first region and a second region, the first and second regions having different active region densities,
the substrate including a plurality of first active regions disposed at first pitches in the substrate in the first region, the plurality of first active regions including a top surface having a long axis extending in a first direction and a short axis that is perpendicular to the long axis,
the substrate including a second active region disposed in the substrate in the second region;
a first device isolation film defining the plurality of first active regions in the substrate in the first region; and
a second device isolation film defining the second active region in the substrate in the second region, the second device isolation film including at least one protrusion that protrudes toward a bottom surface of the substrate in a thickness direction of the substrate at a point that is spaced apart in the first direction from both a corresponding one of the plurality of first active regions and an adjacent sidewall of the second active region,
the at least one protrusion including a plurality of protrusions that are spaced apart from each other,
the plurality of protrusions include two protrusions that are spaced apart from each other by the first pitch in the first direction.

11. The semiconductor device of claim 10, wherein the plurality of protrusions are disposed on a portion of a bottom surface of the second device isolation film between the second active region and the first region of the substrate.

12. The semiconductor device of claim 10, wherein the second device isolation film includes a cell adjacent region that is disposed around the first region and surrounds the first region, and
the plurality of protrusions are spaced apart from one another in the cell adjacent region of the second device isolation film.

13. The semiconductor device of claim 10, wherein the at least one protrusion includes a protrusion having a linear shape that is disposed around the first region and surrounds the first region.

14. The semiconductor device of claim 10, further comprising:
a third device isolation film defining a third active region in the substrate in the second region,
wherein a bottom surface of a portion of the third device isolation film that is the closest to the first region in the substrate defines an edge protrusion that protrudes toward a bottom surface of the substrate in the thickness direction of the substrate to a level below a level of other portions of a bottom surface of the third device isolation film.

15. The semiconductor device of claim 10, wherein each one of the plurality of protrusions extends into the substrate to a depth that is below a depth of a base of the adjacent sidewall of the second active region.

16. A semiconductor device comprising:
a substrate having a first region and a second region, the first region having a higher active region density than an active region density of the second region,
the substrate including a pattern of first active regions spaced apart from each other and defined by a first trench isolation region in the substrate in the first region, the pattern of first active regions including a first group of first active regions that are repeatedly disposed at a first pitch and aligned to extend longitudinally in a first direction,
the substrate including a second active region defined by a second trench isolation region in the substrate in the second region, a first portion of the substrate including a plurality of structures recessed to a first level in the second trench isolation region of the substrate, the plurality of structures being spaced apart from each other in at least one of the first direction and a second direction, the second direction crossing the first direction, at least one of the plurality of structures being spaced apart in the first direction from a corresponding one of the plurality of first active regions, and
a second portion of the substrate surrounding the plurality of structures, the second portion of the substrate being recessed to a second level in the substrate in the second trench isolation region, the second level being different than the first level, the plurality of structures being spaced apart from the second active region with the second portion between the plurality of structures and the second active region, wherein
the plurality of structures include two structures that are spaced apart from each other by the first pitch in the first direction.

17. The semiconductor device of claim 16, wherein
the plurality of structures are a plurality of deep trench isolation regions recessed to the first level in the substrate, the plurality of deep trench isolation regions are disposed in an adjacent region of the second region of the substrate,
the adjacent region is adjacent to edges of the first region of the substrate, and
the first level is recessed further in the substrate than the second level.

18. The semiconductor device of claim 16, wherein
the plurality of structures are a plurality of island patterns recessed to the first level in the substrate,
the plurality of island patterns are disposed in an adjacent region of the second region of the substrate,
the second portion of the upper surface of the substrate defines a deep trench isolation region that is recessed to the second level in the second trench isolation region of the substrate, and the second level is recessed in the substrate further than the first level.

19. The semiconductor device of claim 16, wherein
the plurality of structures are a plurality of concave-convex portions of a deep trench isolation region recessed to the first level in the substrate,
the plurality of concave-convex portions are disposed in an adjacent region of the second region of the substrate,
the deep trench isolation region borders the first region of the substrate,
the concave-convex portions extend toward the first region of the substrate,
the adjacent region of the substrate is adjacent to edges of the first region of the substrate, and the first level is recessed further in the substrate than the second level.

20. The semiconductor device of claim 16, wherein the plurality of first active regions each have a long axis and a short axis, the long axis extends in the first direction, and the short axis extends perpendicular to the long axis.

* * * * *